United States Patent
Takahashi et al.

(10) Patent No.: US 11,947,142 B2
(45) Date of Patent: Apr. 2, 2024

(54) OPTICAL FILM, CIRCULARLY POLARIZING PLATE, AND ORGANIC ELECTROLUMINESCENT DISPLAY DEVICE CLASS

(71) Applicant: FUJIFILM Corporation, Tokyo (JP)

(72) Inventors: Yuta Takahashi, Kanagawa (JP); Shinpei Yoshida, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/169,689

(22) Filed: Feb. 15, 2023

(65) Prior Publication Data
US 2023/0204838 A1 Jun. 29, 2023

Related U.S. Application Data

(63) Continuation of application No. PCT/JP2021/031146, filed on Aug. 25, 2021.

(30) Foreign Application Priority Data

Aug. 25, 2020 (JP) ................. 2020-141548
Sep. 18, 2020 (JP) ................. 2020-157672
Jan. 25, 2021 (JP) ................. 2021-009402

(51) Int. Cl.
G02B 5/30 (2006.01)
G02F 1/13363 (2006.01)

(52) U.S. Cl.
CPC ...... G02B 5/3016 (2013.01); G02F 1/133638 (2021.01)

(58) Field of Classification Search
CPC ............ G02B 5/3016; G02F 1/133638
See application file for complete search history.

(56) References Cited

U.S. PATENT DOCUMENTS

2008/0252974 A1* 10/2008 Futamura ............ G02B 5/3016
349/194
2014/0284582 A1 9/2014 Saitoh et al.
(Continued)

FOREIGN PATENT DOCUMENTS

JP 2004-258623 A 9/2004
JP 2014-209220 A 11/2014
(Continued)

OTHER PUBLICATIONS

International Search Report issued in PCT/JP2021/031146 dated Nov. 2, 2021.
(Continued)

*Primary Examiner* — Lucy P Chien
(74) *Attorney, Agent, or Firm* — Edwards Neils LLC; Jean C. Edwards, Esq.

(57) ABSTRACT

Provided is an optical film in which black tinting is suppressed in front and oblique directions when the optical film is used as a circularly polarizing plate in an organic EL display device. The optical film is an elongated optical film having optically anisotropic layers (A), (B), and (C), in this order, in which layer (A) is formed by fixing a vertically aligned disk-like liquid crystal compound, layer (B) is formed by fixing a twist-aligned rod-like liquid crystal compound with a thickness direction as a helical axis, layer (C) is formed by fixing a vertically aligned rod-like liquid crystal compound, an in-plane slow axis of layer (A) is parallel to an in-plane slow axis on a surface of layer (B) on a layer (A) side, and layers (A) and (B) are disposed such that the in-plane slow axes thereof satisfy a predetermined positional relationship.

11 Claims, 8 Drawing Sheets

(56) References Cited

U.S. PATENT DOCUMENTS

| | | |
|---|---|---|
| 2014/0284583 A1 | 9/2014 | Saitoh et al. |
| 2016/0011352 A1 | 1/2016 | Saitoh et al. |
| 2016/0085101 A1* | 3/2016 | Saitoh ............... G02F 1/133617 |
| | | 349/193 |
| 2022/0206203 A1 | 6/2022 | Yanokuchi et al. |

FOREIGN PATENT DOCUMENTS

| | | |
|---|---|---|
| JP | 5960743 B2 | 8/2016 |
| JP | 2017-102259 A | 6/2017 |
| WO | 2014/157079 A1 | 10/2014 |
| WO | 2021/060378 A1 | 4/2021 |

OTHER PUBLICATIONS

Written Opinion issued in PCT/JP2021/031146 dated Nov. 2, 2021.
International Preliminary Report on Patentability completed by WIPO on Feb. 28, 2023 in connection with International Patent Application No. PCT/JP2021/031146.

* cited by examiner

OPTICAL FILM, CIRCULARLY POLARIZING PLATE, AND ORGANIC ELECTROLUMINESCENT DISPLAY DEVICE CLASS

CROSS-REFERENCE TO RELATED APPLICATIONS

This application is a Continuation of PCT International Application No. PCT/JP2021/031146 filed on Aug. 25, 2021, which was published under PCT Article 21(2) in Japanese, and which claims priority under 35 U.S.C. § 119(a) to Japanese Patent Application No. 2020-141548 filed on Aug. 25, 2020, Japanese Patent Application No. 2020-157672 filed on Sep. 18, 2020, and Japanese Patent Application No. 2021-009402 filed on Jan. 25, 2021. The above applications are hereby expressly incorporated by reference, in their entirety, into the present application.

BACKGROUND OF THE INVENTION

1. Field of the Invention

The present invention relates to an optical film, a circularly polarizing plate, and an organic electroluminescent display device.

2. Description of the Related Art

An optically anisotropic layer having refractive index anisotropy is applied to various applications such as an antireflection film of an organic electroluminescent (EL) display device and an optical compensation film of a liquid crystal display device.

For example, JP5960743B discloses a phase difference plate in which two types of optically anisotropic layers exhibiting predetermined optical properties are laminated.

SUMMARY OF THE INVENTION

As a result of studying an optical film on which an optically anisotropic layer is laminated, which is described in JP5960743B, the present inventors have confirmed that there is room for improvement in suppressing the black tinting in a front direction and an oblique direction, in a case where the optical film is used as a circularly polarizing plate in an organic EL display device.

An object of the present invention is to provide an optical film in which the black tinting is suppressed in a front direction and an oblique direction, in a case where the optical film is used as a circularly polarizing plate in an organic EL display device.

Another object of the present invention is to provide a circularly polarizing plate and an organic EL display device.

The present inventors have found that the foregoing objects can be achieved by the following configurations.

[1] An elongated optical film having in the following order an optically anisotropic layer (A), an optically anisotropic layer (B), and an optically anisotropic layer (C),
  in which the optically anisotropic layer (A) is a layer formed by fixing a vertically aligned disk-like liquid crystal compound,
  the optically anisotropic layer (B) is a layer formed by fixing a twist-aligned rod-like liquid crystal compound with a thickness direction as a helical axis,
  the optically anisotropic layer (C) is a layer formed by fixing a vertically aligned rod-like liquid crystal compound,
  an in-plane slow axis of the optically anisotropic layer (A) is parallel to an in-plane slow axis on a surface of the optically anisotropic layer (B) on an optically anisotropic layer (A) side,
  upon being observed from an optically anisotropic layer (C) side toward the optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (A) side rotates counterclockwise with reference to the in-plane slow axis on the surface of the optically anisotropic layer (B) on the optically anisotropic layer (A) side, and
  upon being observed from the optically anisotropic layer (C) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (A) side rotates clockwise with reference to the in-plane slow axis on the surface of the optically anisotropic layer (B) on the optically anisotropic layer (A) side.

[2] The optical film according to [1], in which an in-plane retardation of the optically anisotropic layer (A) at a wavelength of 550 nm is 140 to 220 nm,
  a value of a product $\Delta nd$ of a refractive index anisotropy $\Delta n$ of the optically anisotropic layer (B) measured at a wavelength of 550 nm and a thickness d of the optically anisotropic layer (B) is 140 to 220 nm, and
  an in-plane retardation of the optically anisotropic layer (C) at a wavelength of 550 nm is 0 to 10 nm, and a thickness direction retardation of the optically anisotropic layer (C) at a wavelength of 550 nm is −120 to −20 nm.

[3] The optical film according to [1] or [2], in which an angle formed by the longitudinal direction of the elongated optical film and the in-plane slow axis of the optically anisotropic layer (A) is 40° to 85°,
  a twisted angle of the twist-aligned liquid crystal compound in the optically anisotropic layer (B) is 90°±30°,
  upon being observed from the optically anisotropic layer (C) side toward the optically anisotropic layer (A) side, in a case where the in-plane slow axis of the optically anisotropic layer (A) rotates clockwise by 40° to 85° with reference to the longitudinal direction of the elongated optical film, an in-plane slow axis on a surface of the optically anisotropic layer (B) opposite to the optically anisotropic layer (A) side rotates counterclockwise with reference to the in-plane slow axis on the surface of the optically anisotropic layer (B) on the optically anisotropic layer (A) side, and
  upon being observed from the optically anisotropic layer (C) side toward the optically anisotropic layer (A) side, in a case where the in-plane slow axis of the optically anisotropic layer (A) rotates counterclockwise by 40° to 85° with reference to the longitudinal direction of the elongated optical film, the in-plane slow axis on the surface of the optically anisotropic layer (B) opposite to the optically anisotropic layer (A) side rotates clockwise with reference to the in-plane slow axis on the surface of the optically anisotropic layer (B) on the optically anisotropic layer (A) side.

[4] An elongated optical film having in the following order an optically anisotropic layer (A), an optically anisotropic layer (C), and an optically anisotropic layer (B),
in which the optically anisotropic layer (A) is a layer formed by fixing a horizontally aligned rod-like liquid crystal compound,
the optically anisotropic layer (C) is a layer formed by fixing a vertically aligned rod-like liquid crystal compound,
the optically anisotropic layer (B) is a layer formed by fixing a twist-aligned rod-like liquid crystal compound with a thickness direction as a helical axis,
an in-plane slow axis of the optically anisotropic layer (A) is parallel to an in-plane slow axis on a surface of the optically anisotropic layer (B) on an optically anisotropic layer (C) side,
upon being observed from an optically anisotropic layer (B) side toward an optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (C) side rotates clockwise with reference to the in-plane slow axis on the surface of the optically anisotropic layer (B) on the optically anisotropic layer (C) side, and
upon being observed from the optically anisotropic layer (B) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (C) side rotates counterclockwise with reference to the in-plane slow axis on the surface of the optically anisotropic layer (B) on the optically anisotropic layer (C) side.

[5] The optical film according to [4], in which an in-plane retardation of the optically anisotropic layer (A) at a wavelength of 550 nm is 140 to 220 nm,
a value of a product And of a refractive index anisotropy Δn of the optically anisotropic layer (B) measured at a wavelength of 550 nm and a thickness d of the optically anisotropic layer (B) is 140 to 220 nm, and
an in-plane retardation of the optically anisotropic layer (C) at a wavelength of 550 nm is 0 to 10 nm, and a thickness direction retardation of the optically anisotropic layer (C) at a wavelength of 550 nm is −150 to −50 nm.

[6] The optical film according to [4] or [5], in which an angle formed by the longitudinal direction of the elongated optical film and the in-plane slow axis of the optically anisotropic layer (A) is 5° to 50°,
a twisted angle of the twist-aligned liquid crystal compound in the optically anisotropic layer (B) is 90°±30°,
upon being observed from the optically anisotropic layer (B) side toward the optically anisotropic layer (A) side, in a case where the in-plane slow axis of the optically anisotropic layer (A) rotates clockwise by 5° to 50° with reference to the longitudinal direction of the elongated optical film, the in-plane slow axis on the surface of the optically anisotropic layer (B) opposite to the optically anisotropic layer (C) side rotates clockwise with reference to the in-plane slow axis on the surface of the optically anisotropic layer (B) on the optically anisotropic layer (C) side, and
upon being observed from the optically anisotropic layer (B) side toward the optically anisotropic layer (A) side, in a case where the in-plane slow axis of the optically anisotropic layer (A) rotates counterclockwise by 5° to 50° with reference to the longitudinal direction of the elongated optical film, the in-plane slow axis on the surface of the optically anisotropic layer (B) opposite to the optically anisotropic layer (C) side rotates counterclockwise with reference to the in-plane slow axis on the surface of the optically anisotropic layer (B) on the optically anisotropic layer (C) side.

(7) A circularly polarizing plate having the optical film according to any one of (1) to (6) and a polarizer,
in which the polarizer is disposed adjacent to the optically anisotropic layer (A) included in the optical film.

[8] The circularly polarizing plate according to [7], in which the polarizer is a polarizer having a luminosity corrected single transmittance of 44% or more.

[9] The circularly polarizing plate according to [7] or [8], in which the polarizer is a polarizer formed of a composition containing a polymerizable liquid crystal compound.

[10] An organic electroluminescent display device having the optical film according to any one of [1] to [6] or the circularly polarizing plate according to any one of [7] to [9].

According to an aspect of the present invention, it is possible to provide an optical film in which the black tinting is suppressed in a front direction and an oblique direction, in a case where the optical film is used as a circularly polarizing plate in an organic EL display device.

According to another aspect of the present invention, it is possible to provide a circularly polarizing plate and an organic EL display device.

DESCRIPTION OF THE PREFERRED EMBODIMENTS

Figure 1:
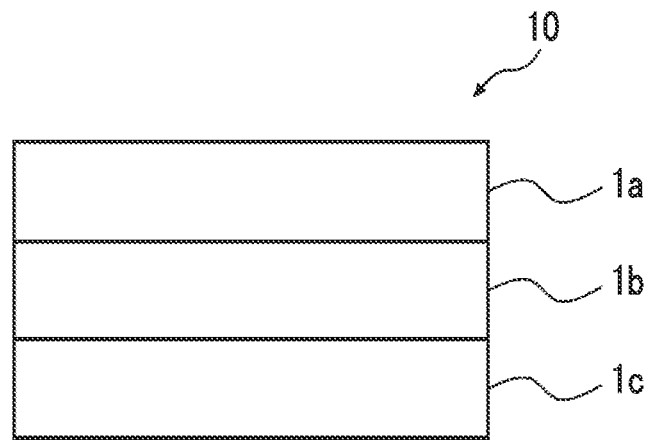
FIG. 1 is a schematic cross-sectional view showing an example of a first embodiment of an optical film of the present invention.

Hereinafter, the present invention will be described in more detail.

The description of configuration requirements described below may be made based on representative embodiments of the present invention, but the present invention is not limited to such embodiments.

Any numerical range expressed using "to" in the present specification refers to a range including the numerical values before and after the "to" as a lower limit value and an upper limit value, respectively.

In addition, in the present specification, for each component, one type of substance corresponding to each component may be used alone, or two or more types thereof may be used in combination. Here, in a case where two or more substances are used in combination for each component, the content of the component refers to a total content of the substances used in combination unless otherwise specified.

In addition, in the present specification, the "(meth) acrylic" is a notation representing "acrylic" or "methacrylic".

Next, the terms used in the present specification will be described.

A slow axis is defined at 550 nm unless otherwise specified.

In the present invention, $Re(\lambda)$ and $Rth(\lambda)$ represent an in-plane retardation at a wavelength $\lambda$, and a thickness direction retardation at a wavelength $\lambda$, respectively. The wavelength $\lambda$, is 550 nm unless otherwise specified.

In the present invention, $Re(\lambda)$ and $Rth(\lambda)$ are values measured at a wavelength of $\lambda$, in AxoScan (manufactured by Axometrics, Inc.). By inputting an average refractive index $((nx+ny+nz)/3)$ and a film thickness (d (μm)) in AxoScan, slow axis direction)(°
$Re(\lambda)=R0(\lambda)$
$Rth(\lambda)=((nx+ny)/2-nz)\times d$
are calculated.

Although $R0(\lambda)$ is displayed as a numerical value calculated by AxoScan, $R0(\lambda)$ means $Re(\lambda)$.

In the present specification, the refractive indexes $nx$, $ny$, and $nz$ are measured using an Abbe refractometer (NAR-4T, manufactured by Atago Co., Ltd.) and using a sodium lamp ($\lambda$=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethyl methacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB).

Above all, an ultraviolet ray is preferable.

The term "visible light" in the present specification refers to light in a wavelength range of 380 to 780 nm. In addition, the measurement wavelength in the present specification is 550 nm unless otherwise specified.

In addition, in the present specification, the relationship between angles (for example, "orthogonal" or "parallel") is intended to include a range of errors acceptable in the art to which the present invention belongs. Specifically, it means that an angle is within an error range of less than ±10° with respect to the exact angle, and the error with respect to the exact angle is preferably within a range of ±5° or less and more preferably within a range of ±3° or less.

In the present specification, the horizontal alignment of a rod-like liquid crystal compound refers to a state in which a major axis of the liquid crystal compound is arranged horizontally and in the same direction with respect to the surface of the layer.

Here, "horizontal" does not require that the major axis of the liquid crystal compound is strictly horizontal with respect to the surface of the layer, but is intended to mean an alignment in which the tilt angle formed by the average molecular axis of the liquid crystal compound in the layer and the surface of the layer is less than 20°.

In addition, the "same direction" does not require that the major axis of the liquid crystal compound is arranged strictly in the same direction with respect to the surface of the layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

The vertical alignment of a disk-like liquid crystal compound refers to a state in which a disk axis of the liquid crystal compound is arranged vertically and in the same direction with respect to the surface of the layer.

Here, the "vertical" does not require that the disk axis of the liquid crystal compound is strictly vertical with respect to the surface of the layer, but is intended to mean an alignment in which the tilt angle formed by the disc plane of the liquid crystal compound in the layer and the surface of the layer is 70° to 110°.

In addition, the "same direction" does not require that the major axis of the liquid crystal compound is arranged strictly in the same direction with respect to the surface of the layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

In the present specification, the optically anisotropic layer may be a layer exhibiting predetermined optical properties, and is preferably, for example, a layer formed by fixing an alignment state of an aligned liquid crystal compound.

The "fixed" state is a state in which the alignment of a liquid crystal compound is maintained. Specifically, the "fixed" state is more preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

The optically anisotropic layer included in the optical film according to the embodiment of the present invention is preferably a layer formed by fixing a vertically aligned rod-like liquid crystal compound or a horizontally aligned disk-like liquid crystal compound.

From the viewpoint of usefulness that can be used as a compensation layer of a circularly polarizing plate or a display device, the layer formed by fixing a vertically aligned rod-like liquid crystal compound is preferably a positive C-plate, and the layer formed by fixing a horizontally aligned disk-like liquid crystal compound is preferably a negative C-plate.

Here, the positive C-plate (C-plate which is positive) and the negative C-plate (C-plate which is negative) are defined as follows.

The positive C-plate satisfies a relationship of Expression (C1) and the negative C-plate satisfies a relationship of Expression (C2) assuming that a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz. It should be noted that the positive C-plate has an Rth showing a negative value and the negative C-plate has an Rth showing a positive value.

$$nz > nx \approx ny \quad \text{Expression (C1)}$$

$$nz < nx \approx ny \quad \text{Expression (C2)}$$

It should be noted that the symbol "≈" encompasses not only a case where the both sides are completely the same as each other but also a case where the both sides are substantially the same as each other.

The expression "substantially the same" means that, for example, a case where the absolute value of (nx−ny)×d (where d is a thickness of a film) is 0 to 10 nm and preferably 0 to 5 nm is also included in "nx≈ny".

A feature point of the optical film according to the embodiment of the present invention is that three layers of the optically anisotropic layer (A), the optically anisotropic layer (B), and the optically anisotropic layer (C) formed by fixing a predetermined liquid crystal compound in a predetermined alignment are disposed in a predetermined order, and the in-plane slow axes of the optically anisotropic layer (A) and the optically anisotropic layer (B) are disposed in a predetermined positional relationship.

In JP5960743B, as shown in Comparative Example 1 which will be described later, there is room for improvement in suppressing the black tinting in a front direction and an oblique direction in a case where the optical film is used as a circularly polarizing plate in an organic EL display device.

Therefore, in the present invention, it is considered that, in a case where the optical film was used as a circularly polarizing plate in an organic EL display device, the black tinting in a front direction and an oblique direction was suppressed by disposing the optically anisotropic layer (A), the optically anisotropic layer (B), and the optically anisotropic layer (C) in a predetermined order, and disposing the optically anisotropic layer (A) and the optically anisotropic layer (B) in a predetermined positional relationship, as described above.

[Optical Film (First Embodiment)]

The optical film according to the first embodiment of the present invention is an elongated optical film having an optically anisotropic layer (A), an optically anisotropic layer (B), and an optically anisotropic layer (C) in this order, in which the optically anisotropic layer (A) is a layer formed by fixing a vertically aligned disk-like liquid crystal compound, the optically anisotropic layer (B) is a layer formed by fixing a twist-aligned rod-like liquid crystal compound with a thickness direction as a helical axis, the optically anisotropic layer (C) is a layer formed by fixing a vertically aligned rod-like liquid crystal compound, an in-plane slow axis of the optically anisotropic layer (A) is parallel to an in-plane slow axis on a surface of the optically anisotropic layer (B) on an optically anisotropic layer (A) side, upon being observed from an optically anisotropic layer (C) side toward the optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (A) side rotates counterclockwise with reference to the in-plane slow axis on the surface of the optically anisotropic layer (B) on the optically anisotropic layer (A) side, and upon being observed from the optically anisotropic layer (C) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (A) side rotates clockwise with reference to the in-plane slow axis on the surface of the optically anisotropic layer (B) on the optically anisotropic layer (A) side.

[Optical Film (Second Embodiment)]

The optical film according to the second embodiment of the present invention is an elongated optical film having an optically anisotropic layer (A), an optically anisotropic layer (C), and an optically anisotropic layer (B) in this order, in which the optically anisotropic layer (A) is a layer formed by fixing a horizontally aligned rod-like liquid crystal compound, the optically anisotropic layer (C) is a layer formed by fixing a vertically aligned rod-like liquid crystal compound, the optically anisotropic layer (B) is a layer formed by fixing a twist-aligned rod-like liquid crystal compound with a thickness direction as a helical axis, an in-plane slow axis of the optically anisotropic layer (A) is parallel to an in-plane slow axis on a surface of the optically anisotropic layer (B) on an optically anisotropic layer (C) side, upon being observed from an optically anisotropic layer (B) side toward an optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (C) side rotates clockwise with reference to the in-plane slow axis on the surface of the optically anisotropic layer (B) on the optically anisotropic layer (C) side, and upon being observed from the optically anisotropic layer (B) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (C) side rotates counterclockwise with reference to the in-plane slow axis on the surface of the optically anisotropic layer (B) on the optically anisotropic layer (C) side.

First Embodiment

Hereinafter, the first embodiment of the optical film according to the embodiment of the present invention will be described with reference to the accompanying drawings.

FIG. 1 is a schematic cross-sectional view showing an example of the first embodiment of the optical film according to the embodiment of the present invention.

An optical film 10 shown in FIG. 1 has an optically anisotropic layer (A) 1a, an optically anisotropic layer (B) 1b, and an optically anisotropic layer (C) 1c in this order.

Here, the optically anisotropic layer (A) 1a is a layer formed by fixing a vertically aligned disk-like liquid crystal compound.

In addition, the optically anisotropic layer (B) 1b is a layer formed by fixing a twist-aligned rod-like liquid crystal compound with a thickness direction as a helical axis.

In addition, the optically anisotropic layer (C) 1c is a layer formed by fixing a vertically aligned rod-like liquid crystal compound.

Next, description will be made with reference to FIG. 5 to FIG. 7.

Figure 5:
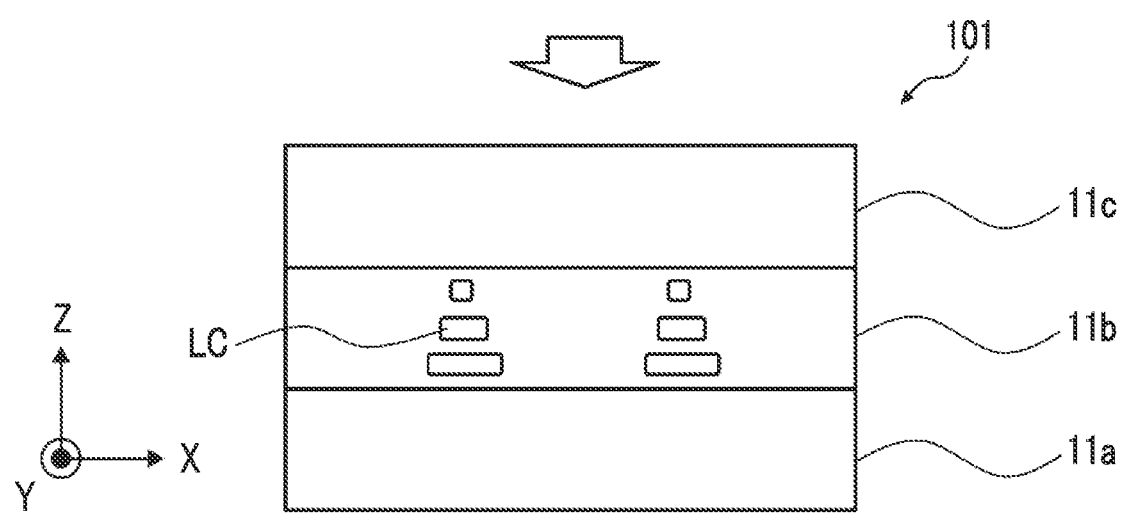
FIG. 5 is an example of a schematic cross-sectional view of the first embodiment of the optical film of the present invention.

An optical film 101 shown in FIG. 5 has an optically anisotropic layer (A) 11a, an optically anisotropic layer (B) 11b, and an optically anisotropic layer (C) 11c in this order. The optically anisotropic layer (B) 11b is a layer formed by fixing a twist-aligned liquid crystal compound LC with a thickness direction as a helical axis.

Figure 6:
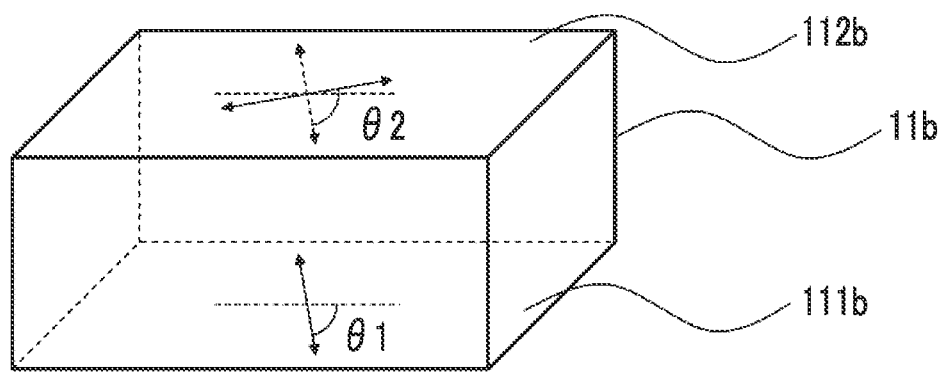
FIG. 6 is a view showing a relationship between a longitudinal direction of an elongated optical film and an in-plane slow axis of each of an optically anisotropic layer (A) and an optically anisotropic layer (B), in one aspect of the first embodiment of the optical film of the present invention.
Figure 6:
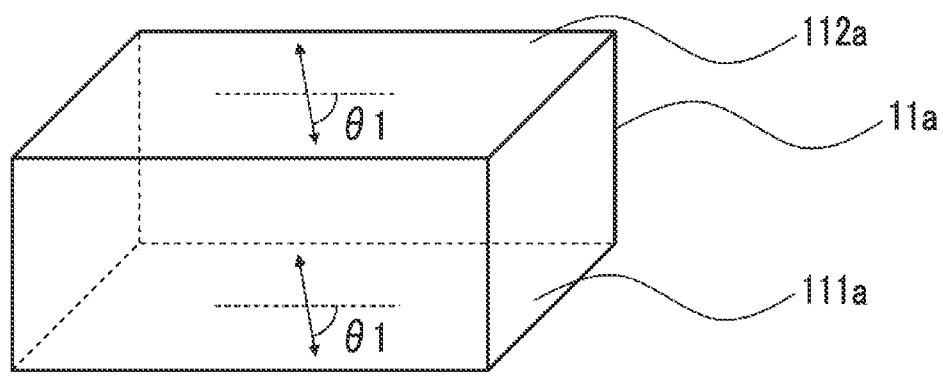

The arrow in the optically anisotropic layer (A) 11a in FIG. 6 represents an in-plane slow axis on each surface, and the broken line represents a longitudinal direction of the elongated optical film. As shown in FIG. 6, the in-plane slow axis on a surface 111a of the optically anisotropic layer (A) 11a opposite to the optically anisotropic layer (B) 11b side is parallel to the in-plane slow axis on a surface 112a of the optically anisotropic layer (A) 11a on the optically anisotropic layer (B) 11b side, and the angle formed by any of the in-plane slow axes with the longitudinal direction of the elongated optical film is represented by θ1.

Figure 7:
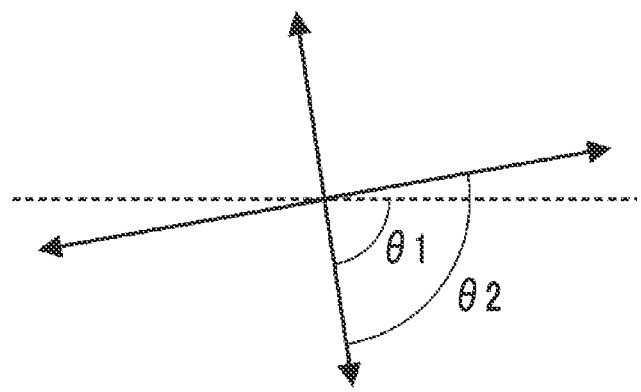
FIG. 7 is a view showing a relationship of the angle between the longitudinal direction of the elongated optical film and the in-plane slow axis of each of the optically anisotropic layer (A) and the optically anisotropic layer (B), upon being observed from the direction of a white arrow in FIG. 5.

As shown in FIG. 7, in a case of being observed from the white arrow side of FIG. 5 [in a case of being observed from the optically anisotropic layer (C) 11c side toward the optically anisotropic layer (A) 11a side], the in-plane slow axis of the optically anisotropic layer (A) 11a rotates clockwise by θ1° with reference to the longitudinal direction of the elongated optical film represented by the broken line. That is, the in-plane slow axis of the optically anisotropic layer (A) 11a is located at a position rotated clockwise by θ1°.

In addition, the arrow in the optically anisotropic layer (B) 11b in FIG. 6 represents an in-plane slow axis at each surface.

The in-plane slow axis of the optically anisotropic layer (A) 11a is parallel to the in-plane slow axis on the surface of the optically anisotropic layer (B) 11b on the optically anisotropic layer (A) 11a side. In other words, the angle formed by the in-plane slow axis on the surface 111b of the optically anisotropic layer (B) 11b on the optically anisotropic layer (A) 11a side and the longitudinal direction of the elongated optical film corresponds to the above-mentioned θ1.

In addition, the in-plane slow axis on a surface 111b of the optically anisotropic layer (B) 11b on the optically anisotropic layer (A) 11a side, and the in-plane slow axis on a surface 112b of the optically anisotropic layer (B) 11b opposite to the optically anisotropic layer (A) 11a side form a twisted angle which will be described later. In other words, in a case of being observed from the white arrow side of FIG. 5 [in a case of being observed from the optically anisotropic layer (C) 11c side toward the optically anisotropic layer (A) 11a side], the in-plane slow axis on the surface 112b of the optically anisotropic layer (B) 11b opposite to the optically anisotropic layer (A) 11a side rotates counterclockwise at a predetermined angle with reference to the in-plane slow axis on the surface 111b of the optically anisotropic layer (B) 11b on the optically anisotropic layer (A) 11a side.

That is, as shown in FIG. 7, in a case of being observed from the white arrow side of FIG. 5 [in a case of being observed from the optically anisotropic layer (C) 11c side toward the optically anisotropic layer (A) 11a side], the in-plane slow axis on the surface 112b of the optically anisotropic layer (B) 11b opposite to the optically anisotropic layer (A) 11a side is located at a position rotated counterclockwise by a predetermined angle of θ2° with reference to the in-plane slow axis of the optically anisotropic layer (A) 11a.

Next, description will be made with reference to FIG. 8 to FIG. 10.

Figure 8:
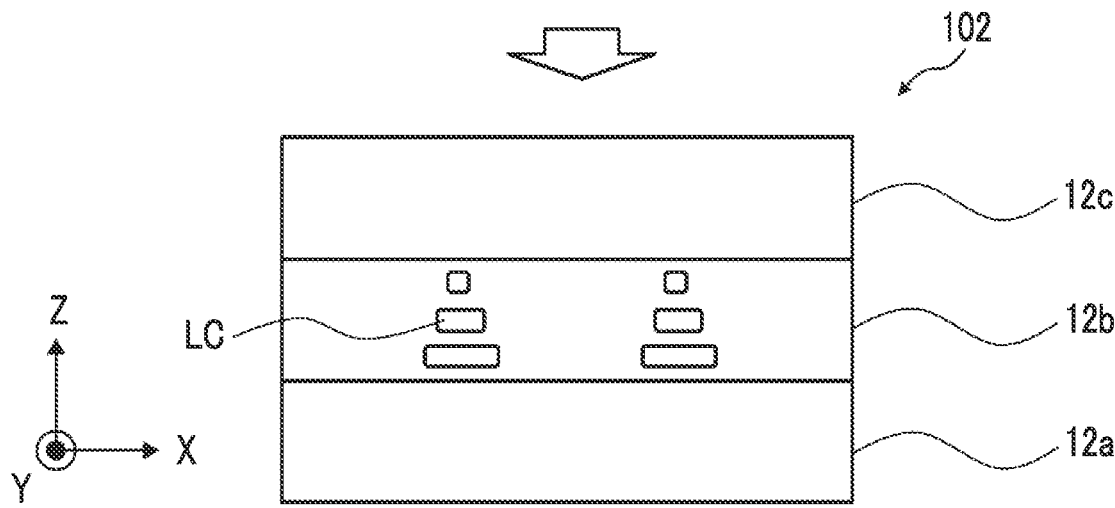
FIG. 8 is another example of a schematic cross-sectional view of the first embodiment of the optical film of the present invention.

An optical film 102 shown in FIG. 8 has an optically anisotropic layer (A) 12a, an optically anisotropic layer (B) 12b, and an optically anisotropic layer (C) 12c in this order. The optically anisotropic layer (B) 12b is a layer formed by fixing a twist-aligned liquid crystal compound LC with a thickness direction as a helical axis.

Figure 9:
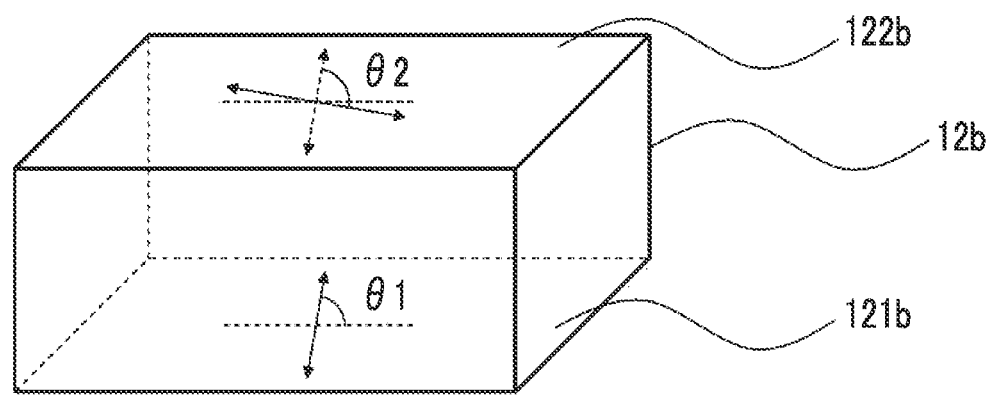
FIG. 9 is a view showing a relationship between the longitudinal direction of the elongated optical film and the in-plane slow axis of each of the optically anisotropic layer (A) and the optically anisotropic layer (B), in another aspect of the first embodiment of the optical film of the present invention.
Figure 9:
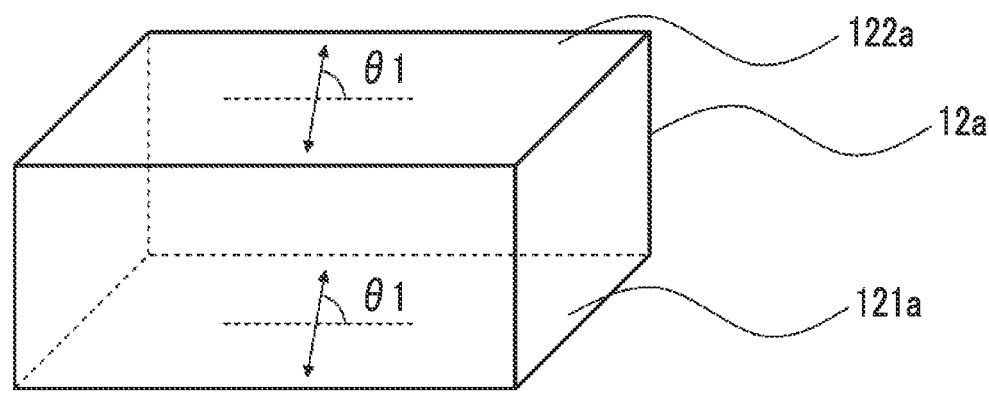

The arrow in the optically anisotropic layer (A) 12a in FIG. 9 represents an in-plane slow axis on each surface, and the broken line represents a longitudinal direction of the elongated optical film. As shown in FIG. 9, the in-plane slow axis on a surface 121a of the optically anisotropic layer (A) 12a opposite to the optically anisotropic layer (B) 12b side is parallel to the in-plane slow axis on a surface 122a of the optically anisotropic layer (A) 12a on the optically anisotropic layer (B) 12b side, and the angle formed by any of the in-plane slow axes with the longitudinal direction of the elongated optical film is represented by θ1.

Figure 10:
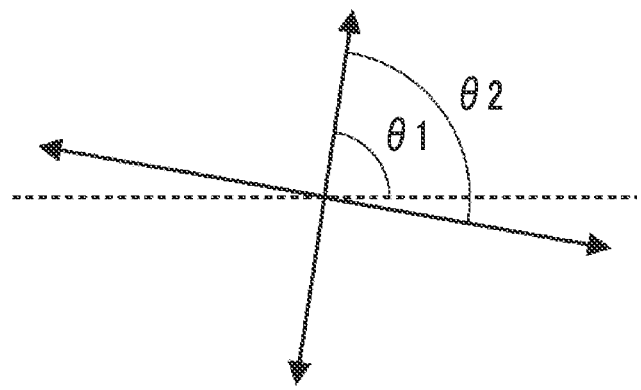
FIG. 10 is a view showing a relationship of the angle between the longitudinal direction of the elongated optical film and the in-plane slow axis of each of the optically anisotropic layer (A) and the optically anisotropic layer (B), upon being observed from the direction of a white arrow in FIG. 8.

As shown in FIG. 10, in a case of being observed from the white arrow side of FIG. 8 [in a case of being observed from the optically anisotropic layer (C) 12c side toward the optically anisotropic layer (A) 12a side], the in-plane slow axis of the optically anisotropic layer (A) 12a rotates counterclockwise by θ1° with reference to the longitudinal direction of the elongated optical film represented by the broken line. That is, the in-plane slow axis of the optically anisotropic layer (A) 12a is located at a position rotated counterclockwise by θ1°.

In addition, the arrow in the optically anisotropic layer (B) 12b in FIG. 9 represents an in-plane slow axis at each surface.

The in-plane slow axis of the optically anisotropic layer (A) 12a is parallel to the in-plane slow axis on the surface of the optically anisotropic layer (B) 12b on the optically anisotropic layer (A) 12a side. That is, the angle formed by the in-plane slow axis on a surface 121b of the optically anisotropic layer (B) 12b on the optically anisotropic layer (A) 12a side and the longitudinal direction of the elongated optical film corresponds to the above-mentioned θ1.

In addition, the in-plane slow axis on the surface 121b of the optically anisotropic layer (B) 12b on the optically anisotropic layer (A) 12a side, and the in-plane slow axis on a surface 122b of the optically anisotropic layer (B) 12b opposite to the optically anisotropic layer (A) 12a side form a twisted angle which will be described later. In other words, in a case of being observed from the white arrow side of FIG. 8 [in a case of being observed from the optically anisotropic layer (C) 12c side toward the optically anisotropic layer (A) 12a side], the in-plane slow axis on the surface 122b of the optically anisotropic layer (B) 12b opposite to the optically anisotropic layer (A) 12a side rotates clockwise at a predetermined angle with reference to the in-plane slow axis on the surface 121b of the optically anisotropic layer (B) 12b on the optically anisotropic layer (A) 12a side.

That is, as shown in FIG. 10, in a case of being observed from the white arrow side of FIG. 8 [in a case of being observed from the optically anisotropic layer (C) 12c side toward the optically anisotropic layer (A) 12a side], the in-plane slow axis on the surface 122b of the optically anisotropic layer (B) 12b opposite to the optically anisotropic layer (A) 12a side is located at a position rotated clockwise by a predetermined angle (twisted angle) of θ2° with reference to the in-plane slow axis of the optically anisotropic layer (A) 12a.

Second Embodiment

Hereinafter, the second embodiment of the optical film according to the embodiment of the present invention will be described with reference to the accompanying drawings.

Figure 2:
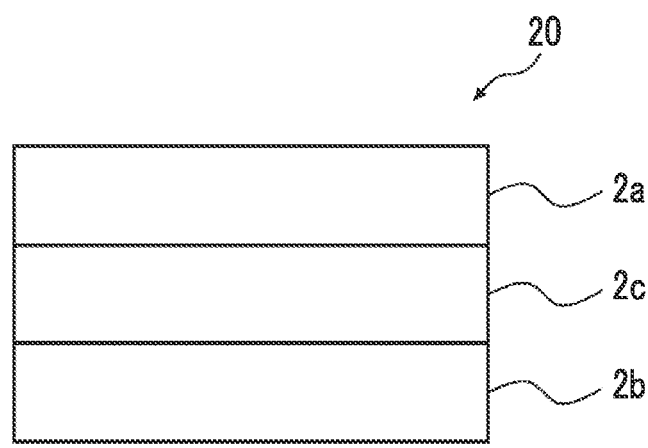
FIG. 2 is a schematic cross-sectional view showing an example of a second embodiment of the optical film of the present invention.

FIG. 2 is a schematic cross-sectional view showing an example of the second embodiment of the optical film according to the embodiment of the present invention.

An optical film 20 shown in FIG. 2 has an optically anisotropic layer (A) 2a, an optically anisotropic layer (C) 2c, and an optically anisotropic layer (B) 2b in this order.

Here, the optically anisotropic layer (A) 2a is a layer formed by fixing a horizontally aligned rod-like liquid crystal compound.

In addition, the optically anisotropic layer (C) 2c is a layer formed by fixing a vertically aligned rod-like liquid crystal compound.

In addition, the optically anisotropic layer (B) 2b is a layer formed by fixing a twist-aligned rod-like liquid crystal compound with a thickness direction as a helical axis.

Next, description will be made with reference to FIG. 11 to FIG. 13.

Figure 11:
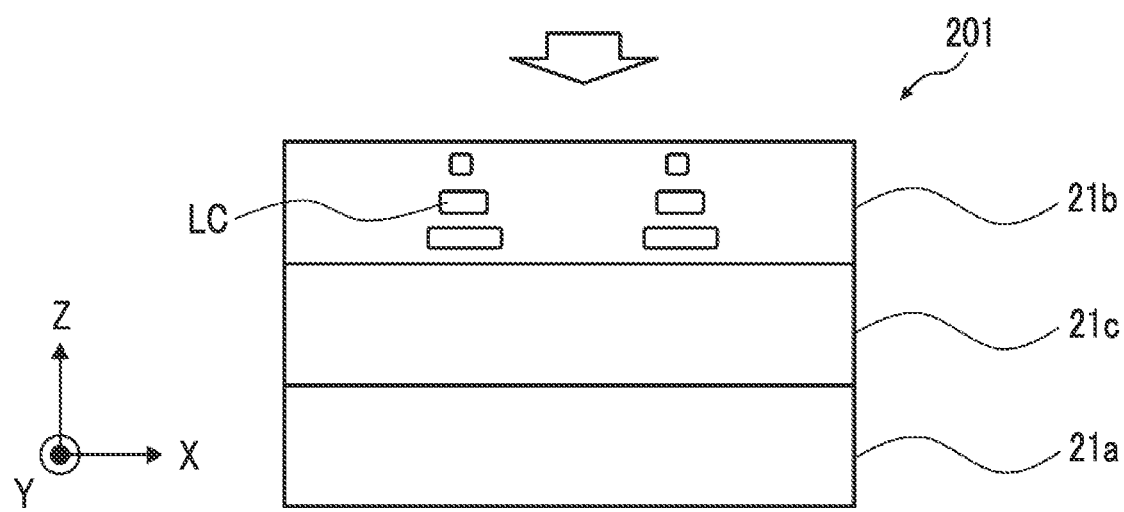
FIG. 11 is an example of a schematic cross-sectional view of the second embodiment of the optical film of the present invention.

An optical film 201 shown in FIG. 11 has an optically anisotropic layer (A) 21a, an optically anisotropic layer (C) 21c, and an optically anisotropic layer (B) 21b in this order. The optically anisotropic layer (B) 21b is a layer formed by fixing a twist-aligned liquid crystal compound LC with a thickness direction as a helical axis.

Figure 12:
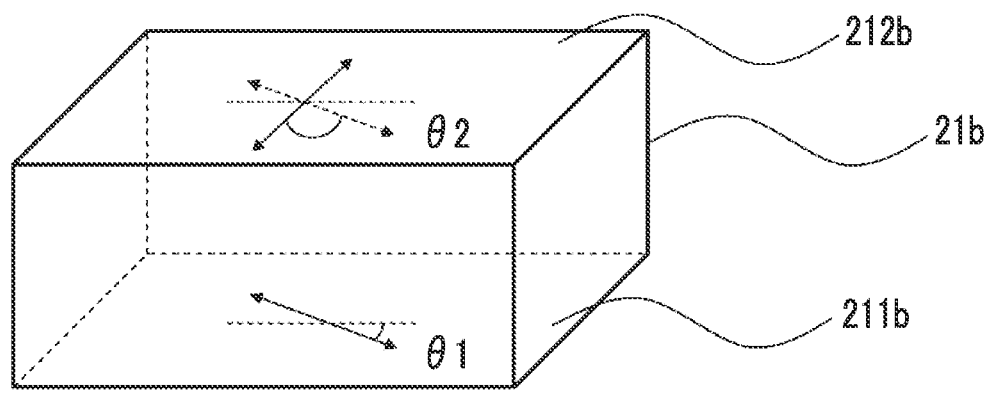
FIG. 12 is a view showing a relationship between the longitudinal direction of the elongated optical film and the in-plane slow axis of each of the optically anisotropic layer (A) and the optically anisotropic layer (B), in one aspect of the second embodiment of the optical film of the present invention.

The arrow in the optically anisotropic layer (A) 21a in FIG. 12 represents an in-plane slow axis on each surface, and the broken line represents a longitudinal direction of the elongated optical film. As shown in FIG. 12, the in-plane slow axis on a surface 211a of the optically anisotropic layer (A) 21a opposite to the optically anisotropic layer (B) 21b side is parallel to the in-plane slow axis on a surface 212a of the optically anisotropic layer (A) 21a on the optically anisotropic layer (B) 21b side, and the angle formed by any of the in-plane slow axes with the longitudinal direction of the elongated optical film is represented by θ1.

Figure 13:
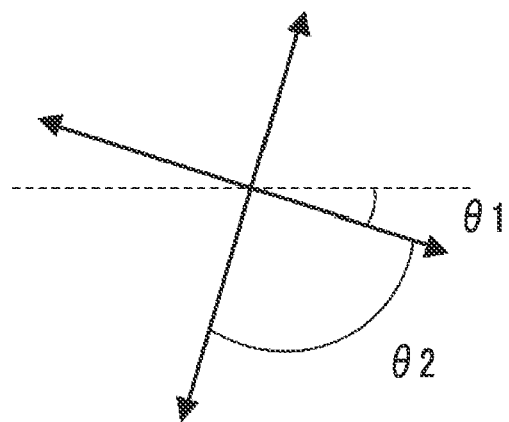
FIG. 13 is a view showing a relationship of the angle between the longitudinal direction of the elongated optical film and the in-plane slow axis of each of the optically anisotropic layer (A) and the optically anisotropic layer (B), upon being observed from the direction of a white arrow in FIG. 11.

As shown in FIG. 13, in a case of being observed from the white arrow side of FIG. 11 [in a case of being observed from the optically anisotropic layer (B) 21b side toward the optically anisotropic layer (A) 21a side], the in-plane slow axis of the optically anisotropic layer (A) 21a rotates clockwise by θ1° with reference to the longitudinal direction of the elongated optical film represented by the broken line. That is, the in-plane slow axis of the optically anisotropic layer (A) 21a is located at a position rotated clockwise by θ1°.

In addition, the arrow in the optically anisotropic layer (B) 21b in FIG. 12 represents an in-plane slow axis at each surface.

The in-plane slow axis of the optically anisotropic layer (A) 21a is parallel to the in-plane slow axis on the surface of the optically anisotropic layer (B) 21b on the optically anisotropic layer (A) 21a side. In other words, the angle formed by the in-plane slow axis on a surface 211b of the optically anisotropic layer (B) 21b on the optically anisotropic layer (A) 21a side and the longitudinal direction of the elongated optical film corresponds to the above-mentioned θ1.

In addition, the in-plane slow axis on the surface 211b of the optically anisotropic layer (B) 21b on the optically anisotropic layer (A) 21a side, and the in-plane slow axis on a surface 212b of the optically anisotropic layer (B) 21b opposite to the optically anisotropic layer (A) 21a side form a twisted angle which will be described later. In other words, in a case of being observed from the white arrow side of FIG. 11 [in a case of being observed from the optically anisotropic layer (B) 21b side toward the optically anisotropic layer (A) 21a side], the in-plane slow axis on the surface 212b of the optically anisotropic layer (B) 21b opposite to the optically anisotropic layer (A) 21a side rotates clockwise at a predetermined angle with reference to the in-plane slow axis on the surface 211b of the optically anisotropic layer (B) 21b on the optically anisotropic layer (A) 21a side.

That is, as shown in FIG. 13, in a case of being observed from the white arrow side of FIG. 11 [in a case of being observed from the optically anisotropic layer (B) 21b side toward the optically anisotropic layer (A) 21a side], the in-plane slow axis on the surface 212b of the optically anisotropic layer (B) 21b opposite to the optically anisotropic layer (A) 21a side is located at a position rotated clockwise by a predetermined angle of θ2° with reference to the in-plane slow axis of the optically anisotropic layer (A) 21a.

Next, description will be made with reference to FIG. 14 to FIG. 16.

Figure 14:
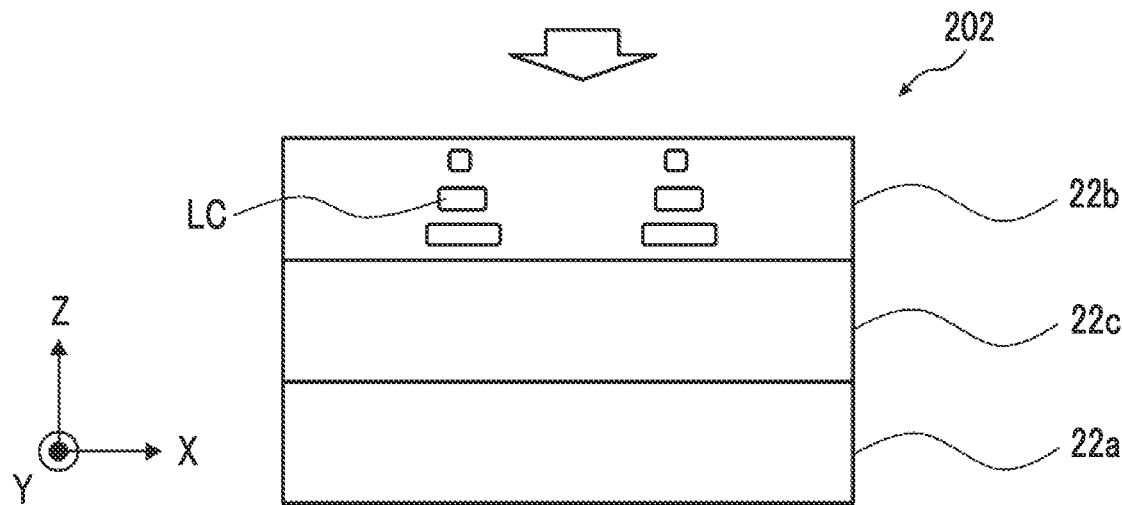
FIG. 14 is another example of a schematic cross-sectional view of the second embodiment of the optical film of the present invention.

An optical film 202 shown in FIG. 14 has an optically anisotropic layer (A) 22a, an optically anisotropic layer (C) 22c, and an optically anisotropic layer (B) 22b in this order. The optically anisotropic layer (B) 22b is a layer formed by fixing a twist-aligned liquid crystal compound LC with a thickness direction as a helical axis.

Figure 15:
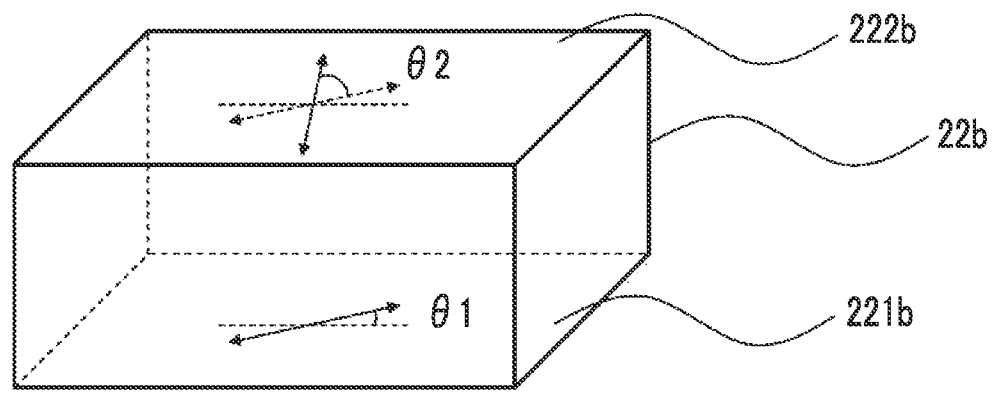
FIG. 15 is a view showing a relationship between the longitudinal direction of the elongated optical film and the in-plane slow axis of each of the optically anisotropic layer (A) and the optically anisotropic layer (B), in another aspect of the second embodiment of the optical film of the present invention.
Figure 15:
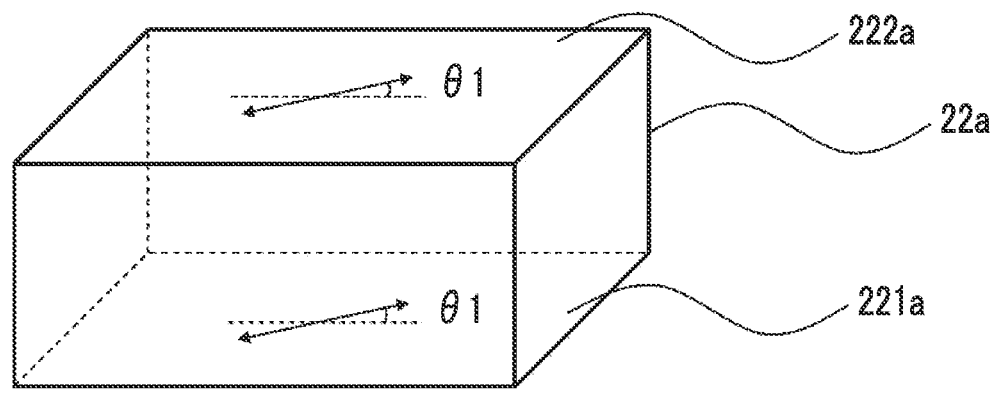

The arrow in the optically anisotropic layer (A) 22a in FIG. 15 represents an in-plane slow axis on each surface, and the broken line represents a longitudinal direction of the elongated optical film. As shown in FIG. 15, the in-plane slow axis on a surface 221a of the optically anisotropic layer (A) 22a opposite to the optically anisotropic layer (B) 22b side is parallel to the in-plane slow axis on a surface 222a of the optically anisotropic layer (A) 22a on the optically anisotropic layer (B) 22b side, and the angle formed by any of the in-plane slow axes with the longitudinal direction of the elongated optical film is represented by θ1.

Figure 16:
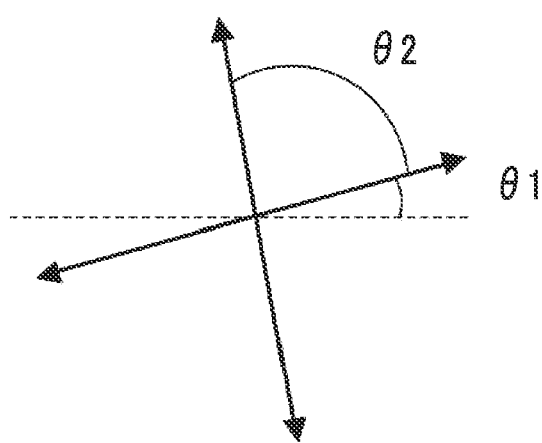
FIG. 16 is a view showing a relationship of the angle between the longitudinal direction of the elongated optical film and the in-plane slow axis of each of the optically anisotropic layer (A) and the optically anisotropic layer (B), upon being observed from the direction of a white arrow in FIG. 14.

As shown in FIG. 16, in a case of being observed from the white arrow side of FIG. 14 [in a case of being observed from the optically anisotropic layer (B) 22b side toward the optically anisotropic layer (A) 22a side], the in-plane slow axis of the optically anisotropic layer (A) 22a rotates counterclockwise by θ1° with reference to the longitudinal direction of the elongated optical film represented by the broken line. That is, the in-plane slow axis of the optically anisotropic layer (A) 22a is located at a position rotated counterclockwise by θ1°.

In addition, the arrow in the optically anisotropic layer (B) 22b in FIG. 15 represents an in-plane slow axis at each surface.

The in-plane slow axis of the optically anisotropic layer (A) 22a is parallel to the in-plane slow axis on the surface of the optically anisotropic layer (B) 22b on the optically anisotropic layer (A) 22a side. That is, the angle formed by the in-plane slow axis on a surface 221b of the optically anisotropic layer (B) 22b on the optically anisotropic layer (A) 22a side and the longitudinal direction of the elongated optical film corresponds to the above-mentioned θ1.

In addition, the in-plane slow axis on the surface 221b of the optically anisotropic layer (B) 22b on the optically anisotropic layer (A) 22a side, and the in-plane slow axis on a surface 222b of the optically anisotropic layer (B) 22b opposite to the optically anisotropic layer (A) 22a side form a twisted angle which will be described later. In other words, in a case of being observed from the white arrow side of FIG. 14 [in a case of being observed from the optically anisotropic layer (B) 22b side toward the optically anisotropic layer (A) 22a side], the in-plane slow axis on the surface 222b of the optically anisotropic layer (B) 22b opposite to the optically anisotropic layer (A) 22a side rotates counterclockwise at a predetermined angle with reference to the in-plane slow axis on the surface 221b of the optically anisotropic layer (B) 22b on the optically anisotropic layer (A) 22a side.

That is, as shown in FIG. 16, in a case of being observed from the white arrow side of FIG. 14 [in a case of being observed from the optically anisotropic layer (B) 22b side toward the optically anisotropic layer (A) 22a side], the in-plane slow axis on the surface 222b of the optically anisotropic layer (B) 22b opposite to the optically anisotropic layer (A) 22a side is located at a position rotated counterclockwise by a predetermined angle (twisted angle) of θ2° with reference to the in-plane slow axis of the optically anisotropic layer (A) 22a.

<Optically Anisotropic Layer (A)>

As described above, the optically anisotropic layer (A) is a layer formed by fixing a vertically aligned disk-like liquid crystal compound in the first embodiment, and is a layer formed by fixing a horizontally aligned rod-like liquid crystal compound in the second embodiment.

In addition, the in-plane retardation of the optically anisotropic layer (A) at a wavelength of 550 nm is preferably 140 to 220 nm in both the first embodiment and the second embodiment, and is more preferably 150 to 200 nm from the viewpoint of further suppressing the black tinting in a case of being viewed from the front direction or oblique direction of an organic EL display device to which the optical film according to the embodiment of the present invention is applied as a circularly polarizing plate (hereinafter, also simply referred to as "the viewpoint of further suppressing the black tinting").

In the first embodiment, the angle θ1 formed by the longitudinal direction of the elongated optical film and the in-plane slow axis of the optically anisotropic layer (A) is preferably 40° to 85°, more preferably 50° to 85°, and still more preferably 65° to 85°.

On the other hand, in the second embodiment, the angle θ1 formed by the longitudinal direction of the elongated optical film and the in-plane slow axis of the optically anisotropic layer (A) is preferably 5° to 50°, more preferably 5° to 40°, and still more preferably 5° to 25°.

<Optically Anisotropic Layer (B)>

In both the first embodiment and the second embodiment, the optically anisotropic layer (B) is a layer formed by fixing a twist-aligned liquid crystal compound with a thickness direction as a helical axis, and is preferably a layer formed by fixing a chiral nematic phase having a so-called helical structure. In a case of forming the above phase, it is preferable to use a mixture of a liquid crystal compound showing a nematic liquid crystal phase and a chiral agent which will be described later.

The meaning of the "fixed" state is as described above.

In both the first embodiment and the second embodiment, the value of the product Δnd of the refractive index anisotropy Δn of the optically anisotropic layer (B) measured at a wavelength of 550 nm and the thickness d of the optically anisotropic layer (B) is preferably 140 to 220 nm. From the viewpoint of further suppressing the black tinting, the Δnd is more preferably 150 to 210 nm and still more preferably 160 to 200 nm.

The refractive index anisotropy Δn means a refractive index anisotropy of an optically anisotropic layer.

The Δnd is measured using an AxoScan (polarimeter) device of Axometrics, Inc. and using device analysis software of Axometrics, Inc.

The twisted angle of the liquid crystal compound (twisted angle of an alignment direction of the liquid crystal compound) is preferably 90°±30° (within a range of 60° to 120°). From the viewpoint of further suppressing the black tinting, the twisted angle of the liquid crystal compound is more preferably 90°±20° (within a range of 70° to 110°) and still more preferably 90°±10° (within a range of 80° to 100°).

The twisted angle is measured using an AxoScan (polarimeter) device of Axometrics, Inc. and using device analysis software of Axometrics, Inc.

In addition, the expression "the liquid crystal compound is twist-aligned" is intended to mean that the liquid crystal compound from one main surface to the other main surface of the optically anisotropic layer (B) is twisted around the thickness direction of the optically anisotropic layer (B) as an axis. Along with this, the alignment direction (in-plane slow axis direction) of the liquid crystal compound varies depending on the position in the thickness direction of the optically anisotropic layer (B).

The in-plane slow axis of the optically anisotropic layer (A) is parallel to the in-plane slow axis on the surface of the optically anisotropic layer (B) on the optically anisotropic layer (A) side. In other words, the angle formed by the in-plane slow axis on the surface of the optically anisotropic layer (B) on the optically anisotropic layer (A) side and the longitudinal direction of the elongated optical film corresponds to the above-mentioned θ1.

In addition, the in-plane slow axis on the surface of the optically anisotropic layer (B) on the optically anisotropic layer (A) side, and the in-plane slow axis on the surface of the optically anisotropic layer (B) opposite to the optically anisotropic layer (A) side preferably form the above-mentioned twisted angle (within a range of 90°±30°). The in-plane slow axis on the surface of the optically anisotropic layer (B) opposite to the optically anisotropic layer (A) side rotates clockwise by a predetermined angle (within a range of 90°±30°) with reference to the in-plane slow axis on the surface of the optically anisotropic layer (B) on the optically anisotropic layer (A) side.

(Chiral Agent)

A variety of known chiral agents can be used as the chiral agent for use in the formation of the twisted alignment of a liquid crystal compound. The chiral agent has a function of inducing a helical structure of a liquid crystal compound. The chiral compound may be selected according to the intended purpose, since the induced helical sense or helical pitch differs depending on the compound.

A known compound can be used as the chiral agent, but it preferably has a cinnamoyl group. Examples of the chiral agent include the compounds described in "Liquid Crystal Device Handbook, Chapter 3, Section 4-3, chiral agents for TN and STN, p. 199, edited by the 142nd Committee of the Japan Society for the Promotion of Science, 1989", and JP2003-287623A, JP2002-302487, JP2002-80478A, JP2002-80851A, JP2010-181852A, JP2014-034581A, and the like.

The chiral agent generally contains an asymmetric carbon atom, but an axially asymmetric compound or a planarly asymmetric compound that does not contain an asymmetric carbon atom can also be used as the chiral agent. Examples of the axially asymmetric compound or the planarly asymmetric compound include binaphthyl, helicene, paracyclophane, and derivatives thereof. The chiral agent may have a polymerizable group.

In a case where both the chiral agent and the liquid crystal compound have a polymerizable group, a polymer having a repeating unit derived from the polymerizable liquid crystal compound and a repeating unit derived from the chiral agent can be formed by the polymerization reaction of the polymerizable chiral agent with the polymerizable liquid crystal compound.

In this aspect, the polymerizable group of the polymerizable chiral agent is preferably a group of the same type as the polymerizable group of the polymerizable liquid crystal compound. Therefore, the polymerizable group of the chiral agent is preferably an unsaturated polymerizable group, an epoxy group, or an aziridinyl group, more preferably an unsaturated polymerizable group, and particularly preferably an ethylenically unsaturated polymerizable group.

In addition, the chiral agent may be a liquid crystal compound.

An isosorbide derivative, an isomannide derivative, a binaphthyl derivative, or the like can be preferably used as the chiral agent. A commercially available product such as LC-756 (manufactured by BASF SE) may be used as the isosorbide derivative.

The content of the chiral agent in the liquid crystal composition is preferably 0.01 to 200 mol % and more preferably 1 to 30 mol % of the amount of the liquid crystal compound.

<Optically Anisotropic Layer (C)>

The optically anisotropic layer (C) is a layer formed by fixing a vertically aligned rod-like liquid crystal compound in both the first embodiment and the second embodiment, and is preferably a layer containing a photo-alignment polymer which will be described later.

The in-plane retardation of the optically anisotropic layer (C) at a wavelength of 550 nm is preferably 0 to 10 nm in both the first embodiment and the second embodiment.

In addition, the thickness direction retardation of the optically anisotropic layer (C) at a wavelength of 550 nm is preferably −120 to −20 nm in the first embodiment, and is preferably −150 to −50 nm in the second embodiment.

The in-plane retardation is more preferably 0 to 5 nm from the viewpoint of further suppressing the black tinting.

In the first embodiment, the thickness direction retardation is more preferably −110 to −30 nm and still more preferably −100 to −40 nm from the viewpoint of further suppressing the black tinting. In the second embodiment, the thickness direction retardation is more preferably −140 to −60 nm and still more preferably −130 to −70 nm.

<Method for Producing Optical Film>

The method for producing the above-mentioned optical film is not particularly limited, and a known method can be adopted. In particular, the method for producing the above-mentioned optical film can be continuously carried out by roll-to-roll processing.

For example, the optical film can be produced by preparing an optically anisotropic layer (A) to an optically anisotropic layer (C) each exhibiting predetermined optical properties, and bonding the optically anisotropic layers and an elongated support in a predetermined order through an adhesion layer (for example, a pressure sensitive adhesive layer or an adhesive layer).

In addition, the optical film may be produced by sequentially preparing an optically anisotropic layer (A) to an optically anisotropic layer (C) on an elongated support by using a polymerizable liquid crystal composition which will be described later. For example, the optical film may be produced in such a manner that a polymerizable liquid crystal composition is applied onto an elongated support to form an optically anisotropic layer (C), a polymerizable liquid crystal composition is applied onto the optically anisotropic layer (C) to form an optically anisotropic layer (B), and further, a polymerizable liquid crystal composition is applied onto the optically anisotropic layer (B) to form an optically anisotropic layer (A).

In addition, the above-mentioned method of bonding an optically anisotropic layer and the above-mentioned method of forming an optically anisotropic layer using a polymerizable liquid crystal composition may be combined.

As a combined method, the optical film can be produced in such a manner that a polymerizable liquid crystal composition is applied onto an elongated support to form an optically anisotropic layer (C), a polymerizable liquid crystal composition is applied onto the optically anisotropic layer (C) to form an optically anisotropic layer (B) to obtain a laminate, and then an optically anisotropic layer (A) formed by applying a polymerizable liquid crystal composition onto an elongated support is separately bonded to the optically anisotropic layer (B) through an adhesion layer (for example, a pressure sensitive adhesive layer or an adhesive layer).

In addition, as another combined method, the optical film can be produced in such a manner that a polymerizable liquid crystal composition is applied onto an elongated support to form an optically anisotropic layer (C), a polymerizable liquid crystal composition is applied onto the optically anisotropic layer (C) to form an optically anisotropic layer (A) to obtain a laminate, and then an optically anisotropic layer (B) formed by applying a polymerizable liquid crystal composition onto an elongated support is separately bonded to the optically anisotropic layer (C) through an adhesion layer (for example, a pressure sensitive adhesive layer or an adhesive layer).

Hereinafter, each member will be described in detail.

(Liquid Crystal Compound)

Each of the optically anisotropic layer (A), the optically anisotropic layer (B), and the optically anisotropic layer (C) is a layer in which the above-mentioned liquid crystal compound is fixed in a predetermined alignment state, and is preferably a layer formed of a composition containing a liquid crystal compound having a polymerizable group (hereinafter, also simply referred to as "polymerizable liquid crystal composition").

Here, for example, those described in claim 1 of JP1999-513019A (JP-H11-513019A) and paragraphs [0026] to [0098] of JP2005-289980A can be preferably used as the above-mentioned rod-like liquid crystal compound.

In addition, for example, those described in paragraphs [0020] to [0067] of JP2007-108732A and paragraphs [0013] to [0108] of JP2010-244038A can be preferably used as the above-mentioned disk-like liquid crystal compound (discotic liquid crystal compound).

In the present invention, the rod-like liquid crystal compound may be a liquid crystal compound having forward wavelength dispersibility or a liquid crystal compound having reverse wavelength dispersibility. In a case of the liquid crystal compound having forward wavelength dispersibility, it is preferable from the viewpoint that the production cost of the optical film is reduced and the durability is also improved.

In the present specification, the liquid crystal compound having forward wavelength dispersibility refers to a liquid crystal compound in which an in-plane retardation (Re) value decreases as a measurement wavelength increases in a case where the Re value in a visible light range of an optically anisotropic layer prepared using this liquid crystal compound is measured. On the other hand, the liquid crystal compound having reverse wavelength dispersibility refers to a liquid crystal compound in which the Re value increases as the measurement wavelength increases in a case where the Re value is measured similarly.

The type of the polymerizable group contained in the liquid crystal compound is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The optically anisotropic layer produced in the present invention is a layer formed by fixing a liquid crystal compound having a polymerizable group (a rod-like liquid crystal compound or discotic liquid crystal compound having a polymerizable group) by means of polymerization or the like. After being formed into a layer, the optically anisotropic layer no longer needs to exhibit liquid crystallinity.

The content of the liquid crystal compound in the polymerizable liquid crystal composition is not particularly limited, and is preferably 60% by mass or more and more preferably 70% by mass or more with respect to the total mass (solid content) of the polymerizable liquid crystal composition, from the viewpoint that the alignment state of the liquid crystal compound can be easily controlled. The upper limit of the content of the liquid crystal compound is not particularly limited, and is preferably 99% by mass or less and more preferably 97% by mass or less.

(Other Components)

The polymerizable liquid crystal composition may contain components other than the liquid crystal compound.

For example, the polymerizable liquid crystal composition may contain a polymerization initiator. In a case where the polymerizable liquid crystal composition contains the polymerization initiator, the polymerization of the liquid crystal compound having a polymerizable group proceeds more efficiently.

The polymerization initiator may be, for example, a known polymerization initiator, examples of which include a photopolymerization initiator and a thermal polymerization initiator, among which a photopolymerization initiator is preferable.

The content of the polymerization initiator in the polymerizable liquid crystal composition is not particularly limited, and is preferably 0.01% to 20% by mass and more preferably 0.5% to 10% by mass with respect to the total mass (solid content) of the polymerizable liquid crystal composition.

The polymerizable liquid crystal composition may contain a photosensitizer.

The type of the photosensitizer is not particularly limited, and examples thereof include known photosensitizers.

The content of the photosensitizer in the polymerizable liquid crystal composition is not particularly limited, and is preferably 0.01% to 20% by mass and more preferably 0.5% to 10% by mass with respect to the total mass (solid content) of the polymerizable liquid crystal composition.

The polymerizable liquid crystal composition may contain a polymerizable monomer different from the liquid crystal compound having a polymerizable group. Examples of the polymerizable monomer include a radically polymerizable compound and a cationically polymerizable compound, among which a polyfunctional radically polymerizable monomer is preferable. Examples of the polymerizable monomer include polymerizable monomers described in paragraphs [0018] to [0020] of JP2002-296423A.

The content of the polymerizable monomer in the polymerizable liquid crystal composition is not particularly limited, and is preferably 1% to 50% by mass and more preferably 5% to 30% by mass with respect to the total mass of the liquid crystal compound.

The polymerizable liquid crystal composition may contain a surfactant. Examples of the surfactant include conventionally known compounds, among which a fluorine-based compound is preferable. Specific examples of the surfactant include compounds described in paragraphs [0028] to [0056] of JP2001-330725A and compounds described in paragraphs [0069] to [0126] of JP2003-295212.

The polymerizable liquid crystal composition may contain a polymer. Examples of the polymer include cellulose esters. Examples of the cellulose ester include cellulose esters described in paragraph [0178] of JP2000-155216A.

The content of the polymer in the polymerizable liquid crystal composition is not particularly limited, and is preferably 0.1% to 10% by mass and more preferably 0.1% to 8% by mass with respect to the total mass of the liquid crystal compound.

The polymerizable liquid crystal composition for forming the optically anisotropic layer (C) may contain a photoacid generator in a case where the photo-alignment polymer contained in the polymerizable liquid crystal composition is a cleavable photo-alignment polymer which will be described later.

Examples of the photoacid generator include an onium salt compound, a trichloromethyl-s-triazine, a sulfonium salt, an iodonium salt, a quaternary ammonium salt, a diazomethane compound, an imide sulfonate compound, and an oxime sulfonate compound. Among them, an onium salt compound, an imide sulfonate compound, or an oxime sulfonate compound is preferable, and an onium salt compound or an oxime sulfonate compound is more preferable. The photoacid generators may be used alone or in combination of two or more thereof.

The polymerizable liquid crystal composition may contain an additive (alignment control agent) that promotes horizontal alignment or vertical alignment in order to bring a liquid crystal compound into a horizontal alignment state or a vertical alignment state, in addition to the foregoing components.

(Photo-Alignment Polymer)

Any photo-alignment polymer that may be contained in the optically anisotropic layer (C) of the optical film according to the embodiment of the present invention (hereinafter, also formally referred to simply as "photo-alignment polymer of the present invention") is a polymer having a photo-alignment group.

The photo-alignment group contained in the photo-alignment polymer of the present invention refers to a group having a photo-alignment function in which rearrangement or an anisotropic chemical reaction is induced upon irradiation with light having anisotropy (for example, plane polarized light), and is preferably a photo-alignment group in which at least one of dimerization or isomerization occurs by the action of light, from the viewpoint that the uniformity of alignment is excellent and the thermal stability and chemical stability are also favorable.

Specific suitable examples of the group to be dimerized by the action of light include groups having a skeleton of at least one derivative selected from the group consisting of a cinnamic acid derivative, a coumarin derivative, a chalcone derivative, a maleimide derivative, and a benzophenone derivative.

On the other hand, specific suitable examples of the group to be isomerized by the action of light include groups having a skeleton of at least one compound selected from the group consisting of an azobenzene compound, a stilbene compound, a spiropyrane compound, a cinnamic acid compound, and a hydrazono-β-ketoester compound.

Among these photo-alignment groups, a group selected from the group consisting of a cinnamoyl group, an azobenzene group, a chalconyl group, and a coumarin group is preferable, from the viewpoint that the liquid crystal alignment properties of the optically anisotropic layer formed on the upper layer are more favorable even with a small exposure amount.

The photo-alignment polymer of the present invention is preferably a photo-alignment polymer containing a repeating unit having a photo-alignment group and a repeating unit having a fluorine atom or a silicon atom in a case where the optically anisotropic layer (C) is formed.

In addition, from the viewpoint that the liquid crystal alignment properties of the optically anisotropic layer formed on the upper layer are more favorable, the photo-alignment polymer of the present invention is preferably a photo-alignment polymer having a repeating unit A containing a cleavage group that decomposes by the action of at least one selected from the group consisting of light, heat, an acid, and a base to generate a polar group, in which the repeating unit A has a cleavage group in a side chain and a fluorine atom or a silicon atom on more terminal side than the cleavage group of the side chain (hereinafter, also simply referred to as "cleavable photo-alignment polymer").

Here, the "polar group" contained in the repeating unit A refers to a group having at least one or more heteroatoms or halogen atoms, and specifically includes, for example, a hydroxy group, a carbonyl group, a carboxyl group, an amino group, a nitro group, an ammonium group, and a cyano group. Among those groups, a hydroxy group, a carbonyl group, and a carboxyl group are preferable.

In addition, the "cleavage group that generates a polar group" refers to a group that generates the above-mentioned polar group by cleavage, but in the present invention, a group that reacts with an oxygen molecule after radical cleavage to generate a polar group is also included.

Examples of such a cleavable photo-alignment polymer include the photo-alignment polymers described in paragraphs [0014] to [0049] of WO2018/216812A, in which the contents of these paragraphs are incorporated herein.

Other suitable examples of the photo-alignment polymer containing a repeating unit having a fluorine atom or a silicon atom include a copolymer having a repeating unit having a fluorine atom or a silicon atom and represented by Formula (1) or Formula (2) and a repeating unit having a photo-alignment group (hereinafter, also simply referred to as "specific copolymer").

The repeating unit having a fluorine atom or a silicon atom and represented by Formula (1) or Formula (2) is a repeating unit containing a cleavage group that decomposes by the action of at least one selected from the group consisting of light, heat, an acid, and a base to generate a polar group.

<<Repeating Unit Having Fluorine Atom or Silicon Atom and Represented by Formula (1) or Formula (2)>>

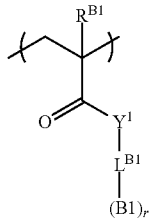
(1)

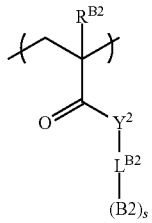
(2)

In Formula (1) and Formula (2), r and s each independently represent an integer of 1 or more.

In addition, $R^{B1}$ and $R^{B2}$ each independently represent a hydrogen atom or a substituent.

In addition, $Y^1$ and $Y^2$ each independently represent —O— or —$NR^Z$—. In this regard, $R^Z$ represents a hydrogen atom or a substituent.

In addition, $L^{B1}$ represents an r+1-valent linking group.

In addition, $L^{B2}$ represents an s+1-valent linking group.

In addition, B1 represents a group represented by Formula (B1). In this regard, in a case where * in Formula (B1) represents a bonding position with $L^{B1}$ and r is an integer of 2 or more, the plurality of B1's may be the same as or different from each other.

In addition, B2 represents a group represented by Formula (B2). In this regard, in a case where * in Formula (B2) represents a bonding position with $L^{B2}$ and s is an integer of 2 or more, the plurality of B2's may be the same as or different from each other.

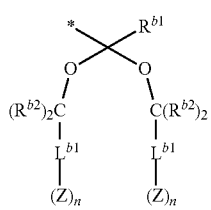
(B1)

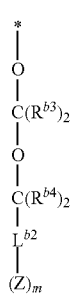
(B2)

In Formula (B1) and Formula (B2), * represents a bonding position.

In addition, n represents an integer of 1 or more. In this regard, the plurality of n's may be the same as or different from each other.

In addition, m represents an integer of 2 or more.

In addition, $R^{b1}$ represents a hydrogen atom or a substituent.

In addition, $R^{b2}$, $R^{b3}$, and $R^{b4}$ each independently represent a hydrogen atom or a substituent. In this regard, the two $R^{b3}$'s may be bonded to each other to form a ring, the plurality of $R^{b2}$'s may be the same as or different from each other, the plurality of $R^{b3}$'s may be the same as or different from each other, and the plurality of $R^{b4}$'s may be the same as or different from each other.

In addition, $L^{b1}$ represents an n+1-valent linking group. In this regard, the plurality of $L^{b1}$'s may be the same as or different from each other.

In addition, $L^{b2}$ represents an m+1-valent linking group.

In addition, Z represents an aliphatic hydrocarbon group having a fluorine atom or an organosiloxane group. In this regard, the aliphatic hydrocarbon group may have an oxygen atom, and a plurality of Z's may be the same as or different from each other.

Examples of the substituent represented by $R^{B1}$ in Formula (1) include known substituents. Above all, the substituent represented by $R^{B1}$ is preferably an alkyl group having 1 to 12 carbon atoms and more preferably a methyl group.

In Formula (1), $Y^1$ represents —O— or —$NR^Z$— where $R^Z$ represents a hydrogen atom or a substituent. Examples of the substituent represented by $R^Z$ include known substituents, among which a methyl group is preferable. Y' preferably represents —O— or —NH— and more preferably represents —O—.

In Formula (1), $L^{B1}$ represents an r+1-valent linking group.

The r+1-valent linking group is an r+1-valent hydrocarbon group having 1 to 24 carbon atoms which may have a substituent, preferably a hydrocarbon group in which some of the carbon atoms constituting the hydrocarbon group may be substituted with heteroatoms, and more preferably an aliphatic hydrocarbon group having 1 to 10 carbon atoms which may contain an oxygen atom or a nitrogen atom. The r+1-valent linking group is preferably a divalent to trivalent linking group and more preferably a divalent linking group.

In Formula (1), r represents an integer of 1 or more. Above all, from the viewpoint of synthetic suitability, r is preferably an integer of 1 to 3, more preferably an integer of 1 to 2, and still more preferably 1.

Examples of the substituent represented by $R^{B2}$ in Formula (2) include known substituents. Above all, the substituent represented by $R^{B2}$ is preferably an alkyl group having 1 to 12 carbon atoms and more preferably a methyl group.

In Formula (2), $Y^2$ represents —O— or —$NR^Z$—. In this regard, $R^Z$ represents a hydrogen atom or a substituent. Examples of the substituent represented by $R^Z$ include known substituents, among which a methyl group is preferable. $Y^2$ preferably represents —O— or —NH— and more preferably represents —O—.

In Formula (2), $L^{B2}$ represents an s+1-valent linking group.

The s+1-valent linking group is an s+1-valent hydrocarbon group having 1 to 24 carbon atoms which may have a substituent, preferably a hydrocarbon group in which some of the carbon atoms constituting the hydrocarbon group may be substituted with heteroatoms, and more preferably an aliphatic hydrocarbon group having 1 to 10 carbon atoms which may contain an oxygen atom or a nitrogen atom.

The s+1-valent linking group is preferably a divalent linking group.

In Formula (2), s represents an integer of 1 or more. Above all, from the viewpoint of synthetic suitability, s is preferably an integer of 1 to 2 and more preferably 1.

In Formula (B1), the substituent represented by $R^{b1}$ is preferably an aliphatic hydrocarbon group having 1 to 18 carbon atoms, more preferably an alkyl group having 1 to 12 carbon atoms, and particularly preferably a methyl group. $R^{b1}$ is preferably a substituent.

Examples of the substituent represented by $R^{b2}$ in Formula (B1) include known substituents, including the groups exemplified for the substituent represented by $R^{b1}$ in Formula (B1). In addition, $R^{b2}$ preferably represents a hydrogen atom.

In Formula (B1), $L^{b1}$ represents an n+1-valent linking group, and the n+1-valent linking group is an n+1-valent hydrocarbon group having 1 to 24 carbon atoms which may have a substituent, preferably a hydrocarbon group in which some of the carbon atoms constituting the hydrocarbon group may be substituted with heteroatoms, and more preferably an aliphatic hydrocarbon group having 1 to 10 carbon atoms which may contain an oxygen atom or a nitrogen atom.

The n+1-valent linking group is preferably a divalent to tetravalent linking group, more preferably a divalent to trivalent linking group, and still more preferably a divalent linking group.

In Formula (B1), n represents an integer of 1 or more. Above all, from the viewpoint of synthetic suitability, n is preferably an integer of 1 to 5, more preferably an integer of 1 to 3, and still more preferably 1.

In Formula (B1) and Formula (B2), Z represents an aliphatic hydrocarbon group having a fluorine atom or an organosiloxane group. In this regard, the aliphatic hydrocarbon group may have an oxygen atom, and a plurality of Z's may be the same as or different from each other.

Examples of the aliphatic hydrocarbon group having a fluorine atom include a fluorine atom-containing alkyl group, a fluorine atom-containing alkyl group in which one or more of —CH$_2$— constituting the fluorine atom-containing alkyl group are substituted with —O—, and a fluorine atom-containing alkenyl group. The number of carbon atoms in the aliphatic hydrocarbon group having a fluorine atom is not particularly limited and is preferably 1 to 30, more preferably 3 to 20, and still more preferably 3 to 10.

The number of fluorine atoms contained in the aliphatic hydrocarbon group having a fluorine atom is not particularly limited and is preferably 1 to 30, more preferably 5 to 25, and still more preferably 7 to 20.

Examples of the substituent represented by $R^{b3}$ and $R^{b4}$ in Formula (B2) include known substituents, including the groups exemplified for the substituent represented by $R^{b1}$ in Formula (B1). In addition, with regard to $R^{b3}$, it is preferable that two Rb's are bonded to each other to form a ring, and it is more preferable that two $R^{b3}$'s are bonded to each other to form a cyclohexane ring. In addition, $R^{b4}$ preferably represents a hydrogen atom.

In Formula (B2), $L^{b2}$ represents an m+1-valent linking group.

The m+1-valent linking group is an m+1-valent hydrocarbon group having 1 to 24 carbon atoms which may have a substituent, preferably a hydrocarbon group in which some of the carbon atoms constituting the hydrocarbon group may be substituted with heteroatoms, and more preferably an aliphatic hydrocarbon group having 1 to 10 carbon atoms which may contain an oxygen atom or a nitrogen atom. The m+1-valent linking group is preferably a trivalent to tetravalent linking group and more preferably a tetravalent linking group.

In Formula (B2), m represents an integer of 2 or more. Above all, from the viewpoint of synthetic suitability, m is preferably an integer of 2 to 4 and more preferably an integer of 2 to 3.

Specific examples of the repeating unit containing the group represented by Formula (B1) include repeating units represented by Formula B-1 to Formula B-22, and specific examples of the repeating unit containing the group represented by Formula (B2) include repeating units represented by Formula B-23 and Formula B-24.

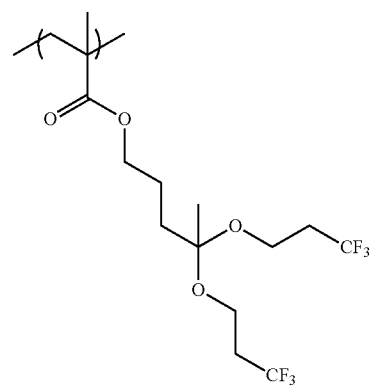

B-1

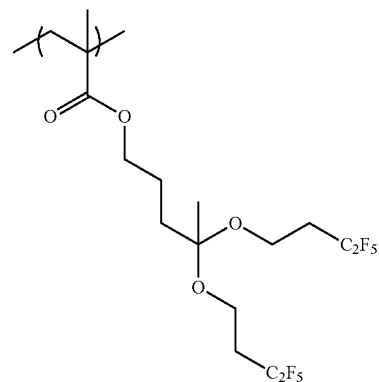

B-2

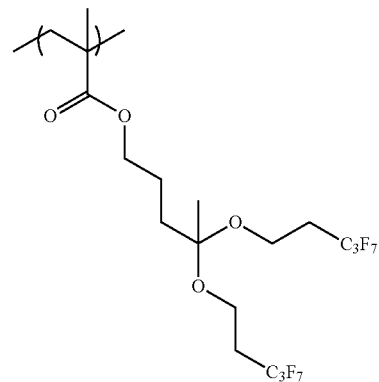

B-3

B-4
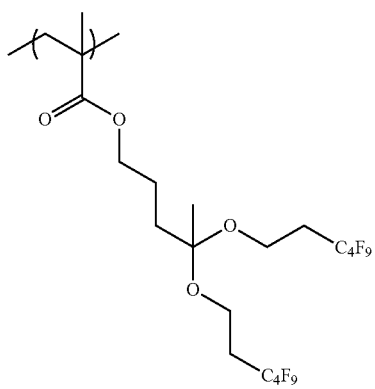
B-5
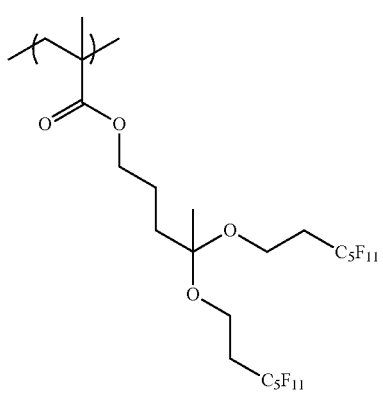
B-6
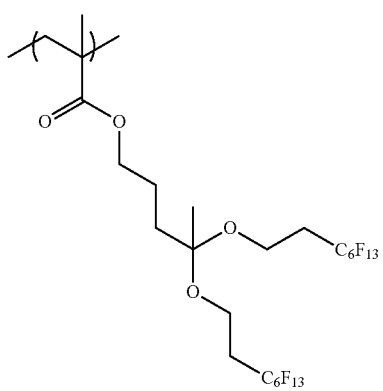
B-7
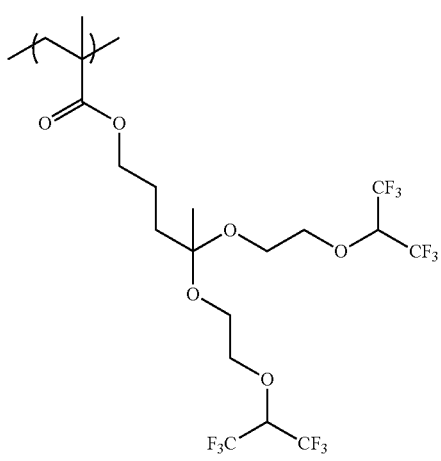
B-8
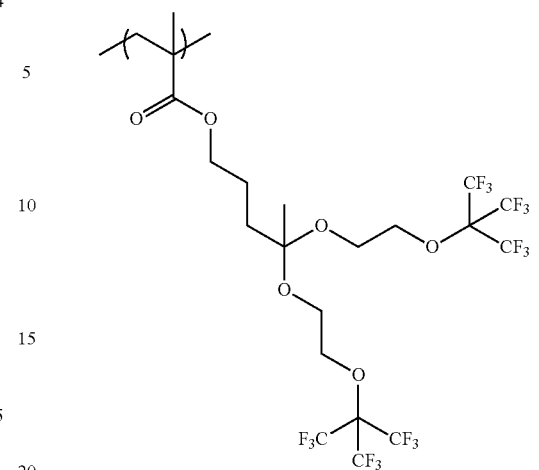
B-9
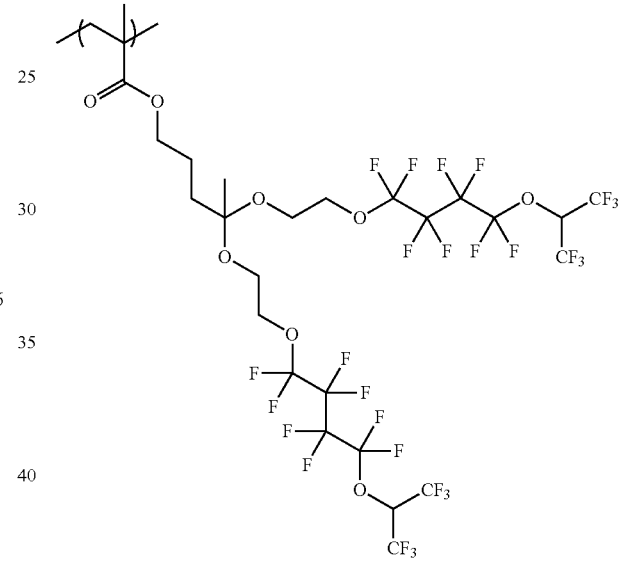
B-10
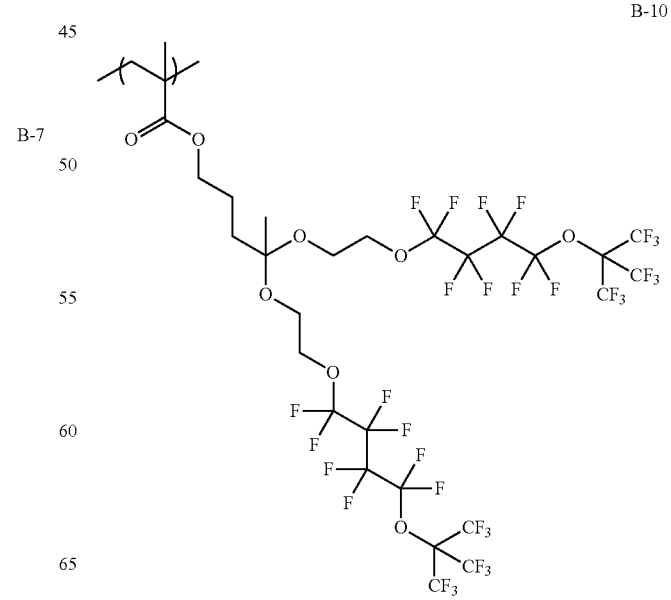

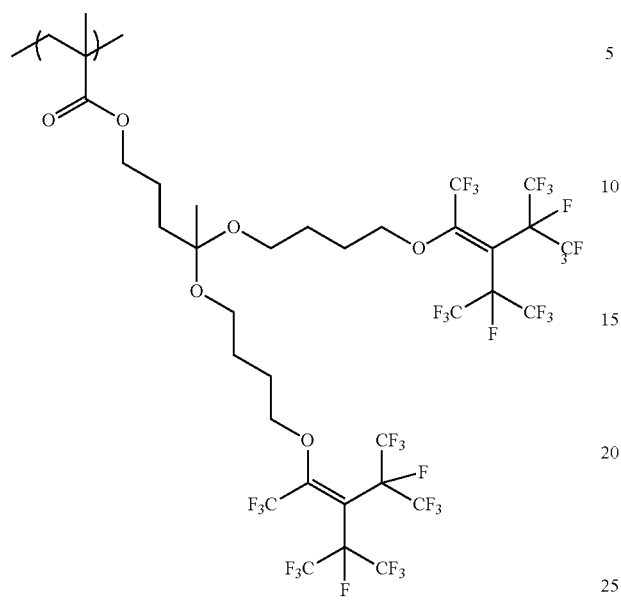
B-11
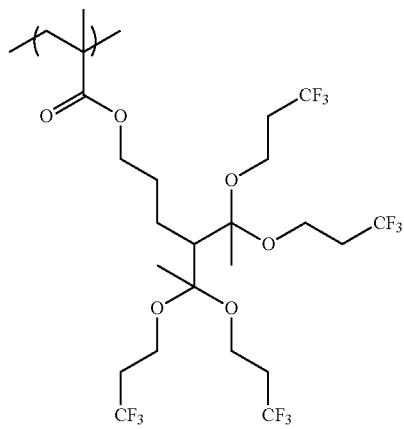
B-14
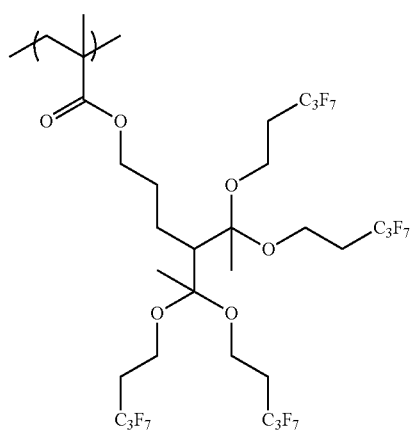
B-15
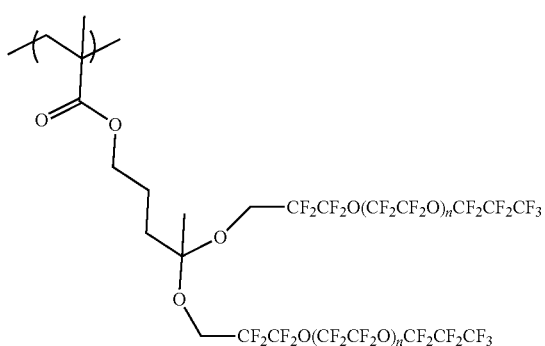
B-12
B13
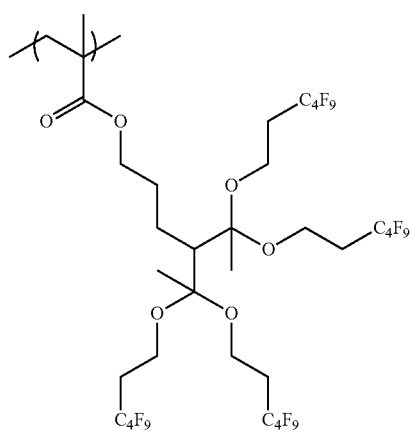
B-16

B-17
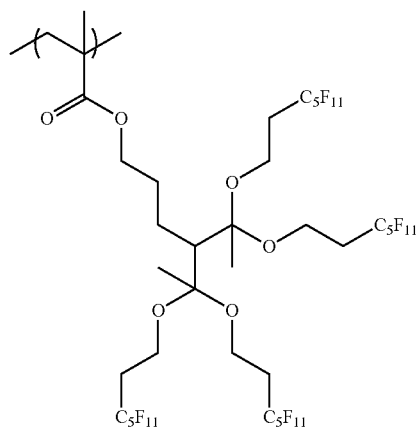
B-20
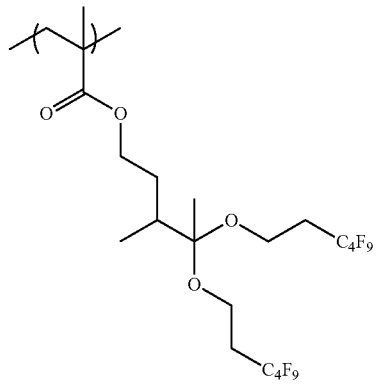
B-18
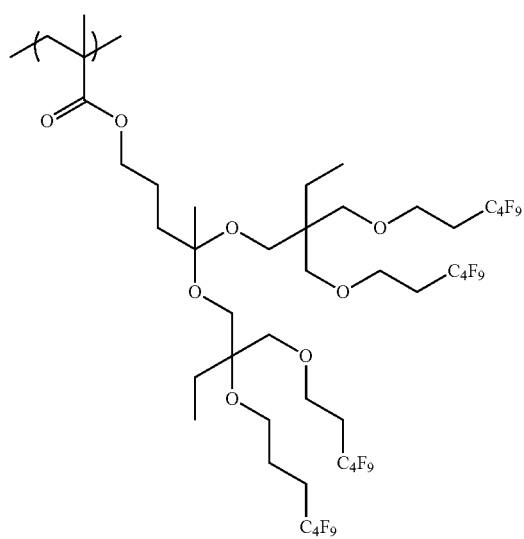
B-21
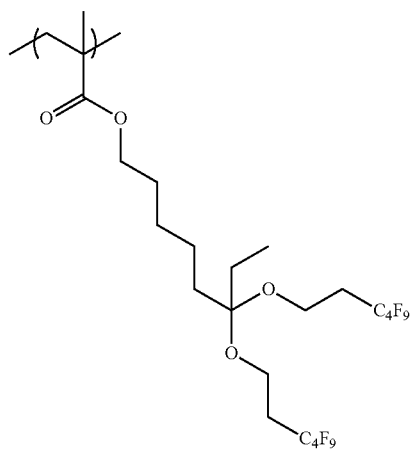
B-19
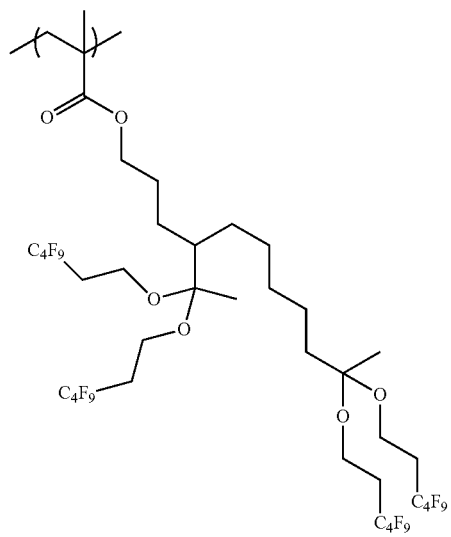
B-22
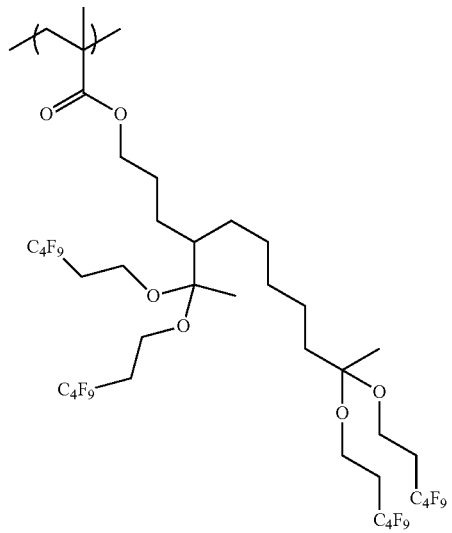

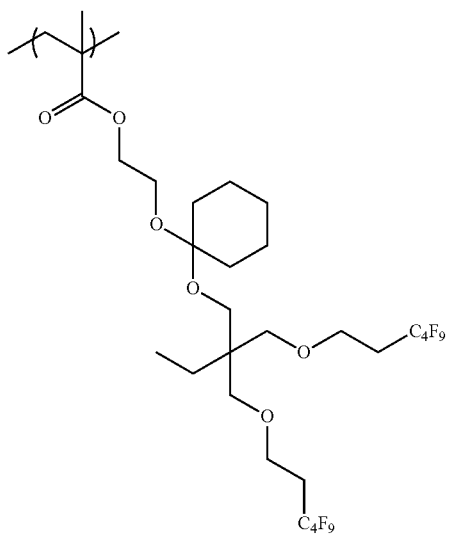

B-23

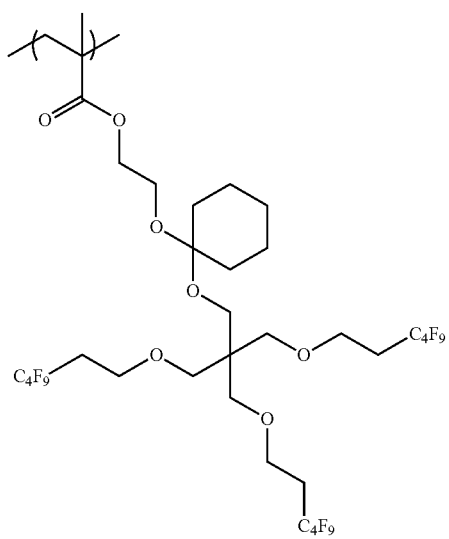

B-24

The content of the repeating unit having the group represented by Formula (1) or Formula (2) in the photo-alignment polymer is not particularly limited. From the viewpoint that the liquid crystal alignment properties of the optically anisotropic layer formed on the upper layer are more favorable, the content of the repeating unit having the group represented by Formula (1) or Formula (2) is preferably 3% by mass or more, more preferably 5% by mass or more, still more preferably 10% by mass or more, and particularly preferably 20% by mass or more, and preferably 95% by mass or less, more preferably 80% by mass or less, still more preferably 70% by mass or less, particularly preferably 60% by mass or less, and most preferably 50% by mass or less with respect to all the repeating units of the photo-alignment polymer.

<<Repeating Unit Having Photo-Alignment Group>>

The structure of the main chain of the repeating unit having a photo-alignment group is not particularly limited, and may be, for example, a known structure, which is preferably, for example, a skeleton selected from the group consisting of a (meth)acrylic skeleton, a styrene-based skeleton, a siloxane-based skeleton, a cycloolefin-based skeleton, a methylpentene-based skeleton, an amide-based skeleton, and an aromatic ester-based skeleton.

Among these skeletons, a skeleton selected from the group consisting of a (meth)acrylic skeleton, a siloxane-based skeleton, and a cycloolefin-based skeleton is more preferable, and a (meth)acrylic skeleton is still more preferable.

Specific examples of the repeating unit having a photo-alignment group include the following.

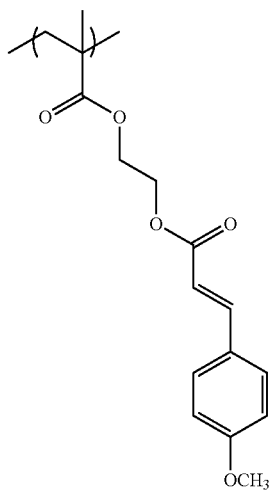

A-1

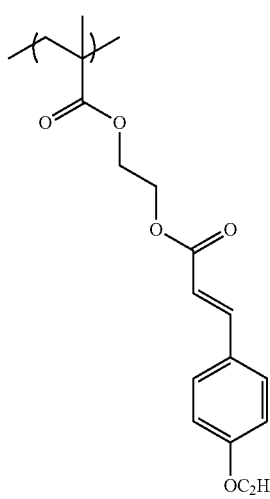

A-2

A-3
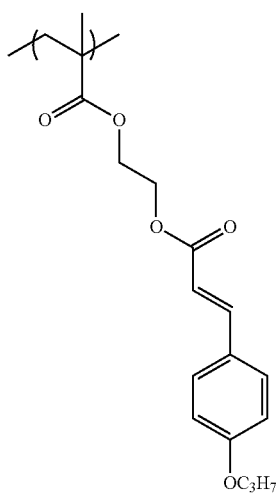
A-4
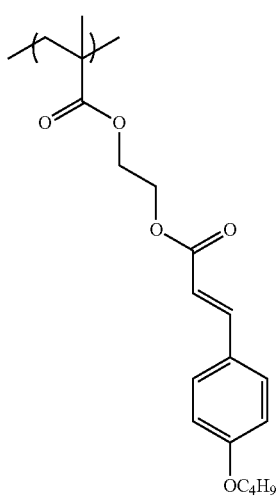
A-5
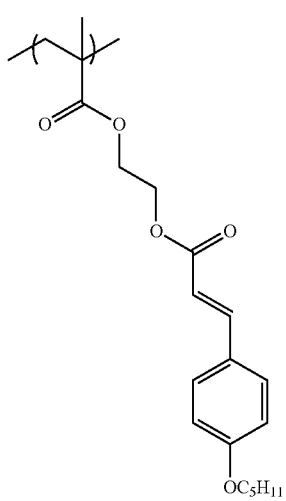
A-6
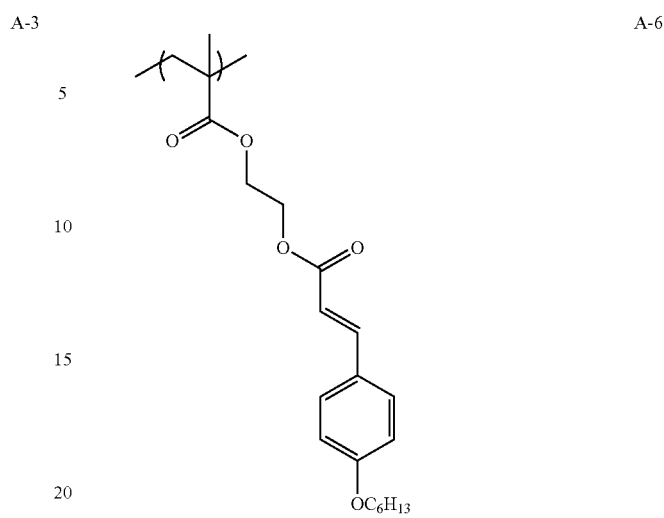
A-7
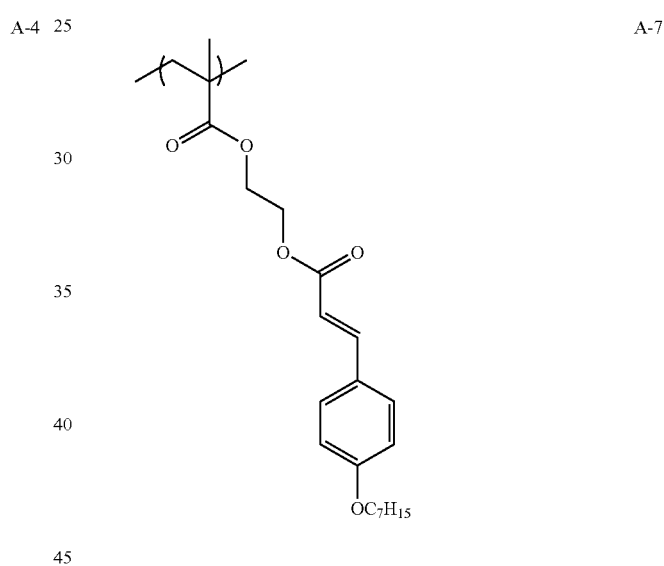
A-8
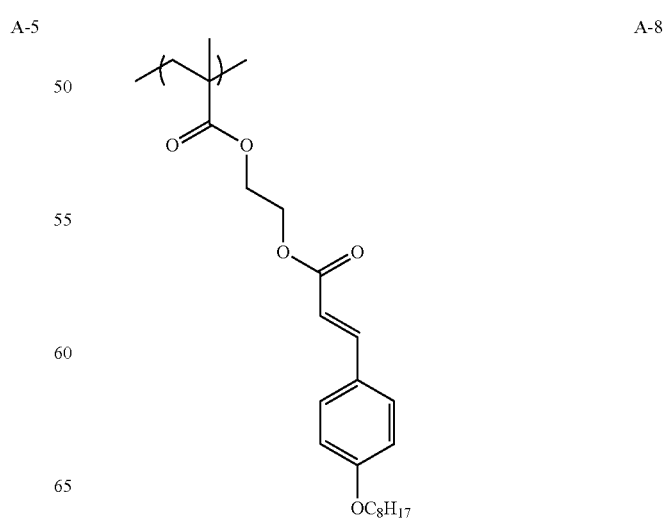

A-9
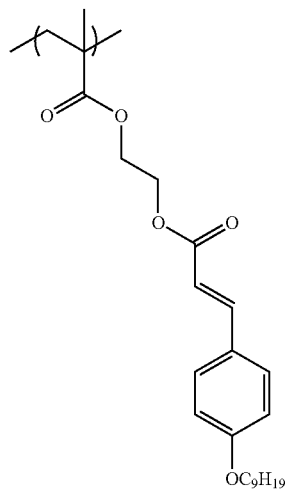
A-10
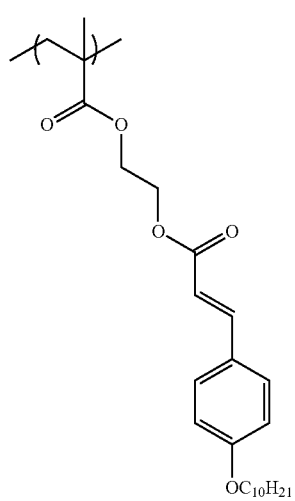
A-11
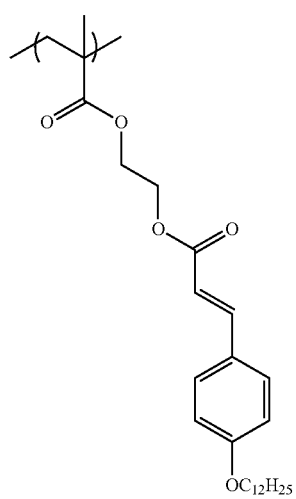
A-12
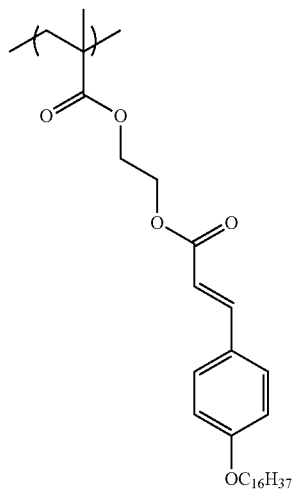
A-13
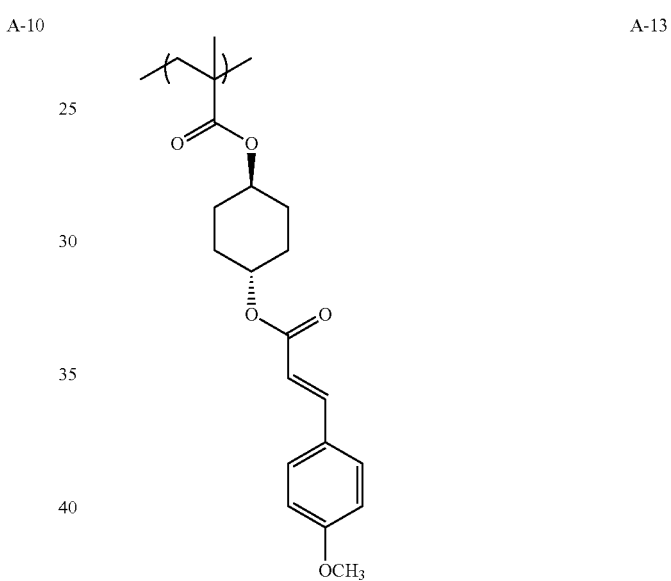
A-14
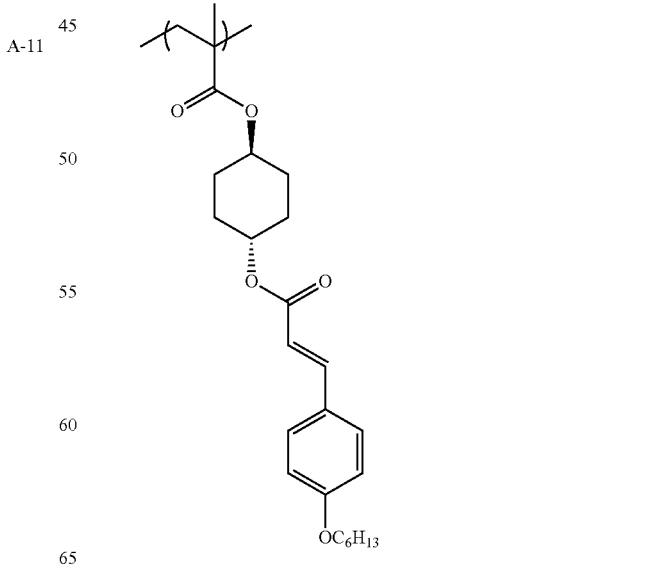

A-15
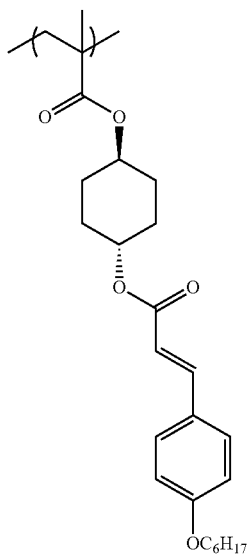
A-16
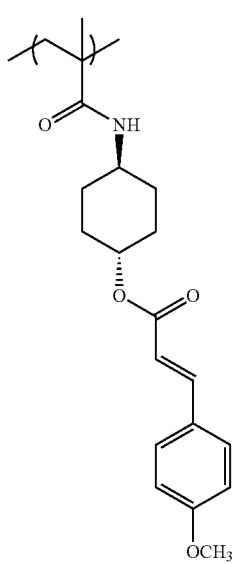
A-17
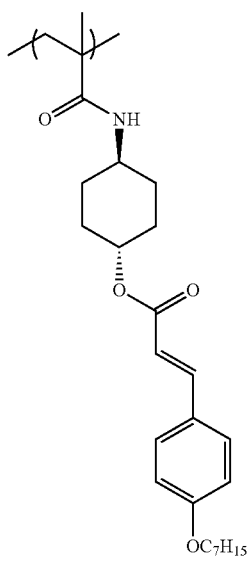
A-18
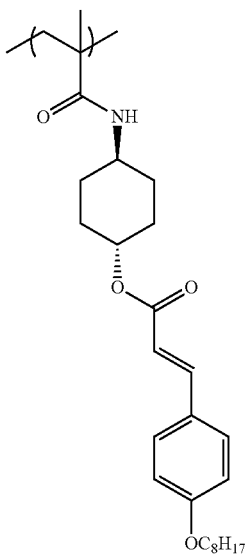
A-19
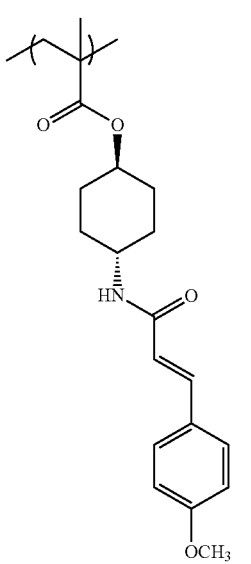
A-20
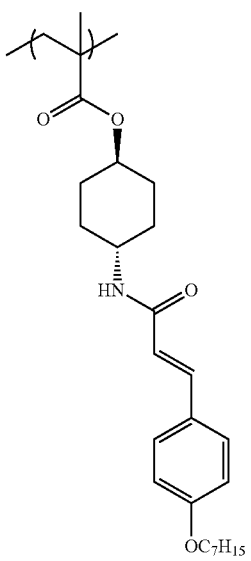

A-21
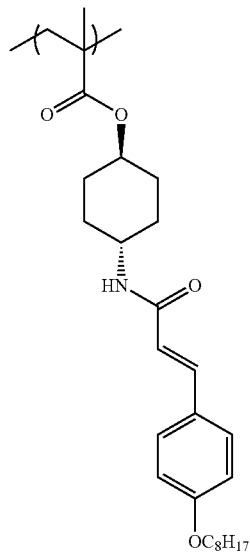
A-22
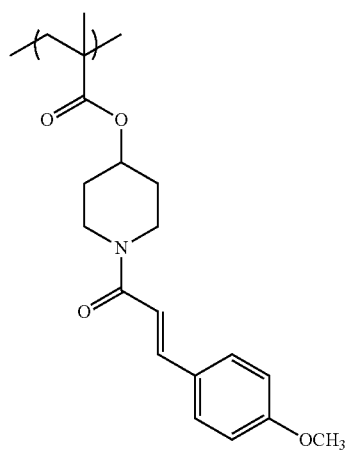
A-23
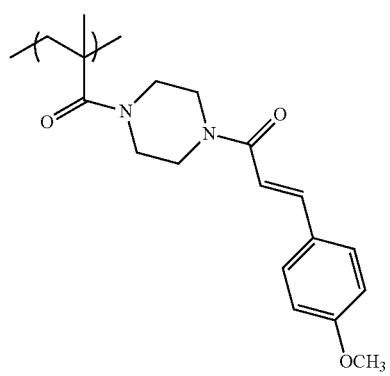
A-24
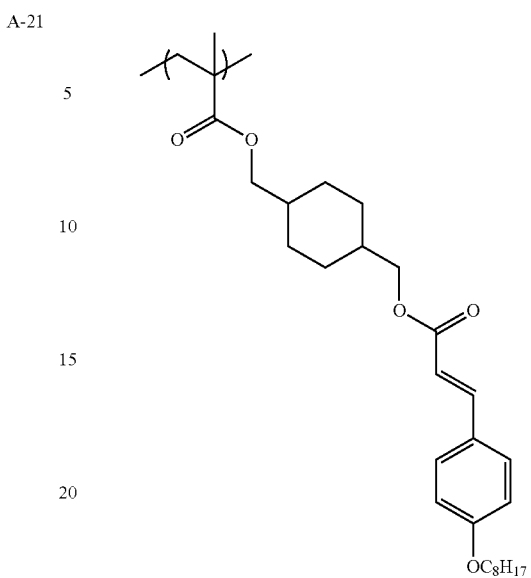
A-25
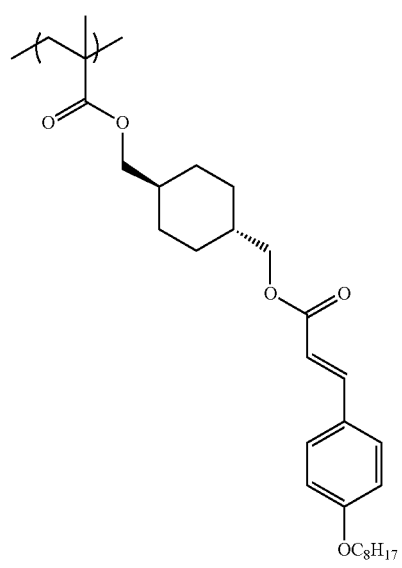
A-26
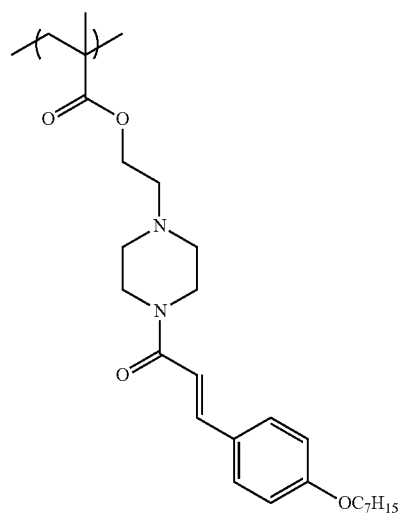

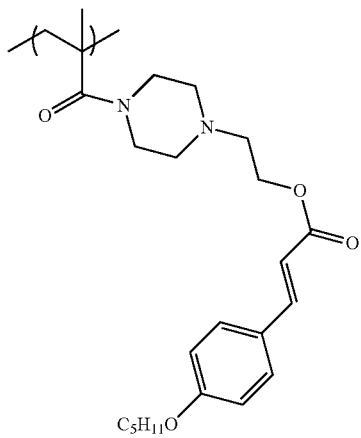

A-27

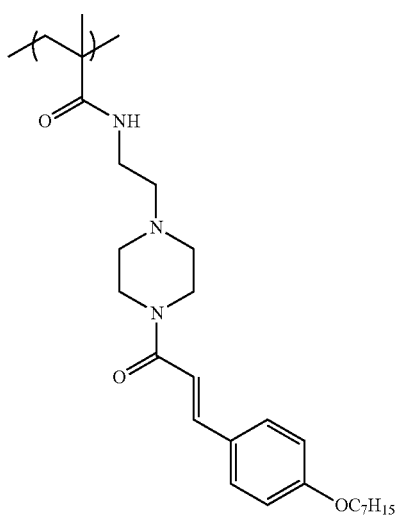

A-28

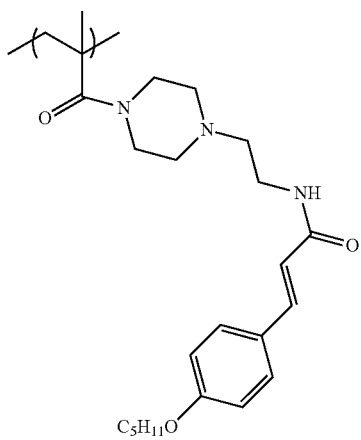

A-29

The content of the repeating unit having a photo-alignment group in the photo-alignment polymer is not particularly limited. From the viewpoint that the liquid crystal alignment properties of the optically anisotropic layer formed on the upper layer are more favorable, the content of the repeating unit having a photo-alignment group is preferably 5% to 60% by mass, more preferably 10% to 50% by mass, and still more preferably 15% to 40% by mass with respect to all the repeating units of the photo-alignment polymer.

<<Repeating Unit Having Crosslinkable Group>>

The specific copolymer may further have a repeating unit having a crosslinkable group, in addition to the repeating unit having the group represented by Formula (1) or Formula (2) and the repeating unit having a photo-alignment group.

The type of the crosslinkable group is not particularly limited, and may be, for example, a known crosslinkable group. Among them are an epoxy group, an epoxycyclohexyl group, an oxetanyl group, an acryloyl group, a methacryloyl group, a vinyl group, a styryl group, and an allyl group.

The structure of the main chain of the repeating unit having a crosslinkable group is not particularly limited, and may be, for example, a known structure, which is preferably, for example, a skeleton selected from the group consisting of a (meth)acrylic skeleton, a styrene-based skeleton, a siloxane-based skeleton, a cycloolefin-based skeleton, a methylpentene-based skeleton, an amide-based skeleton, and an aromatic ester-based skeleton.

Among these skeletons, a skeleton selected from the group consisting of a (meth)acrylic skeleton, a siloxane-based skeleton, and a cycloolefin-based skeleton is more preferable, and a (meth)acrylic skeleton is still more preferable.

Specific examples of the repeating unit having a crosslinkable group include the following.

C-1

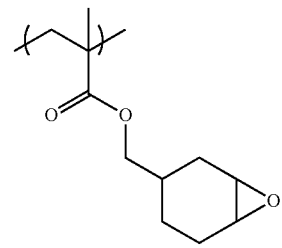

C-2

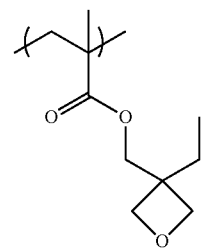

C-3

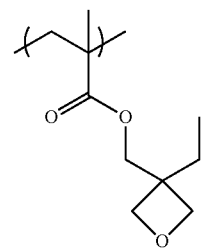

C-4

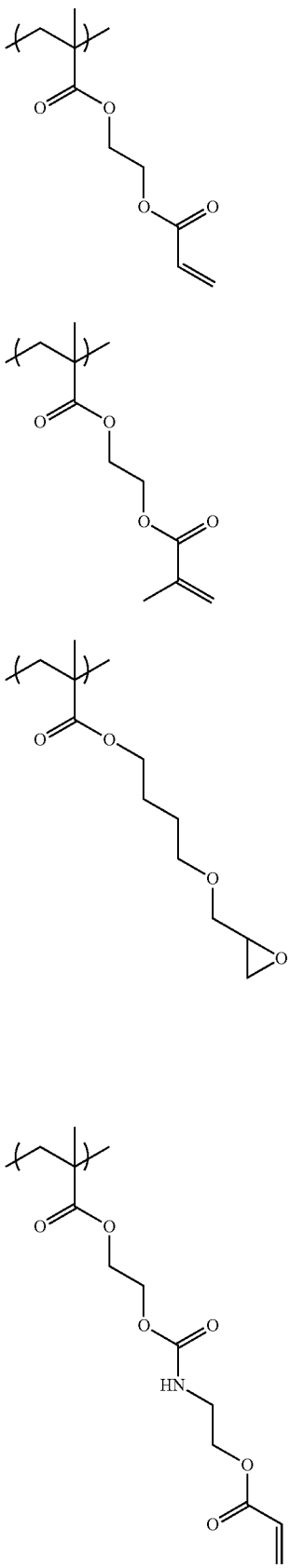

C-5

C-6

C-7

C-8

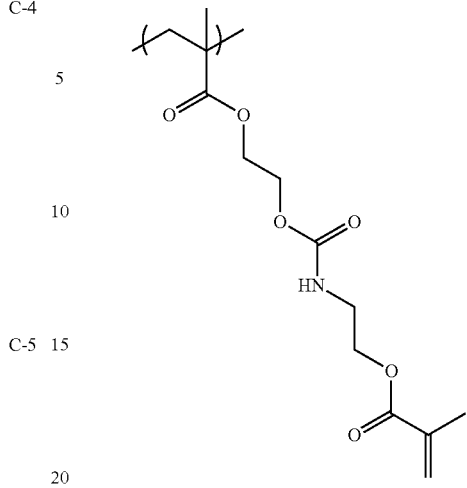

The content of the repeating unit having a crosslinkable group in the specific copolymer is not particularly limited, and is preferably 10% to 60% by mass and more preferably 20% to 50% by mass with respect to all the repeating units of the photo-alignment polymer, from the viewpoint that the liquid crystal alignment properties of the optically anisotropic layer formed on the upper layer are more favorable.

Examples of the monomer (radical polymerizable monomer) forming a repeating unit other than the foregoing repeating units include an acrylic acid ester compound, a methacrylic acid ester compound, a maleimide compound, an acrylamide compound, acrylonitrile, maleic acid anhydride, a styrene compound, and a vinyl compound.

The method for synthesizing the photo-alignment polymer of the present invention is not particularly limited. For example, the photo-alignment polymer of the present invention can be synthesized by mixing a monomer forming the above-mentioned repeating unit having the group represented by Formula (1) or Formula (2), a monomer forming the above-mentioned repeating unit having a photo-alignment group, and a monomer forming any other repeating unit, and polymerizing the mixed monomers in an organic solvent using a radical polymerization initiator.

The weight-average molecular weight (Mw) of the photo-alignment polymer of the present invention is not particularly limited, and is preferably 25,000 or more, more preferably 25,000 to 500,000, still more preferably 25,000 to 300,000, and particularly preferably 30,000 to 150,000 from the viewpoint that the liquid crystal alignment properties of the optically anisotropic layer formed on the upper layer are more favorable.

Here, the weight-average molecular weights of the photo-alignment polymer and a surfactant which will be described later are values measured by gel permeation chromatography (GPC) under the following conditions.

Solvent (eluent): tetrahydrofuran (THF)
Device name: TOSOH HLC-8320GPC
Column: three TOSOH TSKgel Super HZM-H (4.6 mm×15 cm) connected in series
Column temperature: 40° C.
Sample concentration: 0.1% by mass
Flow rate: 1.0 ml/min
Calibration curve: calibration curve for 7 samples of TSK standard polystyrene, manufactured by Tosoh Corporation, Mw=2,800,000 to 1,050 (Mw/Mn=1.03 to 1.06)

(Substrate)

As will be described later, in a case of forming an optically anisotropic layer, it is preferable to form the optically anisotropic layer on a substrate.

The substrate is a plate that supports the optically anisotropic layer.

The substrate is preferably a transparent substrate. The transparent substrate is intended to refer to a substrate having a visible light transmittance of 60% or more, which preferably has a visible light transmittance of 80% or more and more preferably 90% or more.

The thickness direction retardation value (Rth(550)) of the substrate at a wavelength of 550 nm is not particularly limited, and is preferably −110 to 110 nm and more preferably −80 to 80 nm.

The in-plane retardation value (Re(550)) of the substrate at a wavelength of 550 nm is not particularly limited, and is preferably 0 to 50 nm, more preferably 0 to 30 nm, and still more preferably 0 to 10 nm.

A polymer having excellent optical performance transparency, mechanical strength, heat stability, moisture shielding property, isotropy, and the like is preferable as the material for forming the substrate.

Examples of the polymer film that can be used as the substrate include a cellulose acylate film (for example, a cellulose triacetate film (refractive index: 1.48), a cellulose diacetate film, a cellulose acetate butyrate film, or a cellulose acetate propionate film), a polyolefin film such as polyethylene or polypropylene, a polyester film such as polyethylene terephthalate or polyethylene naphthalate, a polyether sulfone film, a polyacrylic film such as polymethyl methacrylate, a polyurethane film, a polycarbonate film, a polysulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure, and more preferably triacetyl cellulose.

The substrate may contain various additives (for example, an optical anisotropy adjuster, a wavelength dispersion adjuster, a fine particle, a plasticizer, an ultraviolet inhibitor, a deterioration inhibitor, and a release agent).

The thickness of the substrate is not particularly limited, and is preferably 10 to 200 μm, more preferably 10 to 100 μm, and still more preferably 20 to 90 μm. In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

In addition, in order to impart slipperiness in a transport step and prevent a back surface and a front surface from sticking to each other after winding, a polymer layer in which inorganic particles having an average particle diameter of about 10 to 100 nm are mixed in a solid content mass ratio of 5% to 40% by mass may be disposed on one side of the substrate.

The substrate may be a so-called temporary support. That is, the substrate may be peeled off from the optically anisotropic layer after carrying out the production method of the present invention.

In addition, the surface of the substrate may be directly subjected to a rubbing treatment. That is, a substrate that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the substrate in a certain direction with paper, gauze, felt, rubber, nylon fiber, polyester fiber, or the like can be used.

An alignment film may be disposed on the substrate.

The alignment film can be formed by means such as rubbing treatment of an organic compound (preferably a polymer), oblique vapor deposition of an inorganic compound, formation of a layer having microgrooves, or accumulation of an organic compound (for example, w-tricosanoic acid, dioctadecylmethylammonium chloride, or methyl stearate) by the Langmuir-Blodgett method (LB film).

Further, there is also known an alignment film capable of expressing an alignment function by application of an electric field, application of a magnetic field, or irradiation with light (preferably polarized light).

The procedure for forming the optically anisotropic layer is not particularly limited. For example, a method of applying a polymerizable liquid crystal composition containing the above-mentioned liquid crystal compound having a polymerizable group onto a substrate, followed by a drying treatment if necessary (hereinafter, also simply referred to as "coating method"), and a method of separately forming an optically anisotropic layer and transferring the formed layer onto a substrate can be mentioned. Above all, the coating method is preferable from the viewpoint of productivity.

Hereinafter, the coating method will be described in detail.

The coating method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

The film thickness of the coating film is not particularly limited and is preferably 0.1 to 20 μm, more preferably 0.2 to 15 μm, and still more preferably 0.5 to 10 μm.

Next, the formed coating film is subjected to an alignment treatment to align a polymerizable liquid crystal compound in the coating film.

The alignment treatment can be carried out by drying the coating film at room temperature or by heating the coating film. In a case of a thermotropic liquid crystal compound, the liquid crystal phase formed by the alignment treatment can generally be transferred by a change in temperature or pressure. In a case of a lyotropic liquid crystal compound, the liquid crystal phase formed by the alignment treatment can also be transferred by a compositional ratio such as an amount of solvent.

The conditions in a case of heating the coating film are not particularly limited, and the heating temperature is preferably 50° C. to 250° C. and more preferably 50° C. to 150° C., and the heating time is preferably 10 seconds to 10 minutes.

In addition, after the coating film is heated, the coating film may be cooled, if necessary, before a curing treatment (light irradiation treatment) which will be described later. The cooling temperature is preferably 20° C. to 200° C. and more preferably 30° C. to 150° C.

Next, the coating film in which the polymerizable liquid crystal compound is aligned is subjected to a curing treatment.

The method of the curing treatment carried out on the coating film in which the polymerizable liquid crystal compound is aligned is not particularly limited, and examples thereof include a light irradiation treatment and a heat treatment. Above all, from the viewpoint of manufacturing suitability, a light irradiation treatment is preferable, and an ultraviolet irradiation treatment is more preferable.

The irradiation conditions of the light irradiation treatment are not particularly limited, and an irradiation amount of 50 to 1,000 mJ/cm$^2$ is preferable.

The atmosphere during the light irradiation treatment is not particularly limited and is preferably a nitrogen atmosphere.

In addition, in a case where the optically anisotropic layer (C) contains the above-mentioned photo-alignment polymer, from the viewpoint of imparting an alignment control ability, it is preferable to subject the surface of the optically anisotropic layer (C) in contact with the optically anisotropic layer (A) or the optically anisotropic layer (B) to a photo-alignment treatment, before coming into contact with the optically anisotropic layer (A) or the optically anisotropic layer (B).

Examples of the photo-alignment treatment include a method of irradiating a coating film (including a cured film subjected to a curing treatment) of a polymerizable liquid crystal composition with polarized light or irradiating the surface of the coating film with unpolarized light from an oblique direction.

In the photo-alignment treatment, the polarized light to be applied is not particularly limited, and examples thereof include linearly polarized light, circularly polarized light, and elliptically polarized light, among which linearly polarized light is preferable.

In addition, the "oblique direction" from which the unpolarized light is applied is not particularly limited as long as it is a direction tilted at a polar angle θ (0°<θ<90°) with respect to a normal direction of the surface of the coating film, and can be appropriately selected depending on the purpose. θ is preferably 20° to 80°.

The wavelength of the polarized light or the unpolarized light is not particularly limited as long as it is light to which the photo-alignment group is photosensitive, examples of which include an ultraviolet ray, a near ultraviolet ray, and a visible ray, among which a near ultraviolet ray having a wavelength of 250 to 450 nm is preferable.

In addition, examples of the light source for applying polarized light or unpolarized light include a xenon lamp, a high-pressure mercury lamp, an ultra-high pressure mercury lamp, and a metal halide lamp. It is possible to limit the wavelength range of light to be applied by using a dichroic filter, a color filter, or the like for the ultraviolet rays or visible rays obtained from such a light source. In addition, linearly polarized light can be obtained by using a polarizing filter or a polarizing prism for light from these light sources.

The integrated light amount of polarized light or unpolarized light is not particularly limited and is preferably 1 to 300 mJ/cm$^2$ and more preferably 5 to 100 mJ/cm$^2$.

The illuminance of polarized light or unpolarized light is not particularly limited and is preferably 0.1 to 300 mW/cm$^2$ and more preferably 1 to 100 mW/cm$^2$.

In addition, with regard to the optically anisotropic layer (C), in a case where the photo-alignment polymer contained in the polymerizable liquid crystal composition is the above-mentioned cleavable photo-alignment polymer, it is preferable to carry out a light irradiation treatment before carrying out the above-mentioned photo-alignment treatment, from the viewpoint of the progress of cleavage at the cleavage group and then the elimination of the group containing a fluorine atom or a silicon atom.

The light irradiation treatment may be any treatment by which a photoacid generator is photosensitized, and examples thereof include a method of irradiating with ultraviolet rays. A lamp that emits ultraviolet rays, such as a high-pressure mercury lamp or a metal halide lamp, can be used as the light source. In addition, the irradiation amount is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 to 1,000 mJ/cm$^2$.

The light irradiation treatment may be carried out after the above-mentioned curing treatment is carried out, or may be carried out at the same time as the above-mentioned curing treatment.

[Circularly Polarizing Plate]

The circularly polarizing plate according to the embodiment of the present invention is a circularly polarizing plate having the above-mentioned optical film according to the embodiment of the present invention and a polarizer, in which the polarizer is disposed adjacent to the optically anisotropic layer (A) of the optical film. In other words, the circularly polarizing plate according to the embodiment of the present invention is a circularly polarizing plate in which the optically anisotropic layer (A) is disposed closer to the polarizer than the optically anisotropic layer (B) and the optically anisotropic layer (C).

Figure 3:
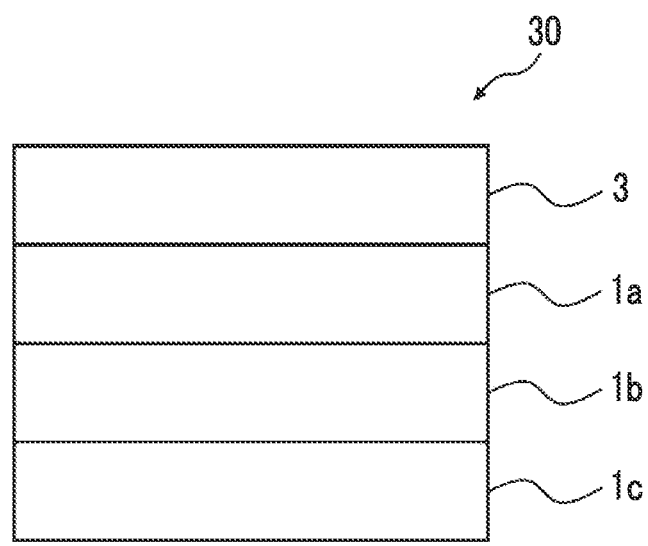
FIG. 3 is a schematic cross-sectional view showing an example of an embodiment of a circularly polarizing plate of the present invention.
Figure 4:
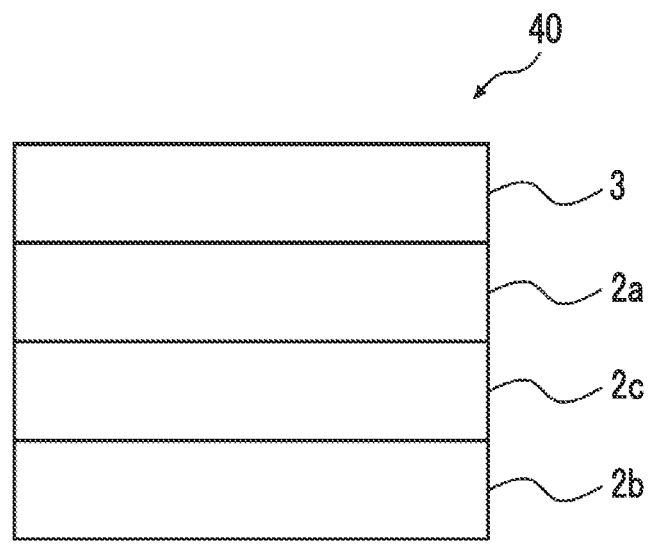
FIG. 4 is a schematic cross-sectional view showing an example of an embodiment of the circularly polarizing plate of the present invention.

A circularly polarizing plate 30 according to the embodiment of the present invention as an embodiment of the circularly polarizing plate includes a polarizer 3 and an optical film 10, as shown in FIG. 3. The polarizer 3 is disposed on the side of the optical film 10 opposite to an optically anisotropic layer 1c side. In a different embodiment, a circularly polarizing plate 40 according to the embodiment of the present invention includes a polarizer 3 and an optical film 20, as shown in FIG. 4. The polarizer 3 is disposed on the side of the optical film 20 opposite to an optically anisotropic layer 2b side.

It is preferable that the absorption axis of the polarizer is parallel to the longitudinal direction of the elongated optical film. That is, the angle formed by the absorption axis of the polarizer and the longitudinal direction of the elongated optical film is preferably 0° to 10°.

The angle formed by the in-plane slow axis of the optically anisotropic layer (A) and the absorption axis of the polarizer in the first embodiment is preferably 40° to 85°, more preferably 50° to 85°, and still more preferably 65° to 85°. The angle formed by the in-plane slow axis of the optically anisotropic layer (A) and the absorption axis of the polarizer in the second embodiment is preferably 5° to 50°, more preferably 5° to 40°, and still more preferably 5° to 25°.

As described above, the absorption axis of the polarizer is usually likely to be located in a longitudinal direction.

Therefore, in a case of bonding the polarizer and the elongated optical film so that the absorption axis of the polarizer is parallel to the longitudinal direction of the elongated optical film, a desired circularly polarizing plate can be prepared by continuously bonding the polarizer and the elongated optical film by roll-to-roll processing so as to be along the longitudinal directions of both.

The polarizer may be a member having a function of converting natural light into specific linearly polarized light, and examples thereof include an absorption type polarizer. The type of the polarizer is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be disposed on one side or both sides of the polarizer.

In addition, as described in WO2019/131943A and JP2017-83843A, a coating type polarizer prepared by using and applying a liquid crystal compound and a dichroic organic coloring agent (for example, a dichroic azo coloring agent used for a light-absorbing anisotropic film described in WO2017/195833A) without using a polyvinyl alcohol as a binder may be used as the polarizer. That is, the polarizer may be a polarizer formed of a composition containing a polymerizable liquid crystal compound.

This coating type polarizer is a technique for aligning a dichroic organic coloring agent by utilizing the alignment of a liquid crystal compound. As described in JP2012-83734A, in a case where the polymerizable liquid crystal compound exhibits smectic properties, it is preferable from the viewpoint of increasing the alignment degree. Alternatively, as described in WO2018/186503A, it is also preferable to crystallize the coloring agent from the viewpoint of increasing the alignment degree. WO2019/131943A describes a structure of a polymer liquid crystal that is preferable for increasing the alignment degree.

A polarizer in which a dichroic organic coloring agent is aligned by utilizing the aligning properties of a liquid crystal without stretching has the following characteristics. There are many advantages, such as being able to be made very thin with a thickness of about 0.1 µm to 5 µm; as described in JP2019-194685A, being difficult for cracks to occur in a case of being bent, and being less likely to undergo thermal deformation; and as described in Japanese Patent No. 6483486, exhibiting excellent durability even with a polarizing plate having a high transmittance of more than 50%.

Taking advantage of these advantages, it can be used for applications where high brightness and small size and light weight are required, applications of a fine optical system, applications of molding to a portion having a curved surface, and applications to a flexible portion. Of course, it is also possible to peel off the support and transfer the polarizer for use.

From the viewpoint of power saving, the transmittance of the polarizer is preferably 40% or more, more preferably 44% or more, and still more preferably 50% or more in terms of luminosity corrected single transmittance.

In the present invention, the luminosity corrected single transmittance of the polarizer is measured using an automatic polarizing film measuring device: VAP-7070 (manufactured by JASCO Corporation). The luminosity corrected single transmittance can be measured as follows. A sample (5 cm×5 cm) in which the polarizer is attached onto the glass through a pressure sensitive adhesive is prepared. At this time, a polarizing plate protective film is attached to the polarizer so as to be on the side opposite to the glass (air interface side). The glass side of the sample is set toward the light source for measurement.

The method for producing a circularly polarizing plate is not particularly limited, and a known method can be adopted.

For example, there is a method of bonding an optical film and a polarizer through an adhesion layer.

[Organic EL Display Device]

The organic EL display device according to the embodiment of the present invention has the above-mentioned optical film (or the above-mentioned circularly polarizing plate). Usually, the circularly polarizing plate is provided on an organic EL display panel of the organic EL display device. That is, the organic EL display device according to the embodiment of the present invention has an organic EL display panel and the above-mentioned circularly polarizing plate.

An example of the organic EL display device has an organic EL display panel, an optical film, and a polarizer in this order.

The organic EL display panel is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

[Use]

The above-mentioned optical film can be used as a polarizer (polarizing plate) for various articles having a curved surface. For example, the above-mentioned optical film can be used for a rollable display having a curved surface, an in-vehicle display, a lens of sunglasses, a lens of goggles for an image display apparatus, and the like. The optical film or the circularly polarizing plate according to the present embodiment can be bonded onto a curved surface or integrally molded with a resin, which contributes to an improvement in design.

The optical film or the circularly polarizing plate according to the present embodiment is also preferably used for the purpose of suppressing stray light in in-vehicle display optical systems such as head-up displays, optical systems such as augmented reality (AR) glasses, and virtual reality (VR) glasses, and optical sensors such as light detection and ranging (LiDAR), face recognition system, and polarization imaging.

EXAMPLES

Hereinafter, features of the present invention will be described in more detail with reference to Examples and Comparative Examples. The materials, amounts used, proportions, treatment details, and treatment procedure shown in the following Examples can be appropriately changed without departing from the spirit and scope of the present invention. Therefore, the scope of the present invention should not be construed as being limited by the specific examples given below.

Example 1

<Preparation of Cellulose Acylate Film (Substrate)>

The following composition was put into a mixing tank, stirred, and further heated at 90° C. for 10 minutes. Then, the obtained composition was filtered through a filter paper having an average pore diameter of 34 μm and a sintered metal filter having an average pore diameter of 10 μm to prepare a dope. The concentration of solid contents of the dope is 23.5% by mass, the amount of the plasticizer added is a proportion relative to cellulose acylate, and the solvent of the dope is methylene chloride/methanol/butanol=81/18/1 (in terms of a mass ratio).

| Cellulose acylate dope | |
|---|---|
| Cellulose acylate (acetyl substitution degree: 2.86, viscosity average polymerization degree: 310) | 100 parts by mass |
| Sugar ester compound 1 (represented by Formula (S4)) | 6.0 parts by mass |
| Sugar ester compound 2 (represented by Formula (S5)) | 2.0 parts by mass |
| Silica particle dispersion (AEROSIL R972, manufactured by Nippon Aerosil Co., Ltd.) | 0.1 parts by mass |
| Solvent (methylene chloride/methanol/butanol) | |

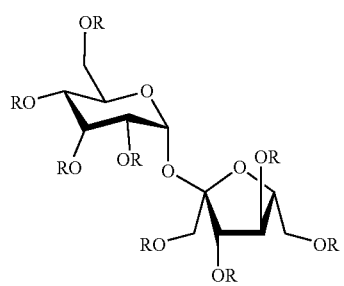

$$\begin{pmatrix} R = \text{benzoyl or H} \\ \text{Average substitution degree: 5.7} \end{pmatrix}$$

(S4)

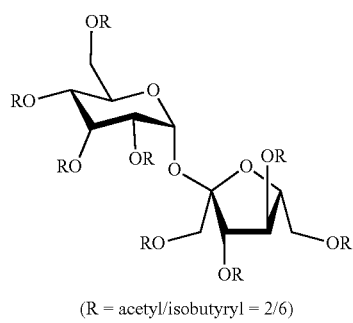

(R = acetyl/isobutyryl = 2/6)

(S5)

The dope prepared above was cast using a drum film forming machine. The dope was cast from a die such that it was in contact with a metal support cooled to 0° C., and then the obtained web (film) was stripped off. The drum was made of SUS.

The web (film) obtained by casting was peeled off from the drum and then dried in a tenter device for 20 minutes at 30° C. to 40° C. during film transport, using the tenter device that clips both ends of the web with clips to transport the film. Subsequently, the web was post-dried by zone heating while being rolled and transported. The obtained web was knurled and then wound up.

The obtained cellulose acylate film had a film thickness of 40 an in-plane retardation Re(550) of 1 nm at a wavelength of 550 nm, and a thickness direction retardation Rth(550) of 26 nm at a wavelength of 550 nm.

(Alkali Saponification Treatment)

After passing the above-mentioned cellulose acylate film through a dielectric heating roll at a temperature of 60° C. to raise the film surface temperature to 40° C., an alkaline solution having the composition shown below was applied onto a band surface of the film using a bar coater at a coating amount of 14 ml/m$^2$, followed by heating to 110° C., and transportation under a steam type far-infrared heater manufactured by Noritake Co., Limited for 10 seconds. Subsequently, pure water was applied at 3 ml/m$^2$ using the same bar coater. Then, after repeating washing with water with a fountain coater and draining with an air knife three times, the film was transported to a drying zone at 70° C. for 10 seconds and dried to prepare a cellulose acylate film subjected to an alkali saponification treatment.

| Alkaline solution | |
|---|---|
| Potassium hydroxide | 4.7 parts by mass |
| Water | 15.8 parts by mass |
| Isopropanol | 63.7 parts by mass |
| Surfactant: $C_{14}H_{29}O(CH_2CH_2O)_{20}H$ | 1.0 parts by mass |
| Propylene glycol | 14.8 parts by mass |

<Formation of Alignment Film>

An alignment film coating liquid having the following composition was continuously applied onto the surface of the cellulose acylate film that had been subjected to the alkali saponification treatment with a #14 wire bar. The film was dried with hot air at 60° C. for 60 seconds and further with hot air at 100° C. for 120 seconds.

| Alignment film coating liquid | |
|---|---|
| Polyvinyl alcohol given below | 10 parts by mass |
| Water | 371 parts by mass |
| Methanol | 119 parts by mass |
| Glutaraldehyde (crosslinking agent) | 0.5 parts by mass |
| Citric acid ester (manufactured by Sankyo Chemical Co., Ltd.) | 0.175 parts by mass |

Polyvinyl alcohol

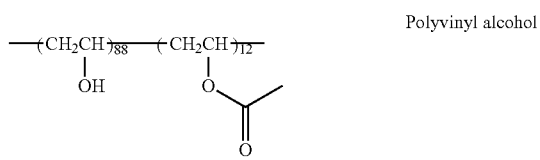

<Formation of Optically Anisotropic Layer (A)>

The above prepared alignment film was continuously subjected to a rubbing treatment. At this time, the longitudinal direction and the transport direction of the elongated film were parallel, and the angle between the film longitudinal direction (transport direction) and the rubbing roller rotation axis was 76°. In a case where the film longitudinal direction (transport direction) is 90° and the clockwise direction is represented by a positive value with reference to a film width direction as a reference (0°) in a case of being observed from the film side, the rotation axis of the rubbing roller is at −14°. In other words, the position of the rotation axis of the rubbing roller is a position rotated by 76° clockwise with reference to the longitudinal direction of the film.

An optically anisotropic layer coating liquid (1a) containing a disk-like liquid crystal compound having the following composition was applied onto the rubbing-treated alignment

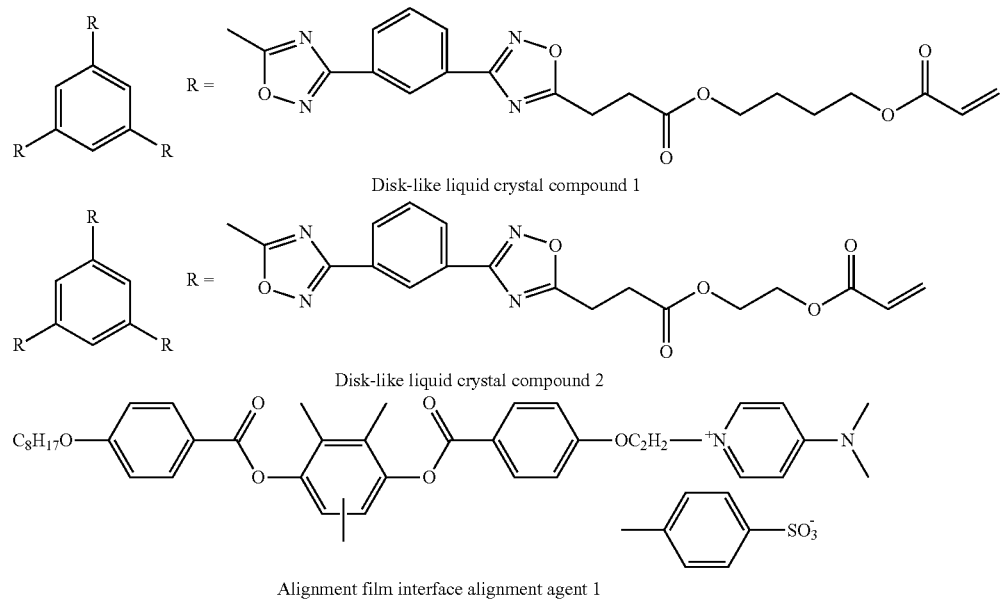

Disk-like liquid crystal compound 1

Disk-like liquid crystal compound 2

Alignment film interface alignment agent 1 film using a geeser coating machine to form a composition layer. Then, the obtained composition layer was heated with hot air at 110° C. for 2 minutes for drying of the solvent and alignment aging of the disk-like liquid crystal compound. Subsequently, the obtained composition layer was irradiated with UV (500 mJ/cm$^2$) at 80° C. to immobilize the alignment of the liquid crystal compound to form an optically anisotropic layer (1a) corresponding to the optically anisotropic layer (A).

The optically anisotropic layer (1a) had a thickness of 1.1 μm. In addition, the optically anisotropic layer (1a) had a retardation of 168 nm at a wavelength of 550 nm. It was confirmed that the average tilt angle of the disc plane of the disk-like liquid crystal compound with respect to the film surface was 90°, and the disk-like liquid crystal compound was aligned vertically to the film surface. In addition, assuming that the angle of the slow axis of the optically anisotropic layer (1a) is parallel to the rotation axis of the rubbing roller, and the width direction of the film is defined as 0° (the counterclockwise direction is defined as 90° and the clockwise direction is defined as −90° in a longitudinal direction), the slow axis was −14° in a case of being viewed from the optically anisotropic layer (1a) side.

| Composition (1a) for forming optically anisotropic layer | |
|---|---|
| Disk-like liquid crystal compound 1 given below | 80 parts by mass |
| Disk-like liquid crystal compound 2 given below | 20 parts by mass |
| Alignment film interface alignment agent 1 given below | 0.55 parts by mass |
| Fluorine-containing compound A given below | 0.1 parts by mass |
| Fluorine-containing compound B given below | 0.05 parts by mass |
| Fluorine-containing compound C given below | 0.21 parts by mass |

| -continued | |
|---|---|
| Composition (1a) for forming optically anisotropic layer | |
| Ethylene oxide-modified trimethylolpropane triacrylate (V# 360, manufactured by Osaka Organic Chemical Industry Ltd.) | 10 parts by mass |
| Photopolymerization initiator (IRGACURE 907, manufactured by BASF SE) | 3.0 parts by mass |
| Methyl ethyl ketone | 200 parts by mass |

Fluorine-containing compound A (in the following formula, a and b represent the content (% by mass) of each repeating unit with respect to all the repeating units, a represents 90% by mass, and b represents 10% by mass)

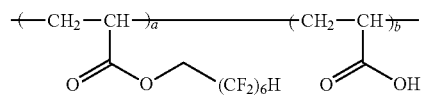

Fluorine-containing compound B (The numerical value in each repeating unit represents the content (% by mass) with respect to all the repeating units, the content of the repeating unit on the left side was 32.5% by mass, and the content of the repeating unit on the right side was 67.5% by mass.)

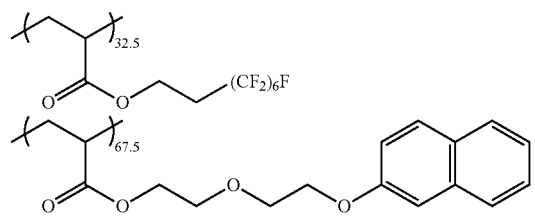

Fluorine-containing compound C (The numerical value in each repeating unit represents the content (% by mass) with respect to all the repeating units, the content of the repeating unit on the left side was 25% by mass, the content of the repeating unit in the middle was 25% by mass, and the content of the repeating unit on the right side was 50% by mass)

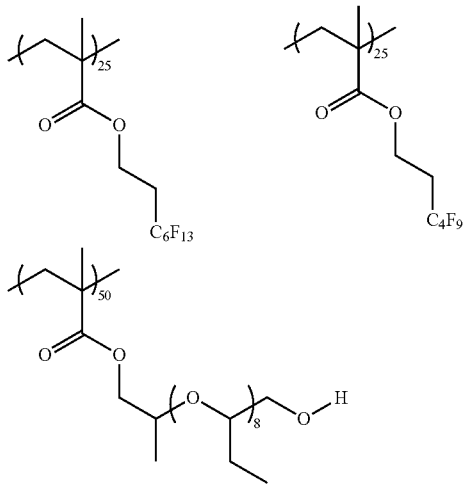

<Formation of Laminate of Optically Anisotropic Layer (C) and Optically Anisotropic Layer (B)>

(Formation of Optically Anisotropic Layer (1c))

An optically anisotropic layer coating liquid (1c) containing a rod-like liquid crystal compound having the following composition was applied onto the above prepared cellulose acylate film using a geeser coating machine to form a composition layer. After that, both ends of the film were held, a cooling plate (9° C.) was installed on the side of the surface on which the coating film of the film was formed so that the distance from the film was 5 mm, and a heater (75° C.) was installed on the side opposite to the surface on which the coating film of the film was formed so that the distance from the film was 5 mm, followed by drying for 2 minutes.

Next, the film was heated with hot air at 60° C. for 1 minute, and irradiated with ultraviolet rays at an irradiation amount of 100 mJ/cm$^2$ using a 365 nm UV-LED while purging with nitrogen so as to have an atmosphere having an oxygen concentration of 100 ppm or less. This was followed by annealing with hot air at 120° C. for 1 minute to form a precursor layer.

The obtained precursor layer was irradiated with UV light (ultra-high pressure mercury lamp; UL750, manufactured by HOYA Corporation) passing through a wire grid polarizer at room temperature at an irradiation amount of 7.9 mJ/cm$^2$ (wavelength: 313 nm) to form a composition layer having an alignment control ability on the surface thereof.

The formed composition layer had a film thickness of 0.5 µm. The formed composition layer had an in-plane retardation Re of 0 nm at a wavelength of 550 nm and a thickness direction retardation Rth of −68 nm at a wavelength of 550 nm. It was confirmed that the average tilt angle of the major axis direction of the rod-like liquid crystal compound with respect to the film surface was 90° and the rod-like liquid crystal compound was aligned vertically to the film surface.

In this manner, an optically anisotropic layer (1c) corresponding to the optically anisotropic layer (C) was formed.

| Composition (1c) for forming optically anisotropic layer | |
|---|---|
| Rod-like liquid crystal compound (A) given below | 100 parts by mass |
| Polymerizable monomer (A-400, manufactured by Shin-Nakamura Chemical Co., Ltd.) | 4.0 parts by mass |
| Polymerization initiator S-1 (oxime type) given below | 5.0 parts by mass |
| Photoacid generator D-1 given below | 3.0 parts by mass |
| Polymer M-1 given below | 2.0 parts by mass |
| Vertical alignment agent S01 given below | 2.0 parts by mass |
| Photo-alignment polymer A-1 given below | 2.0 parts by mass |
| Surfactant B-1 given below | 0.2 parts by mass |
| Methyl ethyl ketone | 42.3 parts by mass |
| Methyl isobutyl ketone | 627.5 parts by mass |

Rod-like liquid crystal compound (A) (hereinafter, a mixture of compounds)

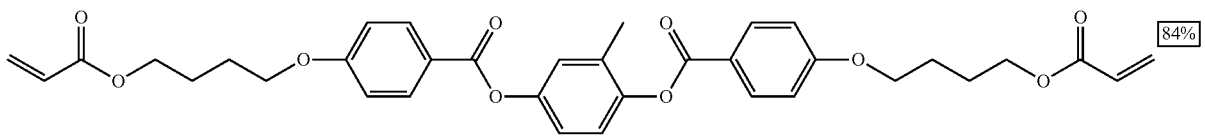

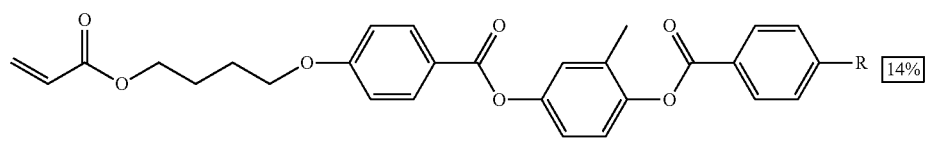

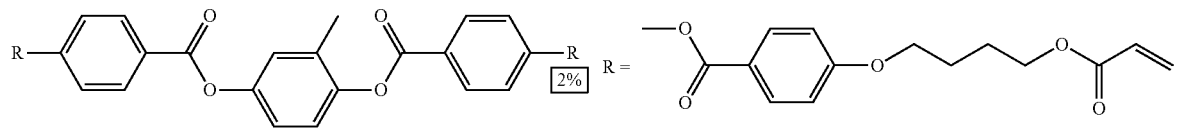

-continued

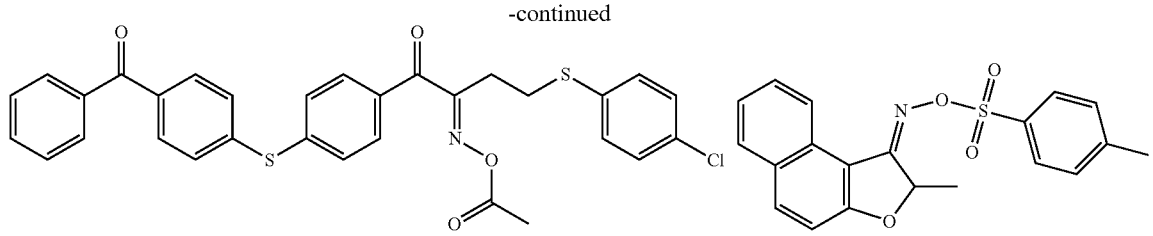
Polymerization initiator S-1

Photoacid generator D-1

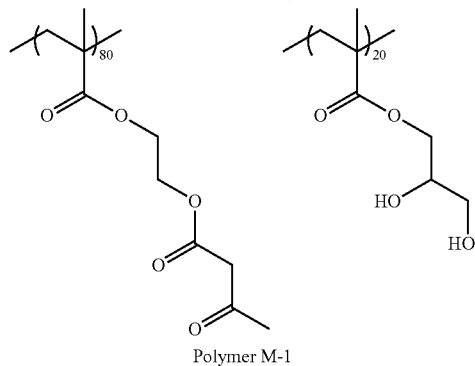
Polymer M-1

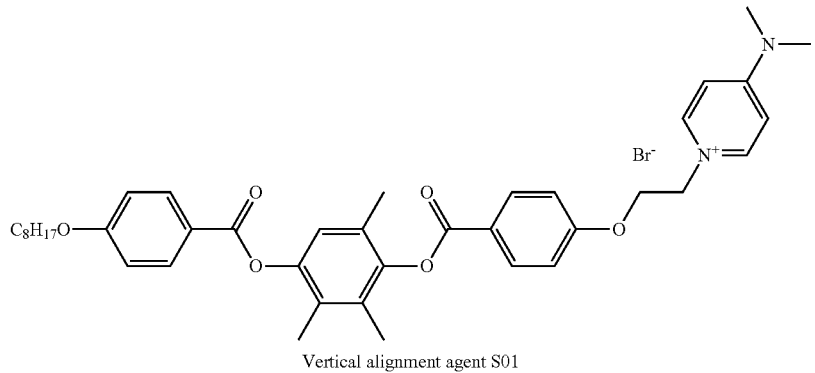
Vertical alignment agent S01

Photo-alignment polymer A-1 (The numerical value described in each repeating unit represents the content (% by mass) of each repeating unit with respect to all the repeating units, which was 43% by mass, 27% by mass, and 30% by mass from the left repeating unit. In addition, the weight-average molecular weight was 69,800.)

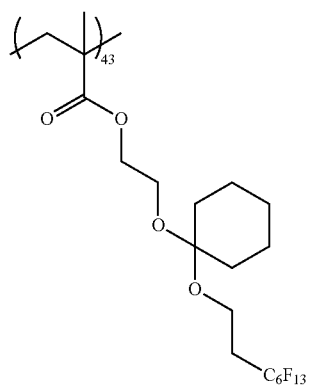

-continued

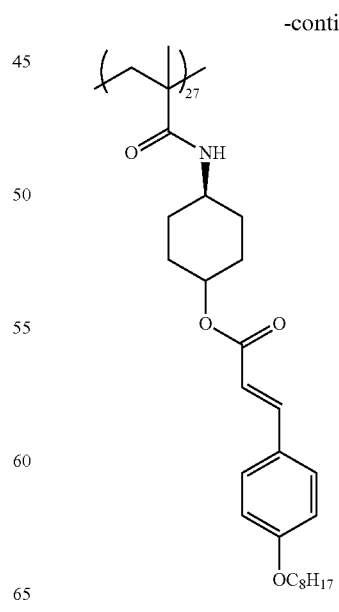

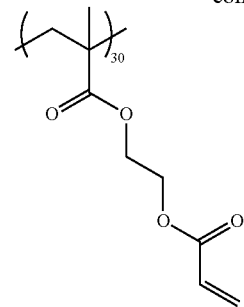

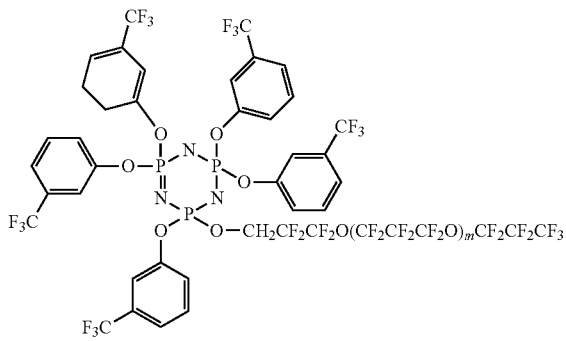

Surfactant B-1 (weight-average molecular weight: 2,200)

(Formation of Optically Anisotropic Layer (1b))

Next, an optically anisotropic layer coating liquid (1b) containing a rod-like liquid crystal compound having the following composition was applied onto the above prepared optically anisotropic layer (1c) using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (1b) corresponding to the optically anisotropic layer (B).

The optically anisotropic layer (1b) had a thickness of 1.2 μm, Δnd of 164 nm at a wavelength of 550 nm, and a twisted angle of the liquid crystal compound of 81°. Assuming that the width direction of the film is defined as 0° (the longitudinal direction of the film is defined as 90°), the alignment axial angle of the liquid crystal compound was 14° on the air side and 95° on the side in contact with the optically anisotropic layer (1c), in a case of being viewed from the optically anisotropic layer (1b) side.

The alignment axial angle of the liquid crystal compound contained in the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

In addition, the twisted angle of the liquid crystal compound is expressed as negative in a case where the alignment axis direction of the liquid crystal compound on the substrate side (back side) is clockwise (right-handed turning) and positive in a case where it is counterclockwise (left-handed turning) with reference to the alignment axis direction of the liquid crystal compound on the surface side (front side), upon observing the substrate from the surface side of the optically anisotropic layer.

| Composition (1b) for forming optically anisotropic layer | |
|---|---|
| Rod-like liquid crystal compound (A) given above | 100 parts by mass |
| Ethylene oxide-modified trimethylolpropane triacrylate (V# 360, manufactured by Osaka Organic Chemical Industry Ltd.) | 4 parts by mass |
| Photopolymerization initiator (IRGACURE 819, manufactured by BASF SE) | 3 parts by mass |
| Left-handed twisting chiral agent (L1) given below | 0.60 parts by mass |
| Fluorine-containing compound C given above | 0.08 parts by mass |
| Methyl ethyl ketone | 156 parts by mass |

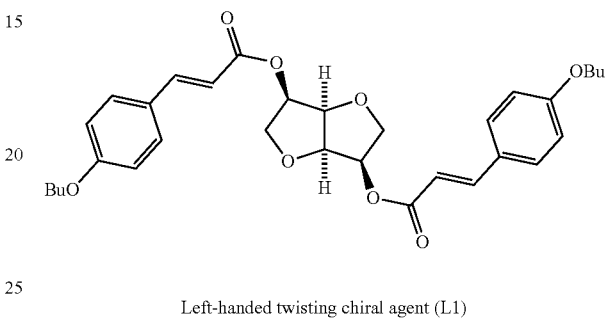

Left-handed twisting chiral agent (L1)

A laminate (1c-1b) in which the optically anisotropic layer (1c) and the optically anisotropic layer (1b) were directly laminated on an elongated cellulose acylate film was prepared by the above procedure. It was confirmed that the photo-alignment polymer was present in a case where the surface of the optically anisotropic layer (1c) on the side in contact with the optically anisotropic layer (1b) was examined by the above-mentioned method.

<Formation of Laminate of Optically Anisotropic Layer (A), Optically Anisotropic Layer (B), and Optically Anisotropic Layer (C)>

The surface side of the optically anisotropic layer (1a) formed on the above prepared elongated cellulose acylate film, and the surface side of the optically anisotropic layer (1b) of the laminate (1c-1b) formed on the above prepared elongated cellulose acylate film were continuously bonded using an ultraviolet curable adhesive.

Subsequently, the cellulose acylate film on the optically anisotropic layer (1a) side was peeled off to expose the surface of the optically anisotropic layer (1a) in contact with the cellulose acylate film. In this manner, an optical film (1c-1b-1a) in which the optically anisotropic layer (1c), the optically anisotropic layer (1b), and the optically anisotropic layer (1a) were laminated in this order on an elongated cellulose acylate film was obtained.

<Preparation of Linearly Polarizing Plate>

The surface of a support of a cellulose triacetate film TJ25 (manufactured by Fujifilm Corporation, thickness: 25 μm) was subjected to an alkali saponification treatment. Specifically, the support was immersed in a 1.5 N sodium hydroxide aqueous solution at 55° C. for 2 minutes, washed in a water bath at room temperature, and further neutralized with 0.1 N sulfuric acid at 30° C. After neutralization, the support was washed in a water bath at room temperature and further dried with hot air at 100° C. to obtain a polarizer protective film.

A roll-like polyvinyl alcohol (PVA) film having a thickness of 60 μm was continuously stretched in an aqueous iodine solution in a longitudinal direction and dried to obtain a polarizer having a thickness of 13 μm. The luminosity corrected single transmittance of the polarizer was 43%. At this time, the absorption axis direction and the longitudinal direction of the polarizer were the same.

The polarizer protective film was bonded to one surface of the polarizer using the following PVA adhesive to prepare a linearly polarizing plate 1.

(Preparation of PVA Adhesive)

100 parts by mass of a polyvinyl alcohol-based resin having an acetoacetyl group (average degree of polymerization: 1200, degree of saponification: 98.5 mol %, degree of acetoacetylation: 5 mol %) and 20 parts by mass of methylol melamine were dissolved in pure water under a temperature condition of 30° C. to prepare a PVA adhesive as an aqueous solution adjusted to a concentration of solid contents of 3.7% by mass.

<Preparation of Circularly Polarizing Plate>

The surface of the optically anisotropic layer (1a) of the above prepared elongated optical film (1c-1b-1a) and the surface of the polarizer of the above prepared elongated linearly polarizing plate (the surface opposite to the polarizer protective film) were continuously bonded to each other using an ultraviolet curable adhesive. Subsequently, the cellulose acylate film on the optically anisotropic layer (1c) side was peeled off to expose the surface of the optically anisotropic layer (1c) in contact with the cellulose acylate film.

In this manner, a circularly polarizing plate (P1) consisting of the optical film (1c-1b-1a) and a linearly polarizing plate was prepared. At this time, the polarizer protective film, the polarizer, the optically anisotropic layer (1a), the optically anisotropic layer (1b), and the optically anisotropic layer (1c) were laminated in this order, and the angle formed by the absorption axis of the polarizer and the slow axis of the optically anisotropic layer (1a) was 76°. In addition, the alignment axial angle of the liquid crystal compound on the optically anisotropic layer (1a) side of the optically anisotropic layer (1b) was 14° with the width direction as a reference of 0°, which coincided with the slow axis direction of the optically anisotropic layer (1a).

Example 2

<Formation of Alignment Film>

The photo-alignment film forming material described in Example 1 of WO2016/002722A was applied onto the above prepared elongated cellulose acylate film. Then, the coating film was cured by heating to 125° C. with hot air. This was followed by irradiation with polarized ultraviolet rays of 313 nm.

<Formation of Optically Anisotropic Layer (B)>

The optically anisotropic layer coating liquid (1b) containing a rod-like liquid crystal compound having the foregoing composition was applied onto the above prepared photo-alignment film using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (2b) corresponding to the optically anisotropic layer (B).

The optically anisotropic layer (2b) had a thickness of 1.2 μm, Δnd of 164 nm at a wavelength of 550 nm, and a twisted angle of the liquid crystal compound of 81°. Assuming that the width direction of the film is defined as 0° (the longitudinal direction of the film is defined as 90°), the alignment axial angle of the liquid crystal compound was −76° on the air side and 5° on the side in contact with the cellulose acylate film, in a case of being viewed from the optically anisotropic layer (2b) side.

The alignment axial angle of the liquid crystal compound contained in the optically anisotropic layer is expressed as negative in a case where it is clockwise (right-handed turning) and positive in a case where it is counterclockwise (left-handed turning) with the width direction of the substrate as a reference of 0°, upon observing the substrate from the surface side of the optically anisotropic layer.

In addition, the twisted angle of the liquid crystal compound is expressed as negative in a case where the alignment axis direction of the liquid crystal compound on the substrate side (back side) is clockwise (right-handed turning) and positive in a case where it is counterclockwise (left-handed turning) with reference to the alignment axis direction of the liquid crystal compound on the surface side (front side), upon observing the substrate from the surface side of the optically anisotropic layer.

<Formation of Laminate of Optically Anisotropic Layer (C) and Optically Anisotropic Layer (A)>

(Formation of Optically Anisotropic Layer (2c))

A composition layer having an alignment control ability on the surface thereof was formed in the same manner as in the formation of the optically anisotropic layer (1c) of Example 1, except that the thickness of the composition layer was changed.

The formed composition layer had a film thickness of 0.7 μm. The formed composition layer had an in-plane retardation Re of 0 nm at a wavelength of 550 nm and a thickness direction retardation Rth of −96 nm at a wavelength of 550 nm. It was confirmed that the average tilt angle of the major axis direction of the rod-like liquid crystal compound with respect to the film surface was 90° and the rod-like liquid crystal compound was aligned vertically to the film surface.

In this manner, an optically anisotropic layer (2c) corresponding to the optically anisotropic layer (C) was formed.

(Formation of Optically Anisotropic Layer (2a))

Next, an optically anisotropic layer coating liquid (2a) containing a rod-like liquid crystal compound having the following composition was applied onto the above prepared optically anisotropic layer (2c) using a geeser coating machine, and heated with hot air at 80° C. for 60 seconds. Subsequently, the obtained composition layer was irradiated with UV (500 mJ/cm$^2$) at 80° C. to immobilize the alignment of the liquid crystal compound to form an optically anisotropic layer (2a) corresponding to the optically anisotropic layer (A).

The optically anisotropic layer (2a) had a thickness of 1.2 μm. In addition, the optically anisotropic layer (2a) had a retardation of 168 nm at a wavelength of 550 nm. It was confirmed that the average tilt angle of the major axis direction of the rod-like liquid crystal compound with respect to the film surface was 0° and the rod-like liquid crystal compound was aligned horizontally with respect to the film surface. In addition, assuming that the width direction of the film is defined as 0° (the longitudinal direction of the film is defined as 90°), the slow axis was −76° in a case of being viewed from the optically anisotropic layer (2a) side.

| Composition (2a) for forming optically anisotropic layer | |
|---|---|
| Rod-like liquid crystal compound (A) given above | 100 parts by mass |
| Ethylene oxide-modified trimethylolpropane triacrylate (V# 360, manufactured by Osaka | 4 parts by mass |

-continued

| Composition (2a) for forming optically anisotropic layer | |
|---|---|
| Organic Chemical Industry Ltd.) | |
| Photopolymerization initiator (IRGACURE 819, manufactured by BASF SE) | 3 parts by mass |
| Fluorine-containing compound C given above | 0.08 parts by mass |
| Methyl ethyl ketone | 156 parts by mass |

A laminate (2c-2a) in which the optically anisotropic layer (2c) and the optically anisotropic layer (2a) were directly laminated on an elongated cellulose acylate film was prepared by the above procedure. It was confirmed that the photo-alignment polymer was present in a case where the surface of the optically anisotropic layer (2c) on the side in contact with the optically anisotropic layer (2a) was examined by the above-mentioned method.

<Formation of Laminate of Optically Anisotropic Layer (A), Optically Anisotropic Layer (C), and Optically Anisotropic Layer (B), and Preparation of Circularly Polarizing Plate>

The surface of the optically anisotropic layer (2a) of the laminate (2c-2a) formed on the above prepared elongated cellulose acylate film, and the surface of the polarizer of the above prepared elongated linearly polarizing plate (the surface opposite to the polarizer protective film) were continuously bonded to each other using an ultraviolet curable adhesive. Subsequently, the cellulose acylate film on the optically anisotropic layer (2c) side was peeled off to expose the surface of the optically anisotropic layer (2c) in contact with the cellulose acylate film.

The exposed surface of the optically anisotropic layer (2c) and the surface side of the optically anisotropic layer (2b) formed on the above prepared elongated cellulose acylate film were continuously bonded to each other using an ultraviolet curable adhesive. Subsequently, the cellulose acylate film on the optically anisotropic layer (2b) side was peeled off to expose the surface of the optically anisotropic layer (2b) in contact with the cellulose acylate film.

In this manner, a circularly polarizing plate (P2) consisting of the optical film (2b-2c-2a) and a linearly polarizing plate was prepared. At this time, the polarizer protective film, the polarizer, the optically anisotropic layer (2a), the optically anisotropic layer (2c), and the optically anisotropic layer (2b) were laminated in this order, and the angle formed by the absorption axis of the polarizer and the slow axis of the optically anisotropic layer (2a) was 14°. In addition, the alignment axial angle of the liquid crystal compound on the optically anisotropic layer (2c) side of the optically anisotropic layer (2b) was −76° with the width direction as a reference of 0°, which coincided with the slow axis direction of the optically anisotropic layer (2a).

Comparative Example 1

An optical film in which an optically anisotropic layer (ha) consisting of vertically aligned disk-like liquid crystal compound and an optically anisotropic layer (hb) consisting of twist-aligned disk-like liquid compound were directly laminated in this order on an elongated cellulose acylate film was prepared in the same manner as in the method described in Example 1 of JP5960743B.

At this time, the retardation of the optically anisotropic layer (ha) at a wavelength of 550 nm was 181 nm, and assuming that the width direction of the film is defined as 0° (the longitudinal direction of the film is defined as 90°), the slow axis was −13° in a case of being viewed from the optically anisotropic layer (ha) side. In addition, And of the optically anisotropic layer (hb) at a wavelength of 550 nm was 172 nm, the twisted angle of the liquid crystal compound was 81°, and assuming that the width direction of the film is defined as 0° (the longitudinal direction of the film is defined as 90°), the alignment axial angle of the liquid crystal compound was −94° on the air side and −13° on the side in contact with the cellulose acylate film, in a case of being viewed from the optically anisotropic layer (hb) side.

The surface of the cellulose acylate film of the laminate (ha-hb) formed on the above prepared elongated cellulose acylate film, and the surface of the polarizer of the above prepared elongated linearly polarizing plate (the surface opposite to the polarizer protective film) were continuously bonded to each other using an ultraviolet curable adhesive. In this manner, a circularly polarizing plate (PH) was prepared.

(Evaluation of Durability)

In the preparation of the circularly polarizing plate described above, a glass plate and an optically anisotropic layer cut into a 40 mm square were bonded to each other using a pressure sensitive adhesive, instead of bonding a linearly polarizing plate and an optically anisotropic layer to each other using an ultraviolet curable adhesive. That is, the optical film (1c-1b-1a) or the optical film (2b-2c-2a) was formed on the glass plate. At this time, the optically anisotropic layer (1a) or the optically anisotropic layer (2a) was on the glass plate side. The optical film with a glass plate was exposed to ammonia for 60 minutes by placing it on a screw cap bottle containing a 2 mol %/L methanol solution of ammonia. At this time, the optical film with a glass plate was placed so that the exposed surface was the optically anisotropic layer (1c) or the optically anisotropic layer (2b).

In-plane retardations Re(450), Re(550), and Re(650) at wavelengths of 450 nm, 550 nm, and 650 nm were measured using Axoscan from Axometrics, Inc.

In a case where H=Re(450)/Re(550), the evaluation was carried out as follows using $\Delta H$ (%)=|H1−H0|/H0×100 as an indicator, assuming that H before the exposure to ammonia is defined as H0, and H after the exposure to ammonia is defined as H1. The results are shown in Table 1.

A: $\Delta H$ is less than 1%
B: $\Delta H$ is 1% or more and less than 2%
C: $\Delta H$ is 2% or more <Preparation of Organic EL Display Device>
(Mounting on Display Device)

The GALAXY S4 (manufactured by Samsung Electronics Co., Ltd.) equipped with an organic EL panel was disassembled, a circularly polarizing plate was peeled off, and the above prepared circularly polarizing plate was bonded to the display device using a pressure sensitive adhesive such that the polarizer protective film was disposed outside.

[Evaluation of Display Performance]
(Front Direction)

The prepared organic EL display device was brought into a black display state and observed from the front direction under bright light, and the tinting was evaluated according to the following standards. The results are shown in Table 1 which will be described later.

A: The tinting is not visible at all, or the tinting is visible, but only a little (acceptable).
B: The tinting is visible, but the reflected light is small and there is no problem in use (acceptable).
C: The tinting is visible and there is a lot of reflected light, which is unacceptable.

(Oblique Direction)

The prepared organic EL display device was brought into a black display state, a fluorescent lamp was projected from a polar angle of 45° under bright light, and the reflected light was observed from all directions. The azimuthal angle dependence of the tint change was evaluated according to the following standards. The results are shown in Table 1 which will be described later.
A: The tint difference is not visible at all, or the tint difference is visible, but it is very slight (acceptable).
B: The tint difference is visible, but the reflected light is small and there is no problem in use (acceptable).
C: The tint difference is visible and there is a lot of reflected light, which is unacceptable.

TABLE 1

|  | Laminate of optically anisotropic layers | Type of liquid crystal compound | Alignment state of liquid crystal | Evaluation of display performance | | Evaluation of durability |
| --- | --- | --- | --- | --- | --- | --- |
|  |  |  |  | Front direction | Oblique direction |  |
| Example 1 | A(1a) | Disk-like | Vertical | A | A | A |
|  | B(1b) | Rod-like | Twisted |  |  |  |
|  | C(1c) | Rod-like | Vertical |  |  |  |
| Example 2 | A(2a) | Rod-like | Horizontal | A | B | A |
|  | C(2c) | Rod-like | Vertical |  |  |  |
|  | B(2b) | Rod-like | Twisted |  |  |  |
| Comparative Example 1 | A(ha) | Disk-like | Vertical | A | C | A |
|  | B(hb) | Disk-like | Twisted |  |  |  |

From the results shown in Table 1 above, it was confirmed that the optical film according to the embodiment of the present invention was capable of suppressing the black tinting in a front direction and an oblique direction in a case where the optical film was used as a circularly polarizing plate in an organic EL display device. On the other hand, the optical film of Comparative Example was inferior in suppression of the black tinting in an oblique direction in a case where the optical film was used as a circularly polarizing plate in an organic EL display device.

Example 3

An optical film (1c-1b-1a) in which the optically anisotropic layer (1c), the optically anisotropic layer (1b), and the optically anisotropic layer (1a) were laminated in this order on an elongated cellulose acylate film was obtained in the same manner as in Example 1.

Next, a polarizing plate SHC-215U (manufactured by Polatechno Co., Ltd.), in which a polyvinyl alcohol film was dyed with a dichroic organic coloring agent, was prepared as a linearly polarizing plate 2. The luminosity corrected single transmittance of the polarizer was 44%.

The surface of the optically anisotropic layer (1a) of the elongated optical film (1c-1b-1a) and the surface of the elongated linearly polarizing plate 2 to which one surface is subjected to a corona treatment were continuously bonded to each other using an ultraviolet curable adhesive. Subsequently, the cellulose acylate film of the optically anisotropic layer (1c) was peeled off to expose the surface of the optically anisotropic layer (1c) in contact with the cellulose acylate film. In this manner, a circularly polarizing plate (P3) was prepared.

Example 4

An optical film (1c-1b-1a) in which the optically anisotropic layer (1c), the optically anisotropic layer (1b), and the optically anisotropic layer (1a) were laminated in this order on an elongated cellulose acylate film was obtained in the same manner as in Example 1.

Next, a polarizer formed of a dichroic organic coloring agent and a polymerizable liquid crystal was prepared as a polarizing film 4B by the following procedure.

A coating liquid PA1 for forming an alignment layer, which will be described later, was continuously applied onto a cellulose triacetate film TJ40 (manufactured by Fujifilm Corporation, thickness: 40 μm) with a wire bar. The support on which the coating film was formed was dried with hot air at 140° C. for 120 seconds, and then the coating film was irradiated with polarized ultraviolet rays (10 mJ/cm$^2$, using an ultra-high pressure mercury lamp) to form a photo-alignment layer PA1 to obtain a TAC film with the photo-alignment layer PA1.

The film thickness of the photo-alignment layer PA1 was 0.3 μm.

| Coating liquid PA1 for forming alignment layer | |
| --- | --- |
| Polymer PA-1 shown below | 100.00 parts by mass |
| Acid generator PAG-1 shown below | 5.00 parts by mass |
| Acid generator CPI-110TF shown below | 0.005 parts by mass |
| Xylene | 1220.00 parts by mass |
| Methyl isobutyl ketone | 122.00 parts by mass |

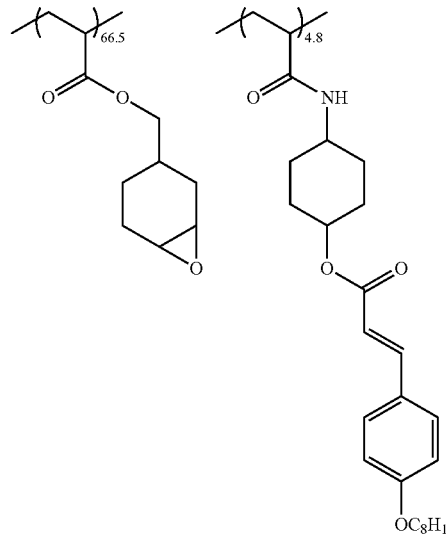

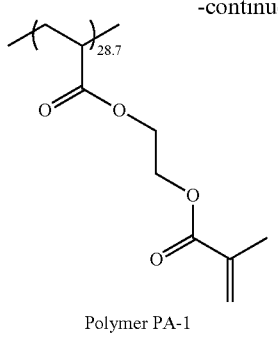

Polymer PA-1

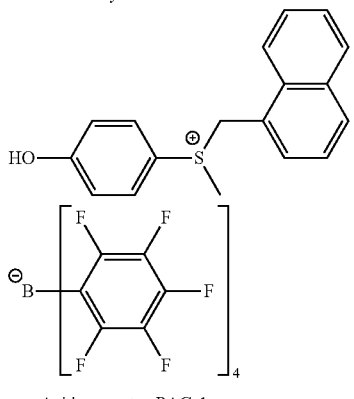

Acid generator PAG-1

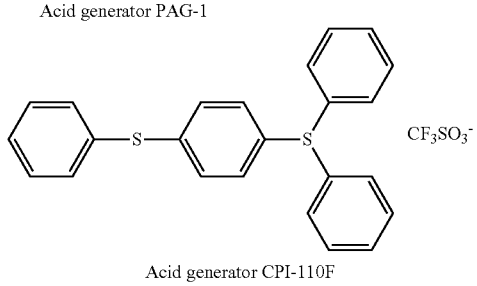

Acid generator CPI-110F

The following composition P2 for forming a light absorption anisotropic layer was continuously applied onto the obtained photo-alignment layer PA1 with a wire bar to form a coating film P2.

Next, the coating film P2 was heated at 140° C. for 30 seconds, and then the coating film P2 was cooled to room temperature (23° C.).

Next, the obtained coating film P2 was heated at 90° C. for 60 seconds and cooled again to room temperature.

Then, a light absorption anisotropic layer P2 was prepared on the photo-alignment layer PA1 by irradiating with a light emitting diode (LED) lamp (central wavelength: 365 nm) for 2 seconds under an irradiation condition of an illuminance of 200 mW/cm$^2$.

The film thickness of the light absorption anisotropic layer P2 was 1.0 μm.

| Composition P2 for forming light absorption anisotropic layer | |
|---|---|
| Dichroic coloring agent D-4 shown below | 0.25 parts by mass |
| Dichroic coloring agent D-5 shown below | 0.36 parts by mass |
| Dichroic coloring agent D-6 shown below | 0.59 parts by mass |
| Polymer liquid crystal compound P-1 shown below | 2.21 parts by mass |
| Low-molecular-weight liquid crystalline compound M-1 shown below | 1.36 parts by mass |
| Polymerization initiator (IRGACURE OXE-02, manufactured by BASF SE) | 0.150 parts by mass |
| Surfactant F-1 shown below | 0.026 parts by mass |
| Cyclopentanone | 46.00 parts by mass |
| Tetrahydrofuran | 46.00 parts by mass |
| Benzyl alcohol | 3.00 parts by mass |

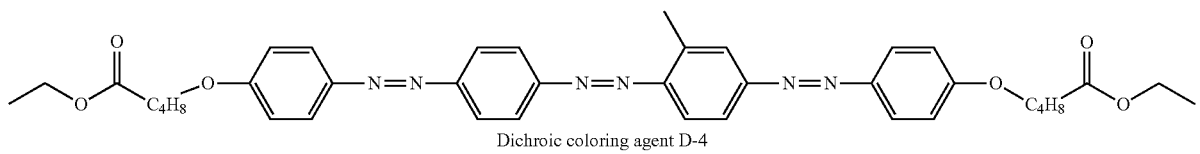

Dichroic coloring agent D-4

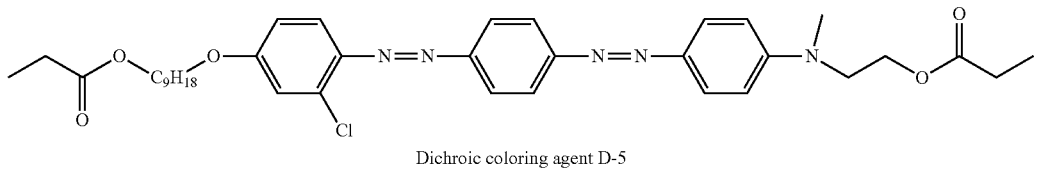

Dichroic coloring agent D-5

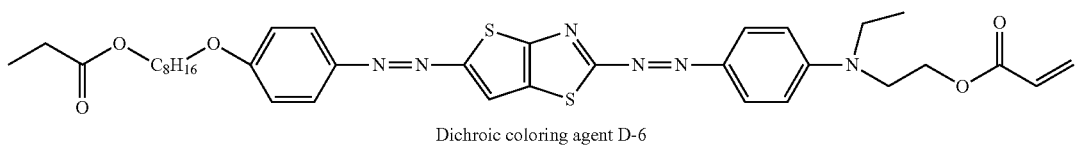

Dichroic coloring agent D-6

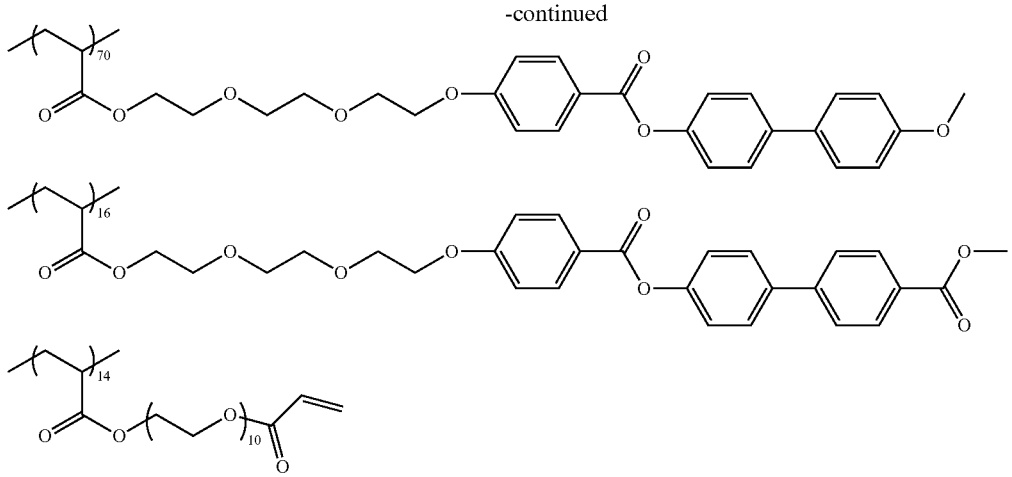

Polymer liquid crystal compound P-1

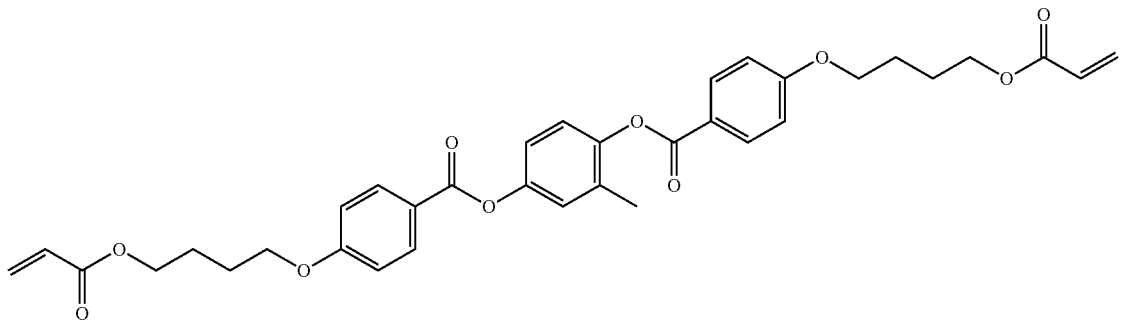

Low-molecular-weight liquid crystalline compound M-1

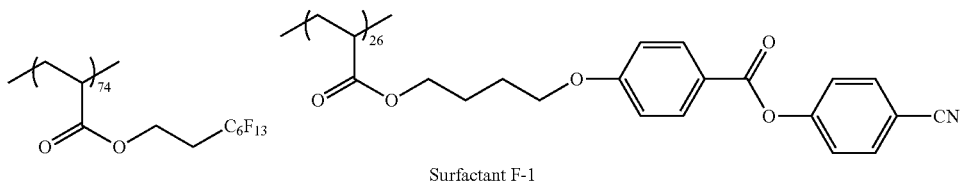

Surfactant F-1

The following composition K1 for forming a cured layer was continuously applied onto the obtained light absorption anisotropic layer P2 with a wire bar to form a coating film.

Next, the coating film was dried at room temperature, and then irradiated for 15 seconds under an irradiation condition of an illuminance of 28 mW/cm² using a high-pressure mercury lamp to prepare a cured layer K1 on the light absorption anisotropic layer P2.

The film thickness of the cured layer K1 was 0.05 μm.

| Composition K1 for forming cured layer | |
|---|---|
| Mixture L1 of rod-like liquid crystal compounds shown below | 2.61 parts by mass |
| Modified trimethylolpropane triacrylate shown below | 0.11 parts by mass |
| Photopolymerization initiator I-1 shown below | 0.05 parts by mass |
| Surfactant F-3 shown below | 0.21 parts by mass |
| Methyl isobutyl ketone | 297 parts by mass |

Mixture L1 of rod-like liquid crystal compounds (The numerical value in the following formulae represents % by mass, and R represents a group bonded through an oxygen atom.)

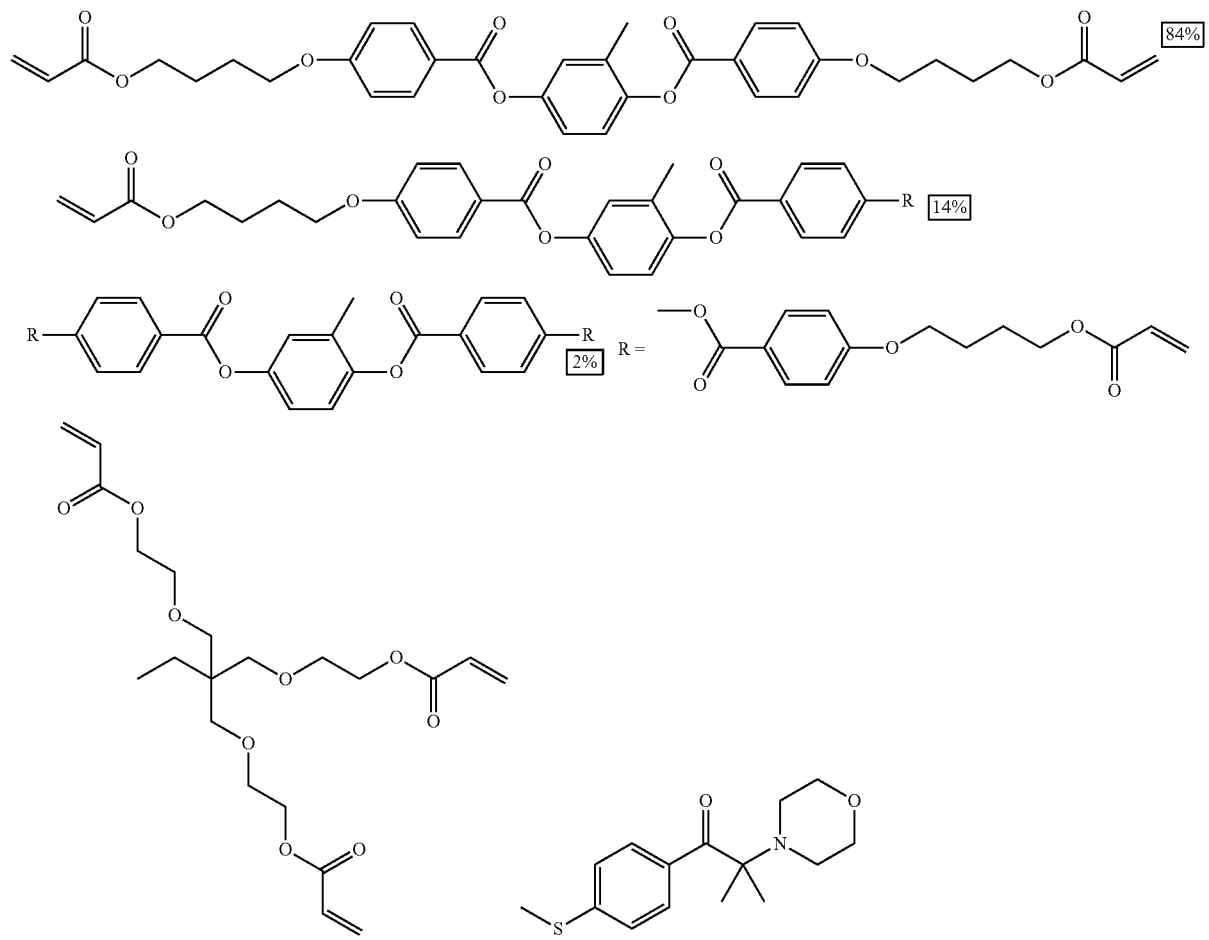
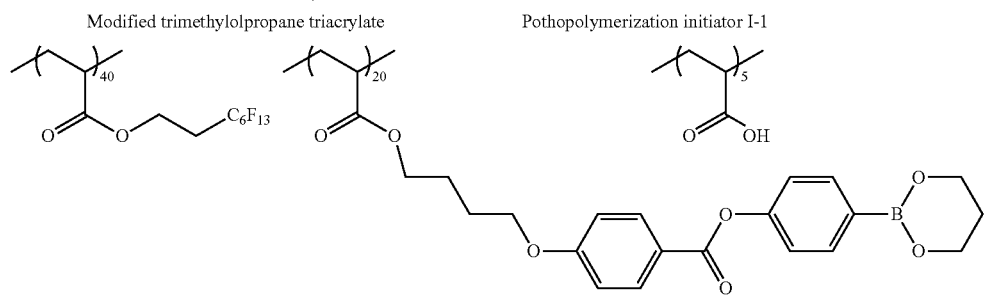
Modified trimethylolpropane triacrylate        Pothopolymerization initiator I-1
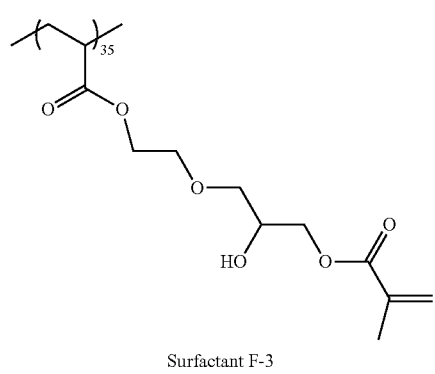
Surfactant F-3

The following composition B2 for forming an oxygen blocking layer was continuously applied onto the cured layer K1 with a wire bar. This was followed by drying with hot air at 100° C. for 2 minutes to form an oxygen blocking layer B2 having a thickness of 1.0 µm on the cured layer K1 to prepare a polarizing film 4B including the light absorption anisotropic layer P2.

The luminosity corrected single transmittance of the polarizing film 4B was 44%.

| Composition B2 for forming oxygen blocking layer | |
| --- | --- |
| Modified polyvinyl alcohol shown below | 3.80 parts by mass |
| Initiator IRGACURE 2959 | 0.20 parts by mass |
| Water | 70 parts by mass |
| Methanol | 30 parts by mass |

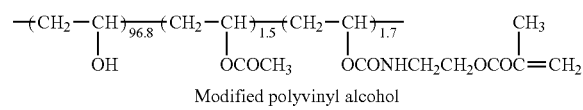

Modified polyvinyl alcohol

The oxygen blocking layer B2 side of the polarizing film 4B and the polarizing plate protective film were bonded to each other using a pressure-sensitive adhesive sheet. After that, only TJ40 of the polarizing film 4B was peeled off, and the peeled surface and the surface of the optically anisotropic layer (1a) of the elongated optical film (1c-1b-1a) were continuously bonded to each other using an ultraviolet curable adhesive. Subsequently, the cellulose acylate film of the optically anisotropic layer (1c) was peeled off to expose the surface of the optically anisotropic layer (1c) in contact with the cellulose acylate film. In this manner, a circularly polarizing plate (P4) was prepared.

Example 5

A circularly polarizing plate (P5) was prepared in the same manner as in Example 4, except that the film thickness of the light absorption anisotropic layer P2 in Example 4 was set to 0.8 The luminosity corrected single transmittance of the polarizer was 43%.

(Evaluation of durability)

The circularly polarizing plates of Examples 1 and 3 to 5 were evaluated for durability assuming a moist heat environment.

In the preparation of the circularly polarizing plate described above, a glass plate and an optically anisotropic layer cut into a 40 mm square were bonded to each other using a pressure sensitive adhesive. That is, the optical film (1c-1b-1a) was formed on a glass plate. At this time, the optically anisotropic layer (1a) was on the glass plate side. The optical film with a glass plate was exposed to ammonia for 24 hours by placing it on a screw cap bottle containing a 0.05 mol %/L ammonia aqueous solution. At this time, the optical film with a glass plate was placed so that the exposed surface was the optically anisotropic layer (1c).

A reflective substrate was prepared by bonding aluminum foil to a PET film having a thickness of 100 µm using a pressure-sensitive adhesive sheet, and the difference in effective reflectivity before and after a moist heat durability test was evaluated using a spectrophotometric colorimeter (manufactured by Konica Minolta, Inc.) according to the following standards.

AA: The reflectivity difference is 0.2% or less
A: The reflectivity difference is greater than 0.2% and 0.5% or less
B: The reflectivity difference is greater than 0.5% and 2.0% or less
C: The reflectivity difference is greater than 2.0%

TABLE 2

| | Laminate of optically anisotropic layers | Linearly polarizing plate | Evaluation of durability |
| --- | --- | --- | --- |
| Example 1 | A(1a) B(1b) C(1c) | 1 | B |
| Example 3 | A(1a) B(1b) C(1c) | 3 | A |
| Example 4 | A(1a) B(1b) C(1c) | 4 | AA |
| Example 5 | A(1a) B(1b) C(1c) | 5 | AA |
| Comparative Example 1 | A(ha) B(hb) | 1 | B |

In addition, it was confirmed that the circularly polarizing plates of Examples 3 to 5 exhibited initial performance equivalent to that of the circularly polarizing plate of Example 1, while reducing the change in display performance before and after the moist heat durability test, in a case where the circularly polarizing plate was used as an antireflection film of an organic EL display device.

Further, it was confirmed that the circularly polarizing plates of Examples 3 and 5 exhibited an increase in the transmittance in a case of white display state, and could achieve power saving of an organic EL element.

EXPLANATION OF REFERENCES 10, 20, 101, 102, 201, 202: optical film
30, 40: circularly polarizing plate
1a, 2a, 11a, 12a, 21a, 22a: optically anisotropic layer (A)
1b, 2b, 11b, 12b, 21b, 22b: optically anisotropic layer (B)
1c, 2c, 11c, 12c, 21c, 22c: optically anisotropic layer (C)
3: polarizer
111a, 112a, 111b, 112b, 121a, 122a, 121b, 122b, 211a, 212a, 211b, 212b, 221a, 222a, 221b, 222b: surface

What is claimed is:

1. An elongated optical film comprising, in the following order:
   an optically anisotropic layer (A);
   an optically anisotropic layer (B); and
   an optically anisotropic layer (C),
   wherein the optically anisotropic layer (A) is a layer formed by fixing a vertically aligned disk-like liquid crystal compound,
   the optically anisotropic layer (B) is a layer formed by fixing a twist-aligned rod-like liquid crystal compound with a thickness direction as a helical axis,
   the optically anisotropic layer (C) is a layer formed by fixing a vertically aligned rod-like liquid crystal compound,
   an in-plane slow axis of the optically anisotropic layer (A) is parallel to an in-plane slow axis on a surface of the optically anisotropic layer (B) on an optically anisotropic layer (A) side, upon being observed from an optically anisotropic layer (C) side toward the optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (A) side rotates counterclockwise with reference to the in-plane slow axis on the surface of the optically anisotropic layer (B) on the optically anisotropic layer (A) side, and upon being observed from the optically anisotropic layer (C) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (A) side rotates clockwise with reference to the in-plane slow axis on the surface of the optically anisotropic layer (B) on the optically anisotropic layer (A) side.

2. The optical film according to claim 1,
wherein an in-plane retardation of the optically anisotropic layer (A) at a wavelength of 550 nm is 140 to 220 nm,
a value of a product Δnd of a refractive index anisotropy Δn of the optically anisotropic layer (B) measured at a wavelength of 550 nm and a thickness d of the optically anisotropic layer (B) is 140 to 220 nm, and
an in-plane retardation of the optically anisotropic layer (C) at a wavelength of 550 nm is 0 to 10 nm, and a thickness direction retardation of the optically anisotropic layer (C) at a wavelength of 550 nm is −120 to −20 nm.

3. The optical film according to claim 1,
wherein an angle formed by the longitudinal direction of the elongated optical film and the in-plane slow axis of the optically anisotropic layer (A) is 40° to 85°,
a twisted angle of the twist-aligned liquid crystal compound in the optically anisotropic layer (B) is 90°±30°,
upon being observed from the optically anisotropic layer (C) side toward the optically anisotropic layer (A) side, in a case where the in-plane slow axis of the optically anisotropic layer (A) rotates clockwise by 40° to 85° with reference to the longitudinal direction of the elongated optical film, an in-plane slow axis on a surface of the optically anisotropic layer (B) opposite to the optically anisotropic layer (A) side rotates counterclockwise with reference to the in-plane slow axis on the surface of the optically anisotropic layer (B) on the optically anisotropic layer (A) side, and upon being observed from the optically anisotropic layer (C) side toward the optically anisotropic layer (A) side, in a case where the in-plane slow axis of the optically anisotropic layer (A) rotates counterclockwise by 40° to 85° with reference to the longitudinal direction of the elongated optical film, the in-plane slow axis on the surface of the optically anisotropic layer (B) opposite to the optically anisotropic layer (A) side rotates clockwise with reference to the in-plane slow axis on the surface of the optically anisotropic layer (B) on the optically anisotropic layer (A) side.

4. An elongated optical film comprising, in the following order:
an optically anisotropic layer (A);
an optically anisotropic layer (C); and
an optically anisotropic layer (B),
wherein the optically anisotropic layer (A) is a layer formed by fixing a horizontally aligned rod-like liquid crystal compound,
the optically anisotropic layer (C) is a layer formed by fixing a vertically aligned rod-like liquid crystal compound,
the optically anisotropic layer (B) is a layer formed by fixing a twist-aligned rod-like liquid crystal compound with a thickness direction as a helical axis,
an in-plane slow axis of the optically anisotropic layer (A) is parallel to an in-plane slow axis on a surface of the optically anisotropic layer (B) on an optically anisotropic layer (C) side,
upon being observed from an optically anisotropic layer (B) side toward an optically anisotropic layer (A) side, in a case where the in-plane slow axis of the optically anisotropic layer (A) rotates clockwise with reference to a longitudinal direction of the elongated optical film, an in-plane slow axis on a surface of the optically anisotropic layer (B) opposite to the optically anisotropic layer (C) side rotates clockwise with reference to the in-plane slow axis on the surface of the optically anisotropic layer (B) on the optically anisotropic layer (C) side, and upon being observed from the optically anisotropic layer (B) side toward the optically anisotropic layer (A) side, in a case where the in-plane slow axis of the optically anisotropic layer (A) rotates counterclockwise with reference to the longitudinal direction of the elongated optical film, the in-plane slow axis on the surface of the optically anisotropic layer (B) opposite to the optically anisotropic layer (C) side rotates counterclockwise with reference to the in-plane slow axis on the surface of the optically anisotropic layer (B) on the optically anisotropic layer (C) side.

5. The optical film according to claim 4,
wherein an in-plane retardation of the optically anisotropic layer (A) at a wavelength of 550 nm is 140 to 220 nm,
a value of a product Δnd of a refractive index anisotropy Δn of the optically anisotropic layer (B) measured at a wavelength of 550 nm and a thickness d of the optically anisotropic layer (B) is 140 to 220 nm, and
an in-plane retardation of the optically anisotropic layer (C) at a wavelength of 550 nm is 0 to 10 nm, and a thickness direction retardation of the optically anisotropic layer (C) at a wavelength of 550 nm is −150 to −50 nm.

6. The optical film according to claim 4,
wherein an angle formed by the longitudinal direction of the elongated optical film and the in-plane slow axis of the optically anisotropic layer (A) is 5° to 50°,
a twisted angle of the twist-aligned liquid crystal compound in the optically anisotropic layer (B) is 90°±30°,
upon being observed from the optically anisotropic layer (B) side toward the optically anisotropic layer (A) side, in a case where the in-plane slow axis of the optically anisotropic layer (A) rotates clockwise by 5° to 50° with reference to the longitudinal direction of the elongated optical film, the in-plane slow axis on the surface of the optically anisotropic layer (B) opposite to the optically anisotropic layer (C) side rotates clockwise with reference to the in-plane slow axis on the surface of the optically anisotropic layer (B) on the optically anisotropic layer (C) side, and upon being observed from the optically anisotropic layer (B) side toward the optically anisotropic layer (A) side, in a case where the in-plane slow axis of the optically anisotropic layer (A) rotates counterclockwise by 5° to 50° with reference to the longitudinal direction of the elongated optical film, the in-plane slow axis on the surface of the optically anisotropic layer (B) opposite to the optically anisotropic layer (C) side rotates counterclockwise with reference to the in-plane slow axis on the surface of the optically anisotropic layer (B) on the optically anisotropic layer (C) side.

7. A circularly polarizing plate comprising:
the optical film according to claim 1; and
a polarizer,
wherein the polarizer is disposed adjacent to the optically anisotropic layer (A) included in the optical film.

8. The circularly polarizing plate according to claim 7,
wherein the polarizer is a polarizer having a luminosity corrected single transmittance of 44% or more.

9. The circularly polarizing plate according to claim 7,
wherein the polarizer is a polarizer formed of a composition containing a polymerizable liquid crystal compound.

10. An organic electroluminescent display device comprising:
the optical film according to claim 1.

11. An organic electroluminescent display device comprising:
the circularly polarizing plate according to claim 7.

* * * * *

UNITED STATES PATENT AND TRADEMARK OFFICE
CERTIFICATE OF CORRECTION

PATENT NO. : 11,947,142 B2
APPLICATION NO. : 18/169689
DATED : April 2, 2024
INVENTOR(S) : Yuta Takahashi et al.

It is certified that error appears in the above-identified patent and that said Letters Patent is hereby corrected as shown below:

On the Title Page

On Item (54), the Title and in the Specification, Column 1, Lines 1-4, should read as:
OPTICAL FILM, CIRCULARLY POLARIZING PLATE, AND ORGANIC
ELECTROLUMINESCENT DISPLAY DEVICE Signed and Sealed this
Fourteenth Day of May, 2024

Katherine Kelly Vidal
*Director of the United States Patent and Trademark Office*